United States Patent
Hasbun et al.

(10) Patent No.: US 11,381,432 B2
(45) Date of Patent: **\*Jul. 5, 2022**

(54) MULTIPLEXING DISTINCT SIGNALS ON A SINGLE PIN OF A MEMORY DEVICE

(71) Applicant: Micron Technology, Inc., Boise, ID (US)

(72) Inventors: Robert Nasry Hasbun, San Jose, CA (US); Timothy M. Hollis, Meridian, ID (US); Jeffrey P. Wright, Boise, ID (US); Dean D. Gans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/123,990

(22) Filed: Dec. 16, 2020

(65) Prior Publication Data

US 2021/0105161 A1  Apr. 8, 2021

Related U.S. Application Data

(63) Continuation of application No. 16/419,870, filed on May 22, 2019, now Pat. No. 10,904,052, which is a continuation of application No. 15/977,813, filed on May 11, 2018, now Pat. No. 10,355,893.

(Continued)

(51) Int. Cl.
  *H04L 27/04* (2006.01)
  *G06F 13/38* (2006.01)
  (Continued)

(52) U.S. Cl.
  CPC .............. *H04L 27/04* (2013.01); *G06F 13/16* (2013.01); *G06F 13/38* (2013.01); *G11C 5/066* (2013.01);
  (Continued)

(58) Field of Classification Search
  CPC ......... H04L 27/02; H04L 27/04; H04L 27/06; H04L 25/49; G06F 13/38
  See application file for complete search history.

(56) References Cited

U.S. PATENT DOCUMENTS 5,115,450 A   5/1992   Arcuri
5,550,881 A   8/1996   Sridhar et al.
(Continued)

FOREIGN PATENT DOCUMENTS

CN   101055552 A   10/2007
CN   103384158 A   11/2013
(Continued)

OTHER PUBLICATIONS

ISA/KR, International Search Report and Written Opinion of the International Searching Authority, Int'l Appl. No. PCT/US2018/050445, dated Dec. 24, 2018, Korean Intellectual Property Office, Seo-gu, Daejon, Republic of Korea, 16pgs.

(Continued)

*Primary Examiner* — Vanthu T Nguyen
(74) *Attorney, Agent, or Firm* — Holland & Hart LLP

(57) ABSTRACT

Methods, systems, and devices for multiplexing distinct signals on a single pin of a memory device are described. Techniques are described herein to multiplex data using a modulation scheme having at least three levels. The modulated data may be communicated to multiple memory dies over a shared bus. Each of the dies may include a same or different type of memory cell and, in some examples, a multi-level signaling scheme may be pulse amplitude modulation (PAM). Each unique symbol of the modulated signal may be configured to represent a plurality of bits of data.

20 Claims, 26 Drawing Sheets

Related U.S. Application Data

(60) Provisional application No. 62/567,016, filed on Oct. 2, 2017.

(51) Int. Cl.
| | | |
|---|---|---|
| *H04L 27/06* | (2006.01) | |
| *H04L 27/02* | (2006.01) | |
| *H04L 25/49* | (2006.01) | |
| *G06F 13/16* | (2006.01) | |
| *G11C 5/06* | (2006.01) | |
| *G11C 7/10* | (2006.01) | |

(52) U.S. Cl.
CPC ............ *G11C 7/10* (2013.01); *H04L 25/49* (2013.01); *H04L 27/02* (2013.01); *H04L 27/06* (2013.01); *G11C 7/1051* (2013.01); *G11C 7/1078* (2013.01); *G11C 2207/101* (2013.01)

(56) References Cited

U.S. PATENT DOCUMENTS

| | | | |
|---|---|---|---|
| 6,067,267 | A | 5/2000 | Lo |
| 6,075,723 | A | 6/2000 | Naiki et al. |
| 6,292,873 | B1 | 9/2001 | Keaveny et al. |
| 6,396,329 | B1 | 5/2002 | Zerbe |
| 6,772,351 | B1 | 8/2004 | Werner et al. |
| 6,862,224 | B2 | 3/2005 | Stubbs |
| 6,934,824 | B2 | 8/2005 | Woo et al. |
| 7,124,221 | B1 * | 10/2006 | Zerbe ............... H04L 25/03006 710/106 |
| 7,269,212 | B1 | 9/2007 | Chau et al. |
| 7,308,058 | B2 | 12/2007 | Zerbe et al. |
| 7,394,715 | B1 | 7/2008 | Tseng |
| 8,054,689 | B2 | 11/2011 | Heo et al. |
| 8,275,027 | B2 | 9/2012 | Abbasfar et al. |
| 8,363,707 | B2 | 1/2013 | Hollis |
| 8,397,013 | B1 | 3/2013 | Rosenband et al. |
| 8,441,870 | B2 | 5/2013 | Kim |
| 8,447,908 | B2 | 5/2013 | Bruce et al. |
| 8,451,147 | B2 | 5/2013 | Mazumdar et al. |
| 8,582,373 | B2 | 11/2013 | Hollis |
| 8,612,713 | B2 | 12/2013 | Kim et al. |
| 9,071,481 | B2 | 6/2015 | Kaviani et al. |
| 9,172,567 | B2 | 10/2015 | Hollis |
| 9,182,914 | B1 | 11/2015 | Smith |
| 9,270,506 | B2 | 2/2016 | Hollis |
| 9,535,831 | B2 | 1/2017 | Jayasena et al. |
| 9,568,941 | B2 | 2/2017 | Jung |
| 9,712,373 | B1 | 7/2017 | Haywood |
| 9,942,028 | B1 | 4/2018 | Dickson et al. |
| 10,185,499 | B1 | 1/2019 | Wang et al. |
| 10,281,067 | B2 | 5/2019 | Pearl et al. |
| 10,381,067 | B2 | 8/2019 | Shaeffer et al. |
| 2003/0070126 | A1 | 4/2003 | Werner et al. |
| 2004/0186956 | A1 | 9/2004 | Perego et al. |
| 2005/0007805 | A1 | 1/2005 | Ware et al. |
| 2005/0089126 | A1 | 4/2005 | Zerbe et al. |
| 2006/0008014 | A1 | 1/2006 | Tamaki et al. |
| 2006/0095622 | A1 | 5/2006 | Rosner et al. |
| 2006/0129728 | A1 | 6/2006 | Hampel |
| 2006/0140287 | A1 | 6/2006 | Alon et al. |
| 2006/0170453 | A1 | 8/2006 | Zerbe et al. |
| 2006/0203765 | A1 | 9/2006 | Laroia et al. |
| 2007/0002772 | A1 | 1/2007 | Berkman et al. |
| 2007/0070669 | A1 | 3/2007 | Tsern |
| 2007/0153588 | A1 | 7/2007 | Janzen |
| 2007/0290333 | A1 | 12/2007 | Saini et al. |
| 2008/0019523 | A1 | 1/2008 | Fuse et al. |
| 2008/0054493 | A1 | 3/2008 | Leddige et al. |
| 2008/0080255 | A1 | 4/2008 | Kagan et al. |
| 2008/0094086 | A1 | 4/2008 | Kim |
| 2008/0137414 | A1 | 6/2008 | Park et al. |
| 2008/0310491 | A1 | 12/2008 | Abbasfar et al. |
| 2010/0115191 | A1 | 5/2010 | Hampel et al. |
| 2010/0127758 | A1 | 5/2010 | Hollis |
| 2010/0200998 | A1 | 8/2010 | Furuta et al. |
| 2011/0032758 | A1 | 2/2011 | Son et al. |
| 2011/0161568 | A1 | 6/2011 | Bruce et al. |
| 2011/0208906 | A1 | 8/2011 | Gillingham |
| 2011/0228614 | A1 | 9/2011 | Shaeffer et al. |
| 2011/0302475 | A1 | 12/2011 | Eisenhuth et al. |
| 2012/0023363 | A1 | 1/2012 | Shaeffer et al. |
| 2012/0051152 | A1 | 3/2012 | Hollis |
| 2012/0134439 | A1 | 5/2012 | Sato et al. |
| 2012/0254472 | A1 | 10/2012 | Ware et al. |
| 2013/0036259 | A1 * | 2/2013 | Huang ............... G06F 11/1048 711/103 |
| 2013/0285739 | A1 | 10/2013 | Blaquiere et al. |
| 2014/0016404 | A1 | 1/2014 | Kim et al. |
| 2014/0192583 | A1 | 7/2014 | Rajan et al. |
| 2014/0201600 | A1 | 7/2014 | Ramamoorthy et al. |
| 2014/0330994 | A1 | 11/2014 | Mishra et al. |
| 2015/0143037 | A1 | 5/2015 | Smith |
| 2015/0146766 | A1 | 5/2015 | Longo et al. |
| 2015/0187441 | A1 | 7/2015 | Hollis |
| 2015/0199126 | A1 | 7/2015 | Jayasena et al. |
| 2015/0317277 | A1 | 11/2015 | Wang et al. |
| 2015/0348491 | A1 | 12/2015 | Kim et al. |
| 2015/0370655 | A1 * | 12/2015 | Tucek ................ G06F 3/0673 714/15 |
| 2016/0006596 | A1 | 1/2016 | Dickson et al. |
| 2016/0019171 | A1 | 1/2016 | Shaeffer |
| 2016/0134036 | A1 | 5/2016 | Huang et al. |
| 2016/0320999 | A1 | 11/2016 | Takemae |
| 2017/0147246 | A1 | 5/2017 | Byun |
| 2017/0212695 | A1 | 7/2017 | Hollis et al. |
| 2017/0242190 | A1 | 8/2017 | Quinlan |
| 2018/0007226 | A1 | 1/2018 | Holland |
| 2019/0087121 | A1 | 3/2019 | Kobayashi et al. |

FOREIGN PATENT DOCUMENTS

| | | |
|---|---|---|
| EP | 2061198 A1 | 5/2009 |
| EP | 2393086 A2 | 12/2011 |
| JP | 2010524089 A | 7/2010 |
| JP | 2011221134 A | 11/2011 |
| JP | 2014035788 A | 2/2014 |
| JP | 2014182864 A | 9/2014 |
| JP | 2016122832 A | 7/2016 |
| KR | 20140008745 A | 1/2014 |
| KR | 20150106076 A | 9/2015 |
| KR | 1020150132101 A | 11/2015 |
| WO | 0150228 A2 | 7/2001 |
| WO | 2008143937 A2 | 11/2008 |
| WO | 2010/053967 A1 | 5/2010 |

OTHER PUBLICATIONS

ISA/KR, International Search Report and Written Opinion of the International Searching Authority, Int'l. Appl. No. PCT/US2018/050434, dated Jan. 3, 2019, Korean Intellectual Property Office, Daejeon, Republic of Korea, 12 pgs.

ISA/KR, International Search Report and Written Opinion of the International Searching Authority, Int'l. Appl. No. PCT/US2018/052705, dated Jan. 10, 2019, Korean Intellectual Property Office, Seo-gu, Daejeon, Republic of Korea, 13 pgs.

ISA/KR, International Search Report and Written Opinion of the International Searching Authority, Int'l. Appl. No. PCT/US2018/052000, dated Jan. 16, 2019, Korean Intellectual Property Office, Seo-gu, Daejeon, Republic of Korea, 23 pgs.

ISA/KR, International Search Report and Written Opinion of the International Searching Authority, Int'l. Appl. No. PCT/US2018/052006, dated Jan. 16, 2019, Korean Intellectual Property Office, Seo-gu, Daejeon, Republic of Korea, 13 pgs.

China National Intellectual Property Administration, "First Office Action," issued in connection with Patent Application No. 201811142167.6, dated Feb. 21, 2020 (5 pages).

The Korean Intellectual Property Office, "Notice of Reasons for Rejection," issued in connection with Korean Patent Application No. 10-2020-7009510, dated Jun. 15, 2020 (27 pages with translation).

(56) References Cited

OTHER PUBLICATIONS

The Korean Intellectual Property Office, "Notice of Allowance" issued in connection with Korean Patent Application No. 10-2020-7009510, dated Sep. 16, 2020 (5 pages with translation).
China National Intellectual Property Administration, "Second Office Action," issued in connection with Chinese Patent Application No. 201811142167.6, dated Aug. 6, 2020 (10 pages).
Korean Intellectual Property Office, "Notice of Reason of Rejection," issued in connection with Korean Patent Application No. 10-2020-7009607, dated Jan. 19, 2021 (11 pages).
Korean Intellectual Property Office, "Notice of Reasons for Rejection," issued in connection with Korean Patent Application No. 10-2020-7008924, dated Jan. 13, 2021 (7 pages).
KIPO, "Notice of Reasons for Rejection," issued in connection with Korean Patent Application No. 10-2020-7010072, dated Jan. 26, 2021 (9 pages).
EPO, Supplementary European Search Report, EP Appl. No. EP18864324.1, dated Mar. 29, 2021, European Patent Office, 80298 Munich, Germany, 7 pgs.
European Patent Office, "Extended Search Report," issued in connection with European Application No. 18865047.7, dated May 28, 2021 (10 pages).
Lee, Sungjin, et al., "Using Dynamic Voltage Scaling for Energy-Efficient Flash-based Storage Devices," SOC Design Conference (ISOCC), 2010 International IEEE, Piscataway, NJ, USA, dated Nov. 22, 2010 (4 pages).
European Patent Office, "Extended Search Report," issued in connection with European Patent Application No. 18864031.2, dated Jun. 15, 2021 (8 pages).
European Patent Office, "Extended Search Report," issued in connection with European Patent Application No. 18864503.0, dated Jun. 10, 2021 (9 pages).
Korean Intellectual Property Office, "Notice of Reasons for Rejection," issued in connection with Korean Patent Application No. 10-2020-7008784, dated Jul. 16, 2021 (17 pages).
China National Intellectual Property Administration, "First Office Action," issued in connection with Chinese Patent Application No. 201811124389.5, dated Aug. 31, 2021 (13 pages).
European Patent Office, "Extended Search Report," issued in connection with European Patent Application No. 18864321.7, dated Oct. 28, 2021 (8 pages).
Korean Patent Office, "Notice of Allowance", issued in connection with Korean Patent Application No. 10-2021-7034166 dated Apr. 19, 2022 (4 pages).

\* cited by examiner

MULTIPLEXING DISTINCT SIGNALS ON A SINGLE PIN OF A MEMORY DEVICE

CROSS REFERENCES

The present Application for Patent is a continuation of U.S. patent application Ser. No. 16/419,870 by Hasbun et al., entitled "Multiplexing Distinct Signals on a Single Pin of A Memory," filed May 22, 2019, which is a continuation of U.S. patent application Ser. No. 15/977,813 by Hasbun et al., entitled "Multiplexing Distinct Signals on a Single Pin of A Memory," filed May 11, 2018, which claims the benefit of and claims priority to U.S. Provisional Patent Application No. 62/567,016 by Hasbun et al., entitled "Multiplexing Distinct Signals on a Single Pin," filed Oct. 2, 2017, each of which is assigned to the assignee hereof, and each of which is expressly incorporated herein by reference.

BACKGROUND

The following relates generally to using signaling in a memory device. Memory devices are widely used to store information related to various electronic devices such as computers, wireless communication devices, cameras, digital displays, and the like. Information is stored by programming different states of a memory cell.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Some memory devices may transfer data across a number of channels in a memory device using a signal modulated using a first modulation scheme having multiple levels (e.g., at least three levels). Such signaling may be configured to increase a data transfer rate without increasing the frequency of data transfer and/or a transmit power of the communicated data. An example of such a signaling scheme may be pulse amplitude modulation (PAM), where a unique symbol of the signal may be configured to represent a plurality of bits of data.

In such signaling schemes, different symbols may represent different data, different types of data, or both. For example, control data, storage data, metadata, or a combination thereof, may be transmitted in a single signal containing multiple symbols. As a result, read and write speeds of a memory array may be improved.

In some examples, multiplexing first data and second data in a signal modulated using a modulation scheme having at least three levels may result in improved read and write speeds of a memory array. To multiplex the signal, first data and second data—which may represent one or more types of data—may be multiplexed into a single signal. This signal may be transmitted to a first memory die and a second memory die coupled with a bus. The signal may be transmitted to the memory dies, for example, in response to a read command or a write command (e.g., based on one or more requests). This transmission (e.g., transmitting a single signal) may result in improved read and write speeds to the memory dies, as well as improved performance and reliability of operations.

Features of the disclosure introduced above are further described below in the context of an exemplary memory device and other various components. Specific examples are described for memory devices that support multi-symbol signaling. These and other features of the disclosure are further illustrated by and described with reference to apparatus diagrams, system diagrams, and flowcharts that relate to multi-symbol signaling.

Figure 1:
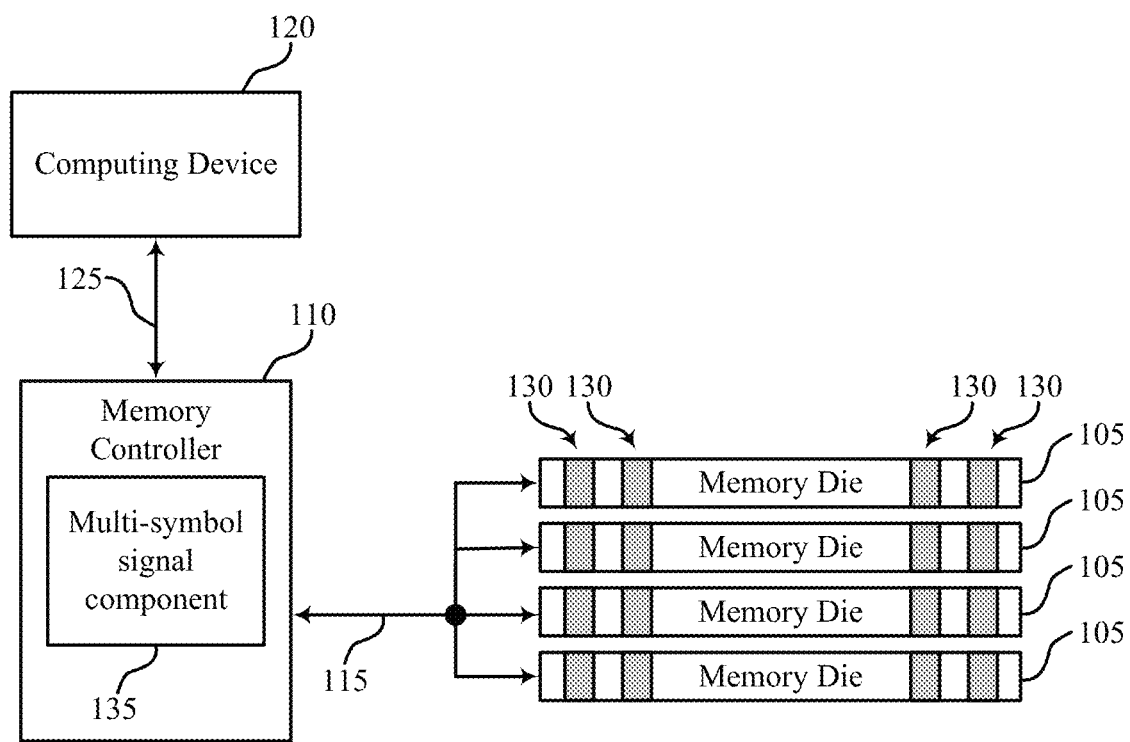
FIG. 1 illustrates an example of a memory device that supports multiplexing distinct signals on a single pin in accordance with examples of the present disclosure.

FIG. 1 illustrates an example system 100 in accordance with various examples of the present disclosure. The system 100 may also be referred to as an electronic memory apparatus. The system 100 may be configured to multiplex first and second data in a signal modulated using a modulation scheme having at least three levels. The system 100 may include a plurality of memory dies 105 and a memory controller 110. The memory dies 105 may be coupled with the memory controller 110 using one or more internal signal paths 115. Each internal signal path 115 may be configured to communicate internal signals (e.g., binary-symbol signals, multi-symbol signals) that represent data between the memory controller 110 and one or more of the memory dies 105. In some examples, the internal signal paths 115 may be used to send and receive the internal signals inside of a semiconductor package among various components therein.

In some cases, the system 100 includes a computing device 120 such as a processor (e.g., a central processing unit (CPU), a graphics processing unit (GPU)) or a system on a chip (SoC). The system 100, including the computing device 120, may be a subsystem of a larger system (e.g., a laptop, server, personal computing device, smartphone, personal computer). In either case, the computing device 120 may exchange information with the memory controller 110 using a signal communicated over a first signal path 125.

The memory dies 105 may include a plurality of memory cells (as shown in and described with reference to FIG. 2) that may be programmable to store different logic states. For example, each memory cell may be programmed to store one or more logic states (e.g., a logic '0', a logic '1', a logic '00', a logic '01', a logic '10', a logic '11'). The memory cells of the memory dies 105 may use any number of storage technologies to store data including DRAM, FeRAM, PCM, 3DXP memory, NAND memory, NOR memory, or a combination thereof. In some cases, a first memory die 105 of the system 100 may use a first memory technology (e.g., NAND flash memory) and a second memory die 105 of the system 100 may use second memory technology (e.g., FeRAM) different from the first memory technology.

In some cases, the memory dies 105 may be an example of two-dimensional (2D) array of memory cells. Or a memory die 105 may be an example of a three-dimensional (3D) array, where multiple 2D arrays of multiple memory cells are formed on top of one another. Such a configuration may increase the number of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 105 may be stacked directly on one another. In other cases, one or more of the memory dies 105 may be positioned away from a stack of memory dies (e.g., in different memory stacks).

The memory dies 105 may include one or more vias 130 (e.g., through-silicon vias (TSVs)). In some cases, the one or more vias 130 may be part of the internal signal paths 115 and perform similar functions. The vias 130 may be used to communicate between memory dies 105, for example, when the memory dies 105 are stacked on one another. Some vias 130 may be used to facilitate communication between the memory controller 110 and at least some of the memory dies 105. In some cases, a single via 130 may be coupled with multiple memory dies 105. In some cases, each memory die 105 may include a via 130.

The memory controller 110 may control the operation (e.g., read, write, re-write, refresh, discharge) of memory cells in the memory dies 105 through one or more various components (e.g., row decoders, column decoders, sense components). In some cases, the row decoder, the column decoder, or the sense component, or some combination may be co-located with the memory controller 110. Memory controller 110 may generate row and column address signals to activate the desired word line and digit line. In other examples, the memory controller 110 may control various voltages, or currents, or both used during the operation of system 100. For example, the memory controller 110 may apply discharge voltages to a word line or a digit line after accessing one or more memory cells. In general, the amplitude, shape, or duration of an applied voltage or current discussed herein may be adjusted or varied and may be different for the various operations discussed in relation to operating the system 100. Furthermore, one, multiple, or all memory cells within a memory die 105 may be accessed concurrently. For example, multiple memory cells or all memory cells of the memory die 105 may be accessed simultaneously during a reset operation in which multiple memory cells or all memory cells may be set to a single logic state (e.g., logic '0').

In some cases, the memory controller 110 may be integrated as part of the computing device 120. For example, a processor of the computing device 120 may execute one or more processes, operations, or procedures configured to control various aspects of the system 100 or initiate various operations or actions. In some cases, the memory controller 110 may be integrated as part of a buffer in a stack of memory dies 105. For example, the memory controller 110 may be an example of a semiconductor die that may execute one or more processes, operations, or procedures configured to control various aspects of the system 100 or initiate various operation or actions.

The memory controller 110 may include a multi-symbol signal component 135 configured to communicate multi-symbol signals (i.e., signals modulated using a M-ary modulation scheme where M is greater than or equal to 3) within the system 100 (e.g., internal signals communicated across the internal signal paths 115) and/or multi-symbol signals with other components (e.g., external signals communicated across the first signal path 125). In some examples, the multi-symbol signal component 135 may modulate first data and second data using a modulation scheme having at least three levels. The memory controller 110 may, for example, be coupled with a single bus and may transmit the first data and the second data to one or more memory dies 105. For example, the memory controller 110 may transmit the modulated signal to each of the memory dies 105 through the bus.

In some cases, the memory controller 110 may be configured to communicate binary-symbol signals concurrently with multi-symbol signals. The features and functions related to communicating multi-symbol signals and binary-symbol signals may be implemented in devices and contexts other than memory storage. For example, the features of functions described herein may be implemented in personal computing devices, laptops, servers, portable communication devices, or a combination thereof.

Figure 2:
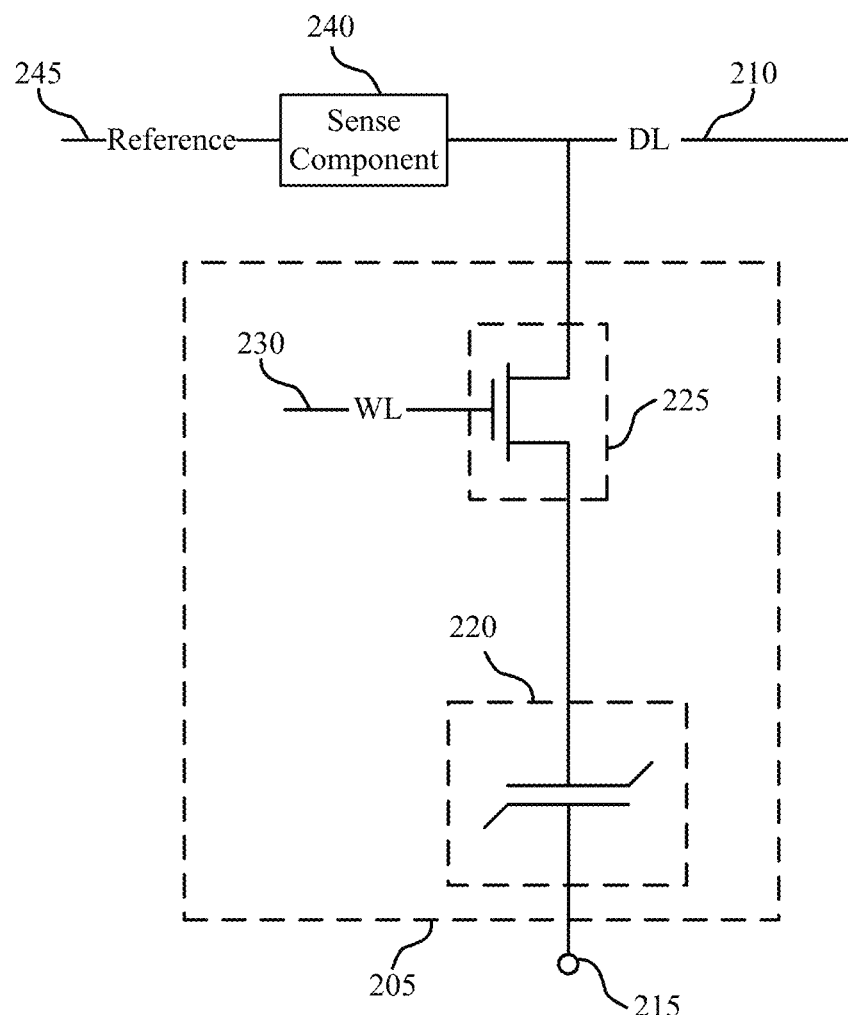
FIG. 2 illustrates an example of a circuit that supports multiplexing distinct signals on a single pin in accordance with examples of the present disclosure.

FIG. 2 illustrates an example of a circuit 200 in accordance with various examples of the present disclosure. The circuit 200 may illustrate an example of a memory cell 205 that may be part of one or more memory dies 105. The circuit 200 may include a memory cell 205 coupled with a digit line 210 and a voltage source 215.

The memory cell 205 may implement any type of memory technology (e.g., DRAM, FeRAM, PCM, NAND, NOR). As such, some aspects of the circuit 200 may be based on the memory technology being implemented by the memory cell 205. For example, if the memory cell 205 is a FeRAM memory cell, the voltage source 215 may be an example of a plate or a plate line coupled with a plate driver. If the memory cell 205 is a DRAM memory cell, the voltage source 215 may be an example of a ground or a virtual ground. A person of ordinary skill would understand and appreciate the differences in memory cells 205 between the different memory technologies.

The memory cell 205 may include a capacitor 220 and a selection component 225. In some cases, the capacitor 220 may be or include a resistor type device, as in the case of a PCM memory cell. A memory cell 205 may store a charge representative of the programmable states in the capacitor 220; for example, a charged and uncharged capacitor may represent two logic states, respectively. A DRAM memory cell may include a capacitor with a dielectric material as the insulating material. For example, the dielectric material may have linear or para-electric polarization properties and a ferroelectric memory cell may include a capacitor with a ferroelectric material as the insulating material. In instances where the storage medium includes FeRAM, different levels of charge of a ferroelectric capacitor may represent different logic states.

The memory cell 205 of the memory die 105 may be accessed (e.g., during a read operation, write operation, or other operation) using various combinations of word lines 230, digit lines 210, in some types of memory technologies, plate lines, or a combination thereof. In some cases, some memory cells 205 may share access lines (e.g., digit lines, word lines, plate lines) with other memory cells. For example, a digit line 210 may be shared with memory cells 205 in a same column and a word line 230 may be shared with memory cells in a same row. In some cases, a plate line may be shared with memory cells in a same section, tile, deck, or multiple decks. As described above, various states may be stored by charging or discharging the capacitor 220 of the memory cell 205.

The stored state of the capacitor 220 of the memory cell 205 may be read or sensed by operating various components. The capacitor 220 may be in electronic communication with a digit line 210. The capacitor 220 may be isolated from digit line 210 when selection component 225 is deactivated, and the capacitor 220 can be coupled with the digit line 210 when selection component 225 is activated (e.g., by the word line 230). Activating selection component 225 may, in some examples, be referred to as selecting a memory cell 205. In some cases, the selection component 225 may be a transistor and its operation may be controlled by applying a voltage to the transistor gate, where the voltage magnitude is greater than the threshold magnitude of the transistor. The word line 230 may activate the selection component 225 based on instructions received from the memory controller 110. For example, a memory controller 110 may control the biasing of the word line 230 to selectively activate/deactivate the selection component 225, and thereby connect a capacitor 220 of a memory cell 205 with a digit line 210.

The change in voltage of a digit line 210 may, in some examples, depend on the digit line's intrinsic capacitance. That is, as charge flows through the digit line 210, some finite amount of charge may be stored in the digit line 210 and the resulting voltage depends on the intrinsic capacitance. The intrinsic capacitance may depend on physical characteristics, including the dimensions, of the digit line. The digit line 210 may connect many memory cells of the memory die 105 so the digit line 210 may have a length that results in a non-negligible capacitance (e.g., on the order of picofarads (pF)). The resulting voltage of the digit line 210 may then be compared to a reference voltage by a sense component 240 in order to determine the stored logic state in the memory cell. Other sensing processes may be used. The sense component 240 may be coupled with the digit line 210.

The sense component 240 may include various transistors or amplifiers to detect and amplify a difference in signals, which may be referred to as latching. The sense component 240 may include a sense amplifier that receives and compares the voltage of the digit line 210 and a reference line 245, which may be a reference voltage. The sense amplifier output may be driven to the higher (e.g., a positive) or lower (e.g., negative or ground) supply voltage based on the comparison. For instance, if the digit line has a higher voltage than reference line, then the sense amplifier output may be driven to a positive supply voltage.

In some cases, the sense amplifier may drive the digit line to the supply voltage. The sense component 240 may then latch the output of the sense amplifier and/or the voltage of the digit line 210, which may be used to determine the stored state in the memory cell (e.g., logic '1'). Alternatively, for example, if the digit line 210 has a lower voltage than reference line 245, the sense amplifier output may be driven to a negative or ground voltage. The sense component 240 may similarly latch the sense amplifier output to determine the stored state in the memory cell 205 (e.g., logic '0'). The latched logic state of the memory cell 205 may then be output to the memory controller 110, for example, using one or more internal signal paths 115 or vias 130.

To write a memory cell, a voltage may be applied across the capacitor 220 of the memory cell 205. Various methods may be used to write a memory cell 205. In one example, the selection component 225 may be activated through a word line 230 in order to electrically connect the capacitor 220 to the digit line 210. A voltage may be applied across the capacitor 220 by controlling the voltage of a first cell plate (e.g., through voltage source 215) and a second cell plate (e.g., through a digit line 210). To write a logic '0', the cell plate may be taken high (e.g., a voltage level may be increased above a predetermined voltage that is a "high" voltage). That is, a positive voltage may be applied to plate line, and the cell bottom may be taken low (e.g., virtually grounding or applying a negative voltage to the digit line). The opposite process may be performed to write a logic '1', where the cell plate is taken low and the cell bottom is taken high.

As discussed with reference to FIG. 1, a memory controller (e.g., memory controller 110) may transmit a modulated signal to each of the memory dies (e.g., memory dies 105) through a bus. In some examples, the modulated signal may be transmitted to the memory dies in response to a first and/or second data request corresponding to a first memory die and a second memory die, respectively. Each of the first and/or second data requests may, in some examples, relate to a read command or a write command. Thus, in response to first and/or second data request, the memory controller may transmit the modulated signal to one or more (or each) memory die associated with the read or write command.

Figure 3:
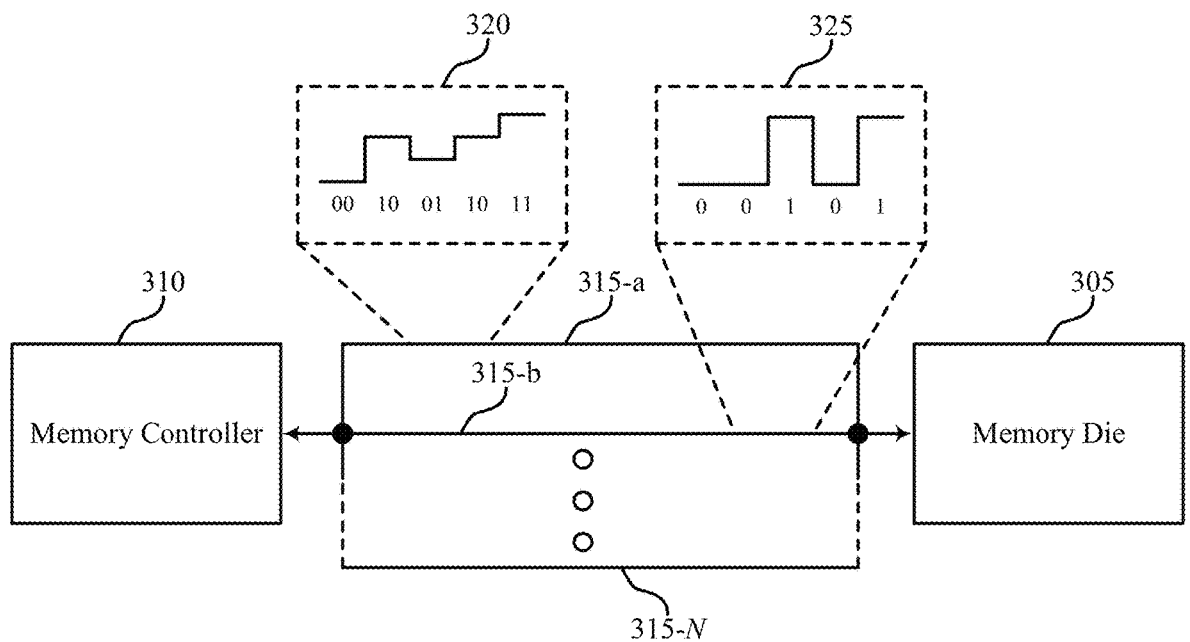
FIG. 3 illustrates an example of a circuit that supports multiplexing distinct signals on a single pin in accordance with examples of the present disclosure.

FIG. 3 illustrates an example of a circuit 300 in accordance with various examples of the present disclosure. The circuit 300 may include one or more internal signal paths 315-a through 315-N that couple at least one memory die 305 with a memory controller 310. The internal signal paths 315 may be configured to communicate multi-symbol signals 320, or binary-symbol signals 325, or both. In some cases, a first internal signal path 315-a may be dedicated to communicating a first signal type (e.g., a multi-symbol signal 320). In some cases, a second internal signal path 315-b may be dedicated to communicating a second, different signal type (e.g., a binary-symbol signal 325). In some cases, the internal signal paths 315 may include or be routed through one or more vias, or TSVs. The memory die 305 may be an example of the memory dies 105 described with reference to FIG. 1. The memory controller 310 may be an example of the memory controller 110 described with reference to FIG. 1. The signal paths 315 may be examples of the signals paths 115 described with reference to FIG. 1.

A memory device may use multi-symbol signaling to increase an amount of information transmitted using a given bandwidth of frequency resources (e.g., the internal signal may be an example of a multi-symbol signal). In some cases, the memory controller 310 may be configured to select a type of a modulation scheme (e.g., binary-symbol or multi-symbol) applied to a signal based on one or more parameters. Such parameters may include power consumption parameter of the memory device, performance requirements of an application being implemented using the memory device, other parameters, or a combination thereof.

In a binary-symbol signal 325, the modulation scheme includes two symbols (e.g., two voltages levels) are used to represent up to two logic states (e.g., logic state '0' or logic state '1'). In a multi-symbol signal 320, the modulation scheme may include a larger library of symbols may be used to represent three or more logic states. For example, if the multi-symbol signal 320 is modulated with a modulation scheme that includes four unique symbols, the multi-symbol signal 320 may be used to represent up to four logic states, '00', '01', '10', and '11'. As a result, multiple bits of data may be included within a single symbol, thereby increasing the amount of data communicated using a given bandwidth.

A multi-symbol signal 320 may be any signal that is modulated using a modulation scheme that includes three or more unique symbols to represent data (e.g., two or more bits of data). A M-ary signal is modulated using a modulation scheme where M represents the number of unique symbols (e.g., levels, or other conditions or combinations of conditions possible in the modulation scheme. The multi-symbol signal 320 may be an example of any M-ary modulation scheme where M is greater than or equal to 3. A multi-symbol signal 320 or a multi-symbol modulation scheme may be referred to as a non-binary signal or non-binary modulation scheme in some instances. Examples of multi-symbol (or M-ary) modulation schemes related to a multi-symbol signal may include, but are not limited to, pulse amplitude modulation (PAM) schemes, quadrature amplitude modulation (QAM) schemes, quadrature phase shift keying (QPSK) schemes, and/or others.

A binary-symbol signal 325 may be any signal that is modulated using a modulation scheme that includes two unique symbols to represent one bit of data. The binary-symbol signal 325 may be an example of a M-ary modulation scheme where M equal to 2. Examples of binary-symbol modulation schemes related to a binary-symbol signal include, but are not limited to, non-return-to-zero (NRZ), unipolar encoding, bipolar encoding, Manchester encoding, PAM2, and/or others.

In some cases, the modulation schemes of the various signals may be amplitude modulation schemes such as PAM4 and/or NRZ that encode information in the amplitude (or level) of a signal (e.g., a voltage amplitude or a current amplitude). The symbols of the modulation schemes may be referred to as levels, amplitudes, or signal strengths. For example, a first level of a signal may represent '00', a second level may represent '01', a third level may represent '10', and a fourth level may represent '11'. In some cases, a single symbol of the amplitude modulation scheme may be a constant level applied during a single symbol duration or two or more levels applied during a single symbol duration. The functions of features described herein may apply with other types of modulation schemes such as phase modulation schemes, phase-shift keying modulation schemes, frequency shift keying modulation schemes, amplitude-shift keying modulation schemes, on-off keying (OOK) modulation schemes, orthogonal frequency-division multiplexing (OFDM) modulation schemes, spread-spectrum modulation schemes, time-based modulation schemes, or a combination thereof. As such, the symbols or levels of the modulation schemes may be related to signal parameters other than amplitude (e.g., phase, time, frequency).

In some examples, some multi-symbol signaling schemes include symbols that are separated by a smaller difference in voltage (or other variable signal parameter measurement) than symbols in binary-symbol signaling schemes. The smaller voltage separation may, in some examples, make the multi-symbol signal 320 more susceptible to error caused by noise and other factors. The voltage separation of symbols in the multi-symbol signal 320, however, may be expanded by increasing a peak-to-peak transmitted power of a transmitted signal. But in some situations, such an increase to peak-to-peak transmitted power may not be possible or may be difficult due to fixed power supply voltages, fixed signal power requirements, or other factors. Consequently, to implement multi-level signaling, a transmitter may utilize more power and/or a receiver may be susceptible to an increased error rate, when compared to a binary-symbol signal 325. Despite this smaller voltage difference and related aspects, multi-level signaling facilitates distinct and advantageous implementations. For example, multi-level signaling communicates more information given a finite amount of communication resources than binary-level signals. In some examples, as described with reference to FIG. 1, a memory controller (e.g., memory controller 110) may transmit a modulated signal to multiple memory dies (e.g., memory dies 105) through a bus. Because a signal may relate to first data and second data modulated using a modulation scheme having at least three levels, information associated with the first data and second data can be transmitted to a first memory die and a second memory die using a single signal. For example, first data and second data may be modulated in a signal having at least three levels. This signal may be transmitted, for example through a bus, to a first memory die and a second memory die. Due to the modulation scheme, information related to the first data may be transmitted to the first memory die and information related to the second data may be transmitted to the second memory die through the single signal. This may result in improved read and write times, reduced power consumption, improved reliability of the memory device, or a combination thereof.

Utilizing multi-symbol signaling among memory dies stacked inside of a semiconductor package may improve performance of the system 100. The multi-symbol signals inside of the semiconductor package may reduce a number of internal interconnects (e.g., TSVs). A reduced number of internal interconnects (e.g., TSVs) may decrease a memory die area to decrease a manufacturing cost. In addition, the reduced number of internal interconnects (e.g., TSVs) may reduce various parasitic components (e.g., resistance, capacitance) associated with the internal interconnects to mitigate various issue related to degradation of the multi-symbol signals while being transmitted through the internal interconnects.

In some cases, the features and functions related to communicating multi-symbol signals 320 and binary-symbol signals 325 may be implemented in devices and contexts other than memory storage. For example, the features of functions described herein may be implemented in personal computing devices, laptops, servers, portable communication devices, or a combination thereof.

Figure 4:
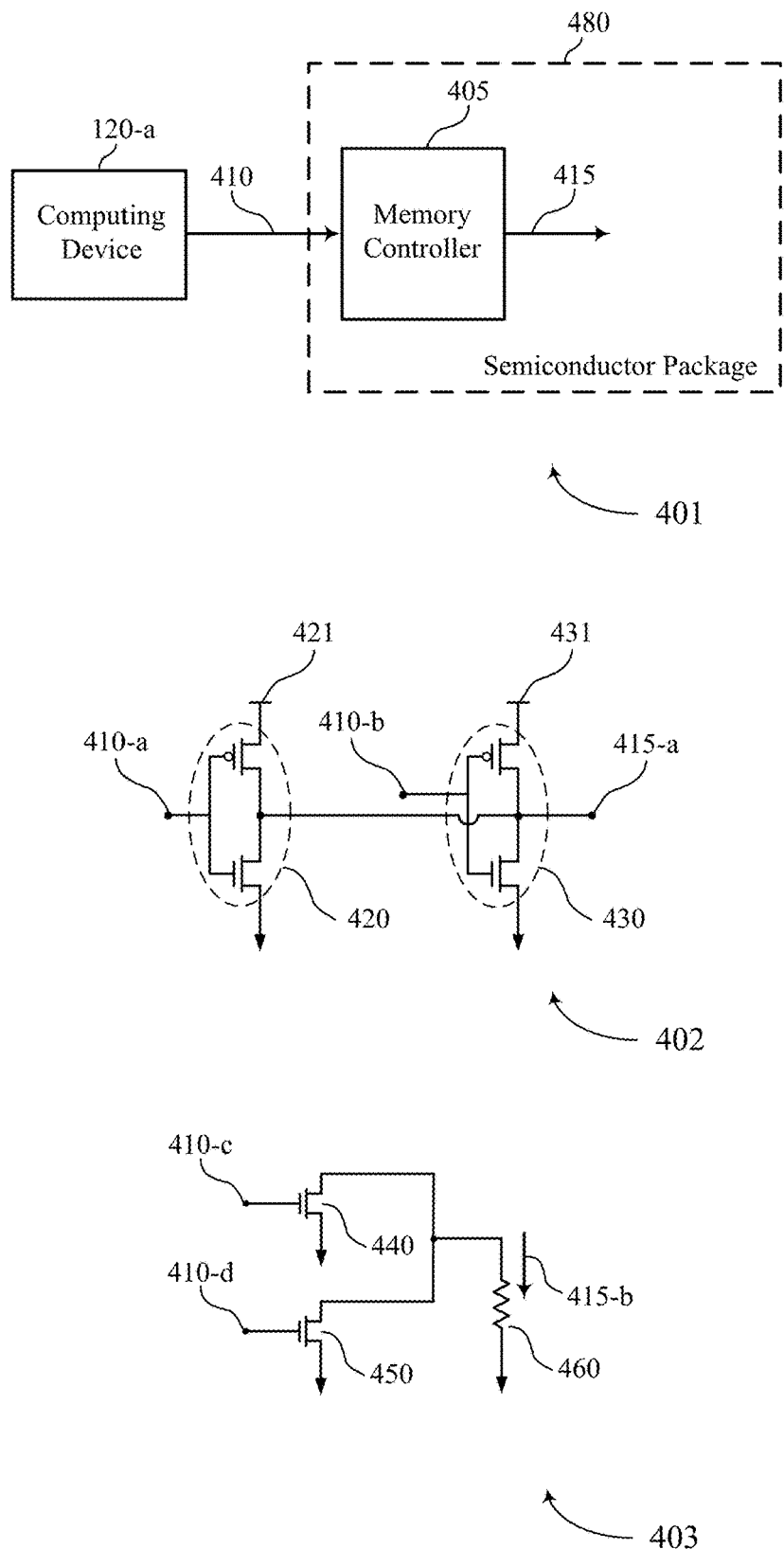
FIG. 4 illustrates an example of a diagram that supports multiplexing distinct signals on a single pin in accordance with examples of the present disclosure.
Figure 5:
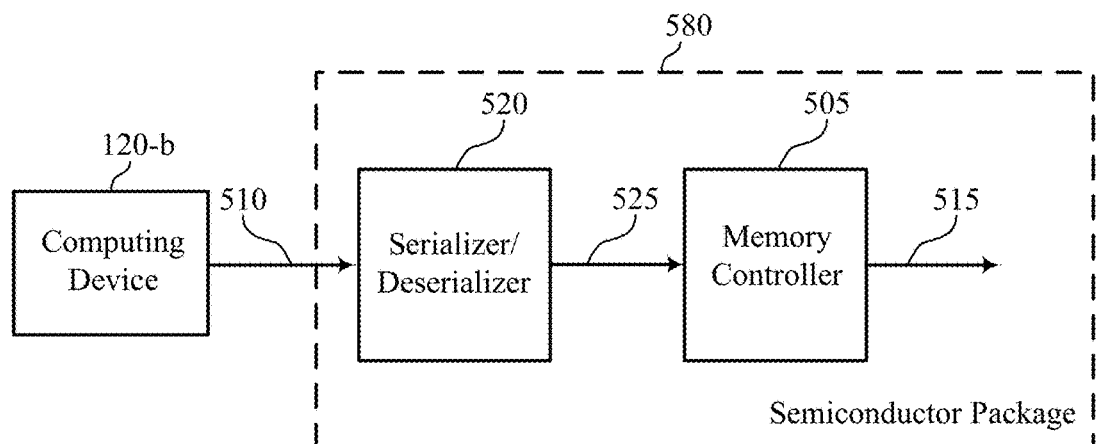
FIG. 5 illustrates an example of a diagram that supports multiplexing distinct signals on a single pin in accordance with examples of the present disclosure.
Figure 5:
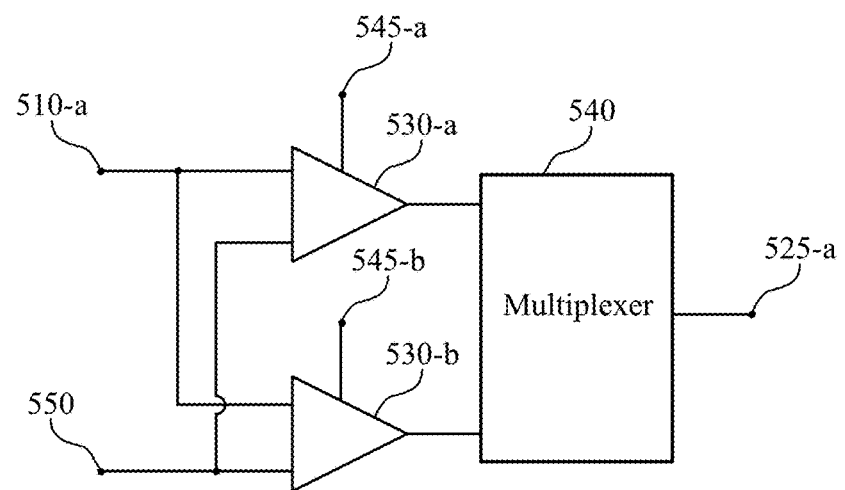
Figure 6:
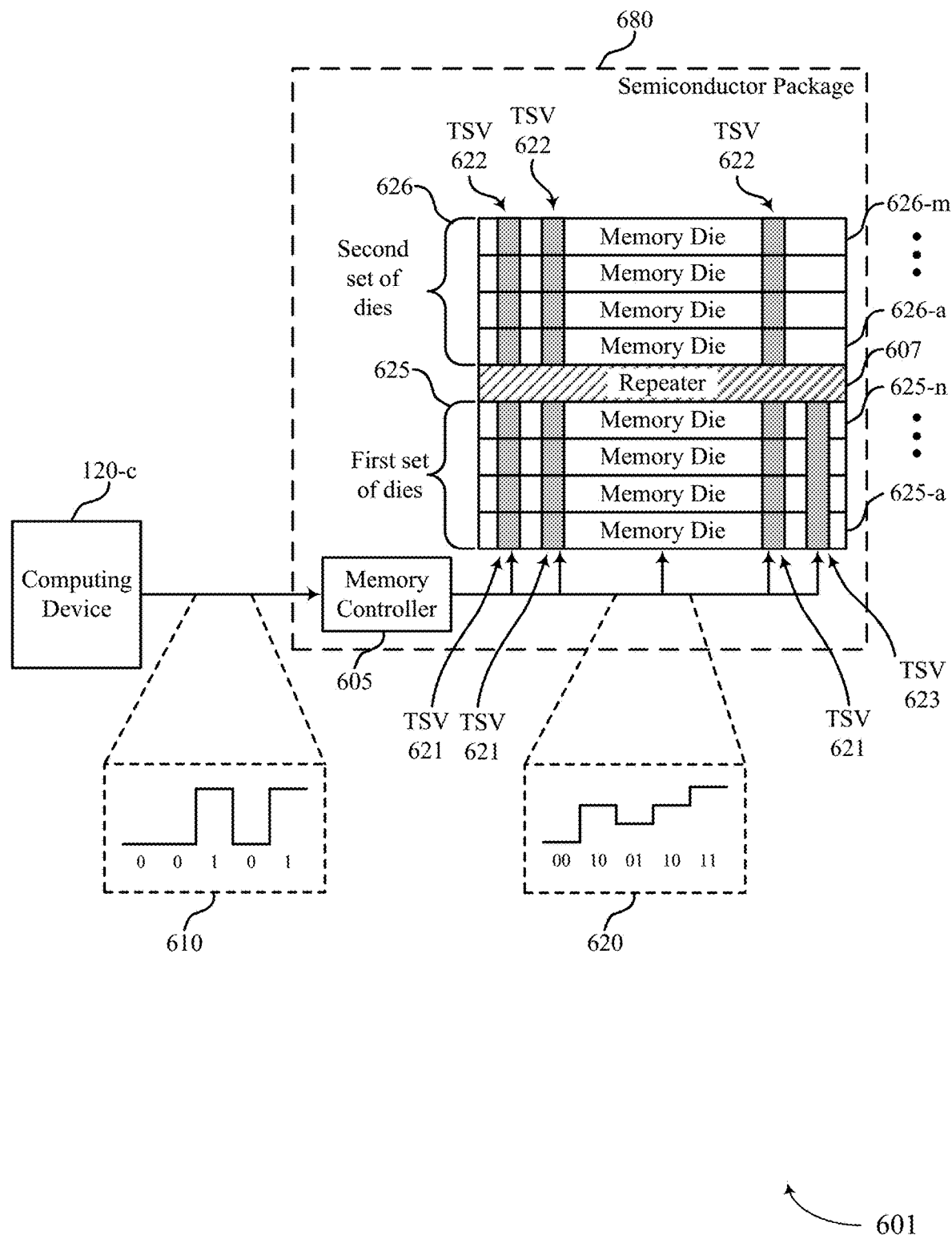
FIG. 6 illustrates an example of a memory device that supports multiplexing distinct signals on a single pin in accordance with examples of the present disclosure.

FIGS. 4-6 illustrate a memory device configured to communicate data using a binary-symbol signal, a multi-symbol signal, or a combination thereof. The memory device may include a computing device electrically coupled with a semiconductor package that includes several semiconductor dies stacked on one another. The computing device may exchange information with a host over a first signal path using a binary-symbol signal that is encoded with a modulation scheme that includes two symbols (e.g., two voltage levels) to represent one bit of data. The computing device may generate a multi-symbol signal that is encoded with a modulation scheme including three or more symbols to represent more than one bit of data based on receiving the binary-symbol signal. The computing device may transmit the multi-symbol signal to other semiconductor dies inside of the semiconductor package through a set of internal signal paths (e.g., TSVs). The features and/or functions described with reference to FIGS. 4-6 may be combined with the features and/or functions of other aspects of a memory device as described with reference to FIGS. 1-3 and FIGS. 7-22.

FIG. 4 illustrates an exemplary diagram 401 of a memory system interface and associated exemplary circuits, a voltage driver 402 and a current driver 403, in accordance with various examples of the present disclosure. A memory controller 405 may receive a first signal 410 from a computing device 120-a and process information contained in the first signal 410 to generate a second signal 415. The memory controller 405 may be an example of the memory controller 110 described with reference to FIG. 1. In some examples, the first signal 410 may be a binary-symbol signal configured with two levels. In some examples, the first signal 410 may be encoded using a modulation scheme that includes two unique symbols to represent one bit of data.

In some examples, the second signal 415 may be a multi-symbol signal using a modulation scheme that includes three or more unique symbols to represent more than one bit of data. In some examples, the first signal 410 may be encoded using a NRZ modulation scheme and the second signal 415 may be encoded with a PAM scheme. An example of the second signal 415 encoded with a PAM scheme may be a PAM4 signal configured with four signal levels described with reference to FIG. 3.

In some examples, the memory controller 405 may be located within a semiconductor package 480 that may be electrically coupled with the computing device 120-a that is located external to the semiconductor package 480. The computing device 120-a may be a system on a chip (SoC) or a processor (e.g., a central processing unit (CPU), a graphics processing unit (GPU)). The semiconductor package 480 may include other semiconductor dies (which may also be referred to as semiconductor chips, not shown) electrically coupled with the memory controller 405, such as memory chips employing DRAM, NAND, FeRAM, or 3DXP technologies. In some examples, the second signal 415 may be used to send and receive the encoded information inside the semiconductor package 480 among the various components therein.

The memory controller 405 may include the voltage driver 402 configured to generate the second signal 415 based on receiving the first signal 410. The voltage driver 402 may be a part of the multi-symbol signal component 135 described with reference to FIG. 1. The first signal 410 may include a first signal 410-a corresponding to a first bit (e.g., a least significant bit (LSB)) of the signal 410. In some examples, the first signal 410-a may be connected to an input of a 1× complementary metal oxide semiconductor (CMOS) branch 420. In addition, the first signal 410 may include a first signal 410-b corresponding to a second bit (e.g., a most significant bit (MSB)) of the first signal 410.

In some examples, the first signal 410-b may be connected to an input of a 2× CMOS branch 430. The 1×CMOS branch 420 may be connected to a 1× voltage node 421 while the 2×CMOS branch 430 may be connected to a 2× voltage node 431. The description 1× or 2× in the voltage driver 402 may indicate a voltage value supplying an operating voltage to a CMOS branch. For example, the 2×CMOS branch 430 may be connected to the 2× voltage node 431 having a voltage (e.g., 1.6 V) that is approximately two times of a voltage (e.g., 0.8 V) of the 1× voltage node 421. Output nodes of the 1×CMOS branch 420 and the 2×CMOS branch 430 may be connected to generate a second signal 415-a. The voltage driver 402 may generate the second signal 415-a associated with four voltage levels that may be determined by four different combinations of the first signal 410-a and the first signal 410-b, e.g., 00, 01, 10, or 11.

The memory controller 405 may include the current driver 403 configured to generate the second signal 415 based on receiving the first signal 410. The current driver 403 may be a part of the multi-symbol signal component 135 described with reference to FIG. 1. The first signal 410 may include a first signal 410-c corresponding to a first bit (e.g., a least significant bit (LSB)) of the signal 410. In some examples, the first signal 410-c may be connected to a gate of a 1× n-type MOS (NMOS) device 440. In addition, the first signal 410 may include a first signal 410-d corresponding to a second bit (e.g., a most significant bit (MSB)) of the first signal 410. In some examples, the first signal 410-d may be connected to a gate of a 2×NMOS device 450.

The description 1× or 2× in the current driver 403 may indicate a current value for an NMOS device may conduct. For example, the 2×NMOS device 450 may conduct a current (e.g., 500 micro-amps, μA) that is approximately twice of a current (e.g., 250 μA) that the 1×NMOS device 440 may conduct. Drain nodes of the 1×NMOS device 440 and the 2×NMOS device 450 are connected to generate a second signal 415-b in a form of electrical current flowing through a resistive load 460. The resistive load 460 may be a representation of an equivalent resistance of a circuitry connected to the drain nodes of the 1×NMOS device 440 and the 2×NMOS device 450. The current driver 403 may generate the second signal 415-b associated with four current levels that may be determined by four different combinations of the first signal 410-c and the first signal 410-d, e.g., 00, 01, 10, or 11.

The particular configurations depicted in the voltage driver 402 and the current driver 403, e.g., the LSB signal 410-a connected to the 1×CMOS branch 420 and the MSB signal 410-b connected to the 2×CMOS branch 430 in the voltage driver 402, or the LSB signal 410-c connected to the 1×NMOS device 440 and the MSB signal 410-b connected to the 2×NMOS device 450 in the current driver 403, may represent possible examples to illustrate a function of the memory controller 405 that may be configured to generate the second signal 415 that includes four signal levels (e.g., a voltage amplitude or a current amplitude).

Other configurations of circuits are possible to generate a second signal 415 that includes four signal levels based on receiving a first signal 410 that includes two signal levels. For example, the NMOS transistors 440 or 450 may be replaced with p-type MOS (PMOS) transistors in some examples. In addition, a different circuit or circuits may be used to generate a second signal 415 that includes at least three or more different signal levels such that the second signal 415 encodes more than one bit of data. Furthermore, the voltage driver 402 and the current driver 403 may include other circuit components (e.g., each CMOS branch 420 or 430 may include a resistive network or other circuit elements (not shown)) to generate a robust second signal 415 to mitigate various issues (e.g., jitter, distortion, degradation of width and opening of the second signal 415).

The second signal 415 may be modulated using a modulation scheme that includes at least three levels to encode more than one bit of information. The second signal 415 may be used to send and receive the encoded information among various parts within the semiconductor package 480, which may include semiconductor dies or chips (e.g., memory chips using DRAM, NAND, FeRAM, or 3DXP memory technologies, or a combination of such memory chips). As a result of the second signal 415 representing more than one bit of information, a number of interconnects (e.g., through-silicon vias (TSVs)) between two semiconductor dies within the semiconductor package 480 may be reduced.

In some examples, the second signal 415 may be modulated such that a single level of the second signal 415 represents two bits of information (e.g., 00, 01, 10 or 11) and the number of TSVs carrying the second signal 415 may be reduced to one-half when compared to a number of TSVs carrying a second signal representing one bit of information (e.g., 0 or 1). By reducing a number of TSVs, a die areas occupied by the TSVs may also be reduced. In addition, various circuitries (e.g., receivers, drivers) associated with the TSVs may be removed.

For example, a semiconductor package including a number of memory chips connected through internal interconnects (e.g., TSVs) may be configured to have one external pin connected to a first number of interconnects (e.g., eleven TSVs). Metal routings between the external pin and the first number of interconnects may become a significant source of parasitic components (e.g., resistances and capacitances). A second signal 415 representing two bits of information may reduce the number of interconnects (e.g., from eleven TSVs to six TSVs) and accompanying reduction in the parasitic components may improve performance of a memory system including the semiconductor package.

FIG. 5 illustrates an exemplary diagram 501 of a memory system interface and an associated exemplary circuit, a deserializer 502, in accordance with various examples of the present disclosure. A memory controller 505 may be an example of the memory controller 405 described with reference to FIG. 4. A first signal 510 and a second signal 515 may be examples of the first signal 410 and the second signal 415 described with reference to FIG. 4. A serializer/deserializer 520 may receive the first signal 510 from a computing device 120-b and generate a deserialized signal 525. The serializer/deserializer 520 may be referred to as a SerDes functional block in some cases. The memory controller 505 may receive the deserialized signal 525 to generate the second signal 515. In some examples, the memory controller 505 may include the serializer/deserializer 520.

The serializer/deserializer 520 may include the deserializer 502 to generate the deserialized signal 525 based on receiving the first signal 510. The deserializer 502 may include comparators 530-a and 530-b and a multiplexer 540. The deserializer 502 may operate with a two-phase clock system in which a first clock signal 545-a may be associated with a first comparator 530-a and a second clock signal 545-b may be associated with a second comparator 530-b. In some examples, each comparator 530-a and 530-b may be supplied with a first signal 510-a and a Vref signal 550. The Vref signal 550 may provide a reference voltage for the comparators 530-a and 530-b to generate an output by comparing the Vref signal 550 and the first signal 510-a.

In some examples, the comparator 530-a may be configured to capture information contained in even bits of the first signal 510-a on rising edges of the first clock signal 545-a. In addition, the comparator 530-b may be configured to capture information contained in odd bits of the first signal 510-a on rising edges of the second clock signal 545-b. Subsequently, the multiplexer 540 may align output signals of the comparators 530-a and 530-b to generate the deserialized signal 525-a.

The particular configuration depicted in the deserializer 502, e.g., deserializing odd bits and even bits using a two-phase clock system, may represent an example to illustrate a function of the serializer/deserializer 520. Other configurations of circuits may be possible to generate a deserialized signal 525 having a 2:1 deserialization factor. For example, a single-phase clock system may be used to capture odd bits at rising edges of a single clock signal while even bits may be captured at falling edges of the single clock signal. In addition, different circuits may be employed to generate a deserialized signal 525 having a serialization factor other than 2:1 (e.g., 4:1 or 8:1).

FIG. 6 illustrates exemplary diagram 601 of a memory system in accordance with various examples of the present disclosure. The diagram 601 illustrates a memory controller 605 located within a semiconductor package 680. The memory controller 605 may be an example of the memory controller 405 or 505 described with reference to FIGS. 4 and 5. The semiconductor package 680 may be an example of the semiconductor package 480 or 580 described with reference to FIGS. 4 and 5. In some cases, the memory controller 605 may also include the serializer/deserializer 520 described with reference to FIG. 5. The memory controller 605 may receive a first signal 610 from a computing device 120-c.

In some cases, the computing device 120 may be referred to as a host device. The first signal 610 may be an example of the first signal 410 or 510 described with reference to FIGS. 4 and 5. In some cases, the first signal 610 may be a binary signal including two signal levels. In some cases, the first signal 610 may be encoded using a modulation scheme that includes two unique symbols to represent one bit of data. The memory controller 605 may generate a second signal 620 based on information from the first signal 610 from the computing device 120-c. The second signal 620 may be an example of the second signal 415 or 515 described with reference to FIGS. 4 and 5. In some cases, the second signal 620 may be encoded with PAM scheme. In some cases, the second signal 620 may be a PAM4 signal configured with four signal levels.

The semiconductor package 680, in some cases, may include one or more memory dies 625 (which may also be referred to as chips, semiconductor chips, and/or semiconductor dies) positioned above the memory controller 605. The memory dies 625 may be examples of the memory dies 105 described with reference to FIG. 1. The individual dies of the memory dies 625, 626 may employ different memory technologies, e.g., DRAM, NAND, FeRAM, 3DXP, or a combination thereof. In some cases, different dies may employ different memory technologies than other dies in the memory stack. In some examples, the semiconductor package 680 may include a first number (e.g., eight memory dies) of memory dies 625.

The memory dies 625 may be electrically coupled with the memory controller 605 and stacked directly on one another. In some cases, the memory dies 625 may include a memory die having its own package different than the semiconductor package 680. In some cases, the memory dies 625 may include one or more dies having a set of TSVs 621 to relay the second signal 620. In other words, the memory dies 625 may relay the second signal 620 through the set of TSVs 621. In some examples, the top-most memory die (e.g., the memory die 625-n) of the memory dies 625 may not have TSVs when the top-most memory die does not need to relay the second signal 620 farther (absent a repeater 607 and a second set of memory dies 626). In some examples, each memory die of the memory dies 625 may include a receiver (not shown) configured to receive and decode the second signal 620.

The memory controller 605 may send a Chip Enable (CE) signal to the memory dies 625 when the memory controller 605 transmit the second signal 620 through the set of TSVs 621. The CE signal designates a targeted memory die (e.g., 625-a, or any one of the memory dies 625 depicted in the diagram 601) among the memory dies 625 to receive the second signal 620. In some examples, the memory controller 605 may directly send the CE signal to the targeted memory die. When the targeted memory die (e.g., the memory die 625-a) receives the CE signal, the targeted memory die (e.g., the memory die 625-a) may activate its receiver to receive the second signal 620 and decode information contained therein.

The other memory dies (e.g., memory dies 625 other than 625-a) may not activate their receivers to avoid power consumption associated with activating their receivers. In some examples, the CE signal may be encoded, for example using a PAM scheme. In such cases, one or more memory dies of the memory dies 625 may include another receiver configured to decode the CE signal to determine whether the second signal 620 is targeted for them to receive. The targeted memory die (e.g., the memory die 625-a), upon determining that the second signal 620 is intended for it to receive, may activate its receiver configured to receive the second signal 620 and decode information contained therein.

The diagram 601 further illustrates the repeater 607 and the second set of memory dies 626 that are co-located within the semiconductor package 680. The repeater 607 and the second set of memory dies 626 may be positioned above the first set of memory dies 625. The second set of memory dies 626 (e.g., the memory dies 626-a through 626-m) may be one or more memory chips or dies employing the same or different memory technologies, e.g., DRAM, NAND, FeRAM, 3DXP, or a combination thereof. In some cases, the memory dies 626 may include one or more dies having a set of TSVs 622 to relay multi-level signals, including the second signal 620. In some examples, the top-most memory die (e.g., the memory die 626-m) may not include TSVs when the top-most memory die does not need to relay the signals farther. In some examples, each memory die of the memory dies 626 may include a receiver (not shown) configured to receive and decode the signals.

The repeater 607 may alleviate issues associated with a vertical distance for the second signal 620 to travel. Such issues may be referred to as Z-height restriction issues in some cases. Z-height restriction issues may arise when the first number of memory dies 625 (e.g., eight memory dies) creates a vertical distance that may be long enough to result in a degradation of the second signal 620 received at the next memory die (e.g., memory die 626-a absent the repeater 607). As a result, a failure in decoding the second signal 620 may occur (e.g., at memory die 626-a absent the repeater 607) due to the degradation of the second signal 620. In some examples, extended rise and fall times combined with jitter, distortion, and diminished amplitudes may contribute to the degradation of the second signal 620 after traveling the vertical distance associated with the first number of memory dies 625.

The repeater 607 may be electrically coupled with the first number of memory dies 625 through the first set of TSVs 621 and the second number of memory dies 626 through the second set of TSVs 622. The repeater 607 may be configured to receive the second signal 620 through the first set of TSVs 621 and re-transmit the second signal 620 to the second number of memory dies 626 that are located above the first number of memory dies 625 through the second set of TSVs 622. The repeater 607 may be referred to as a re-driver in light of its signal re-transmitting function. In some examples, the first number of memory dies 625 may be referred to as a first tier while the second number of memory dies 626 may be referred to as a second tier.

As described above the first number of memory dies 625, in some examples, may include a first set of TSVs 621 through which the second signal 620 may be relayed. In addition, the second number of memory dies 626, in some examples, may include a second set of TSVs 622 through which the second signal 620 may be relayed. The memory controller 605 may be referred to as a main master configured to communicate with the repeater 607 when the memory controller 605 sends the second signal 620 to the second number of memory dies 626. In some examples, a set of pass-through TSVs (not shown) may be employed to directly couple the memory controller 605 with the repeater 607. The pass-through TSVs may be configured with a different (e.g., smaller in physical dimensions and fewer in numbers) structural features than the first set of TSVs 621 or the second set of TSVs 622 due to a relatively simpler nature of signals between the repeater 607 and the memory controller 605 absent various circuits associated with the first or the second set of TSVs.

The memory controller 605, when sending the second signal 620 to the second number of memory dies 626 in the second tier, may be restricted from accessing the memory dies 625 in the first tier. The restriction stems from the fact that the first set of TSVs 621 associated with the first number of memory dies 625 may be used to relay the second signal 620 to the second number of memory dies 626 in conjunction with the repeater 607 receiving and re-transmitting the second signal 620. In other words, accessing the first number of memory dies 625 in the first tier and accessing the second number of memory dies 626 in the second tier may be carried out in a time-divided manner.

In some examples, during a first time duration, the memory controller 605 may access the first number of memory dies 625 in the first tier while the second number of memory dies 626 in the second tier are isolated. During a second time duration following the first time duration, the memory controller 605 (e.g., main master), in collaboration with the repeater 607 (e.g., re-driver), may access the second number of memory dies 626 in the second tier through the first set of TSVs 621 and the second set of TSVs 622 while the first number of memory dies 625 in the first tier are isolated.

The diagram 601 further illustrates a third set of TSVs 623 co-located within the semiconductor package 680. The third set of TSVs 623 may be electrically coupled with the memory controller 605 and the repeater 607. A single representation of the third set of TSVs 623 in FIG. 6 is illustrated in an effort to increase visibility and clarity of the depicted features. Additional configurations are contemplated. The third set of TSVs 623 may alleviate the issues related to the time-divided manner of accessing the first number of memory dies 625 in the first tier and the second number of memory dies 626 in the second tier. The memory controller 605 may generate a signal 620-*a* to send through the third set of TSVs 623. The signal 620-*a* may be considered as a modified example of the second signal 620 due to its nature bypassing the first number of memory dies 625.

For example, the signal 620-*a* may be the same as the second signal 620 except that the signal 620-*a* may be less susceptible to the degradation associated with the second signal 620 traveling through the first number of memory dies 625. The third set of TSVs 623 may be configured with structural features (e.g., similar in physical dimensions and numbers) of the first set of TSVs 621 or the second set of TSVs 622. The memory controller 605 may be configured to communicate with the repeater 607 when the memory controller 605 sends the signal 620-*a* to the second number of memory dies 626 through the third set of TSVs 623. In addition, the repeater 607 may be configured to receive the signal 620-*a* through the third set of TSVs 623 and re-transmit the signal 620-*a* to the second number of memory dies 626 through the second set of TSVs 622.

The addition of the third set of TSVs 623, in some examples, may enable the memory controller 605 simultaneously, or at least during a partially overlapping period, access the first number of memory dies 625 and the second number of memory dies 626. In other words, the memory controller 605, when sending the second signal 620 to the first number of memory dies 625 in the first tier, may operate independent of the second number of memory dies in the second tier. At the same time, or at least during a partially overlapping period, the memory controller 605 (e.g., main master), in collaboration with the repeater 607 (e.g., re-driver), may access the second number of memory dies 626 in the second tier due to the presence of the third set of TSVs 623 relaying the signal 620-*a* in parallel with the second signal 620. Hence, the configuration depicted in the diagram 601 may allow support of expanded memory capacity in the first and the second tier to improve performance of a memory system.

Figure 7:
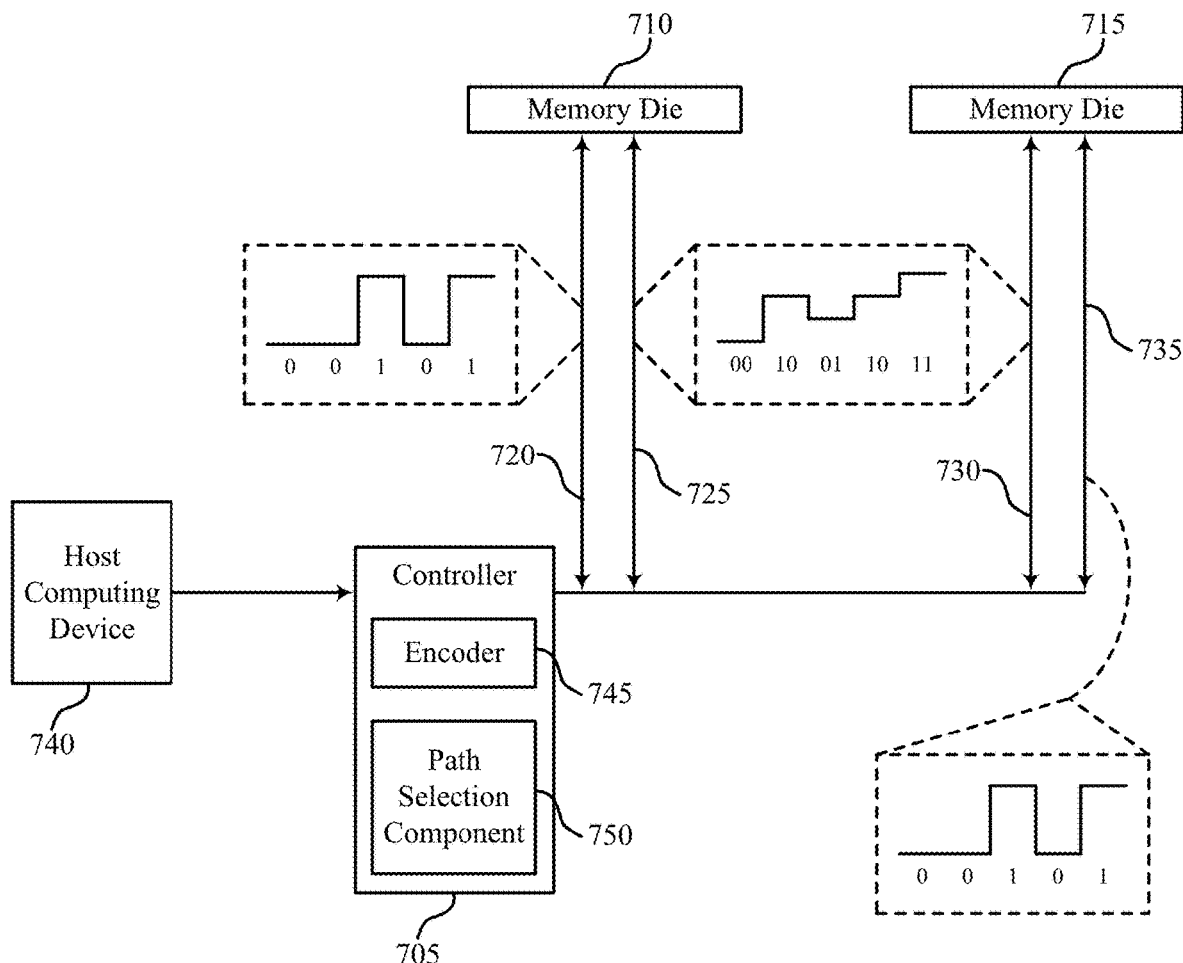
FIG. 7 illustrates an example of a memory device that supports multiplexing distinct signals on a single pin in accordance with examples of the present disclosure.
Figure 8:
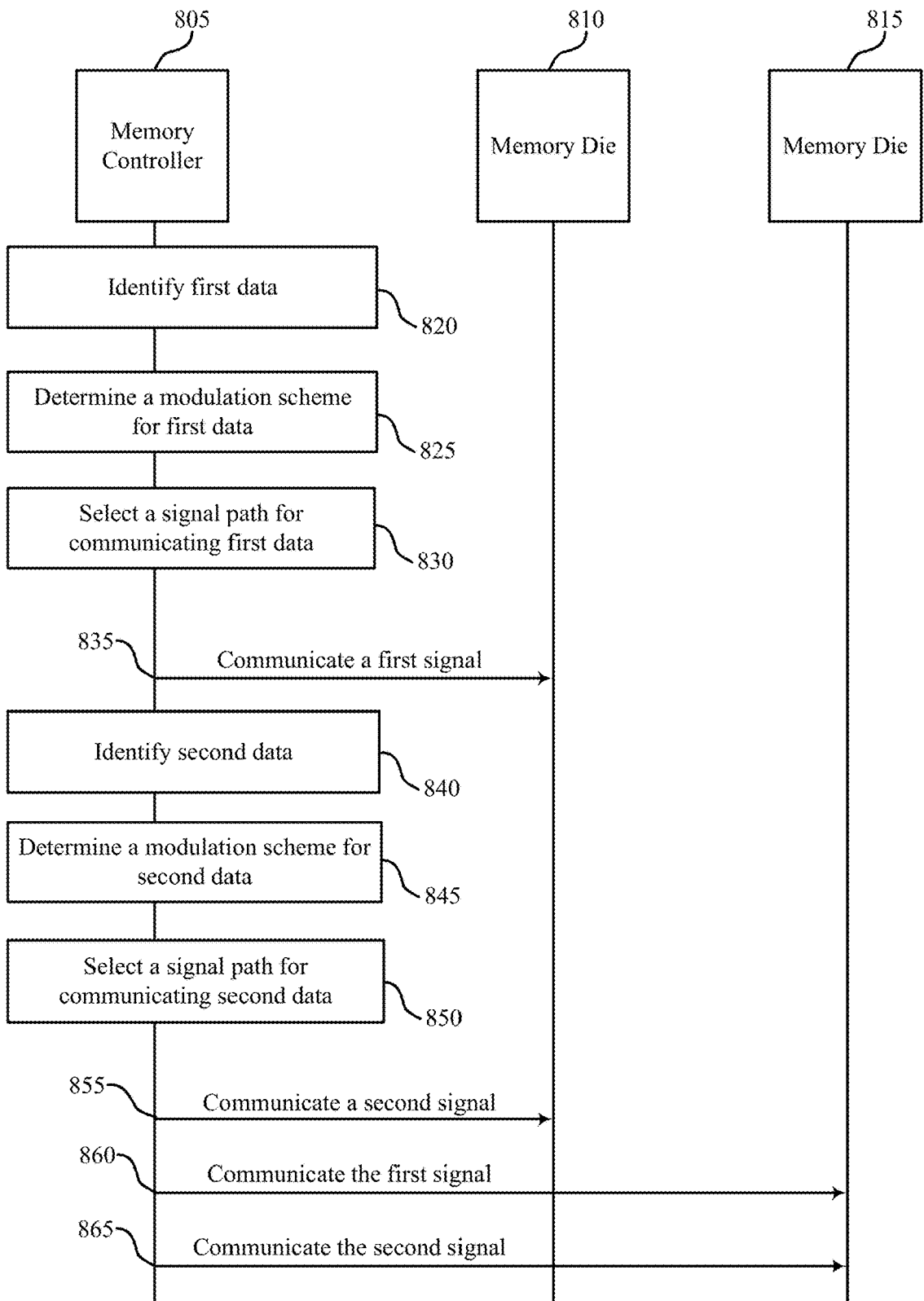
FIG. 8 illustrates an example of a process flow diagram that supports multiplexing distinct signals on a single pin in accordance with examples of the present disclosure.

FIGS. 7-8 illustrate a memory device configured to communicate one or more binary-symbol signal(s) and/or one or more multi-symbol signal(s) using signal paths dedicated to a communicating a particular type of signal (e.g., binary-symbol signal or multi-symbol signal) in a memory device. The memory device may transfer data across a large number of channels in a memory device using binary or multi-level signaling, such as NRZ and PAM, respectively. The signals may be transmitted through different dedicated signal paths, which may result in improved read and write times, reduced power consumption, and/or improved reliability of the memory device. The features and/or functions described with reference to FIGS. 7-8 may be combined with the features and/or functions of other aspects of a memory device as described with reference to FIGS. 1-6 and FIGS. 9-22.

FIG. 7 illustrates an example memory device 700 in accordance with various examples of the present disclosure. Memory device 700 may be an example of system 100 as described with reference to FIG. 1. Memory device 700 may include memory controller 705, a first memory die 710, a second memory die 715, a host 740. In some examples, the memory controller 705 may include an encoder 745 and a path selection component 750, In other examples, the first memory die 710 may be coupled with the memory controller 705 by a first signal path 720 and a second signal path 725.

The second memory die 715 may be coupled with the memory controller 705 a third signal path 730 and a fourth signal path 735. In some examples, the first signal path 720, second signal path 725, the third signal path 730, and the fourth signal path 735 may be individual examples of the internal signal paths 115 as described with reference to FIG. 1. In other examples, first memory die 710 and second memory die 715 may be individual examples of the memory dies 105 as described with reference to FIG. 1. Additionally or alternatively, for example, the memory controller 705 may be an example of the memory controller 110 as described with reference to FIG. 1. In other examples, the host 740 may be an example of the computing device 120 as described with reference to FIG. 1.

First memory die 710 may include one or more memory cells (not illustrated), which may be referred to as a plurality of memory cells of the first memory die 710. In some examples, the memory controller 705 may communicate one or more signals to the plurality of memory cells of the memory die 710 through the first signal path 720 and the second signal path 725. For example, the first signal path 720 may be coupled with the memory controller 705 and the first memory die 710 and may be configured to communicate a multi-level signal to the first memory die 710. Additionally or alternatively, for example, the second signal path 725 may be coupled with the memory controller 705 and the first memory die 710 and may be configured to communicate a binary-symbol signal to the first memory die 710.

In other examples, each of the first signal path 720 and the second signal path 725 may be configured to communicate a multi-level signal or a binary-symbol signal to the first memory die 710. In some examples, each of the signal paths may be configured to communicate a dedicated signal type. For example, first signal path 720 and second signal path 725 may be configured to transmit a binary-symbol signal. In other examples, third signal path 730 and fourth signal path 735 may be configured to transmit a multi-level signal. In other examples, any of first signal path 720, second signal path 725, third signal path 730, and fourth signal path 735 may be configured to communicate either a binary-symbol signal or a multi-level signal.

Memory die 715 may include one or more memory cells (e.g., as described with reference to FIG. 2), which may be referred to as a plurality of memory cells of the second memory die 715. In some examples, the memory controller 705 may communicate one or more signals to the plurality of memory cells of the memory die 710 through the third signal path 730 and the fourth signal path 735. For example, the third signal path 730 may be coupled with the memory controller 705 and the second memory die 715 and may be configured to communicate a multi-level signal to the second memory die 715. Additionally or alternatively, for example, the fourth signal path 735 may be coupled with the memory controller 705 and the second memory die 715 and may be configured to communicate a binary-symbol signal to the second memory die 715. In other examples, each of the third signal path 730 and the fourth signal path 735 may be configured to communicate a multi-level signal or a binary-symbol signal to the second memory die 710.

In some examples, the path selection component 750 may facilitate the selection of one or more paths. For example, path selection component 750 may select the first signal path 720 to communicate a signal to first memory die 710. In other examples, path selection component 750 may select the third signal path 730 to communicate a signal to second memory die 715. In any example, path selection component 750 may select one or more signal paths based on a type of signal (e.g., a binary-symbol signal), a type of data transferred (e.g., control data), or an availability of a channel for data transfer.

In additional examples, each of first memory die 710 and second memory die 715 may receive a multi-level or binary-symbol signal in response to a CE signal (e.g., chip-enable). For example, the memory controller 705 may transmit a CE signal to one of first memory die 710 or second memory die 715. Upon receiving the CE signal, one of first memory die 710 or second memory die 715 may indicate, to the memory controller 705, to transmit a multi-level or a binary-symbol signal.

In some examples, memory device 700 may include a bus binary-symbol signal configured to communicate a multi-level signal or a binary-level signal along any of the signal paths. In communicating either a multi-level signal or a binary-symbol signal, the bus or memory controller 705 may communicate the signals based on a timing of a system clock. In some examples, the system clock may be associated with (e.g., integrated) memory controller 705. In other examples, the system clock may be external to the memory controller 705. For example, the memory controller 705 may transmit the multi-level signal, the binary-level signal, or both during a rising edge of the system clock, a falling edge of the system clock, or both.

Certain data may be transmitted in each of the multi-level signal and the binary-symbol signal. For example, the multi-level signal may include control data and the binary-level signal may include metadata. In other examples, the multi-level signal may include metadata and the binary-level signal may include control data. In further examples, the multi-level signal may include either metadata or control data and the binary-symbol signal may include metadata or control data. In other examples, either of the multi-level signal or the binary-symbol signal may include storage data. The storage data may, correspond to one or more memory cells of the first memory die 710 or the second memory die 715. In some examples, one or both of the metadata and the control data may be transmitted to one or more memory devices or one or more stacks of a single memory device. In other examples, one or both of the metadata and the control data may be stored redundantly in more than one memory device. For example, one or both of the metadata and the control data may be stored in a NAND device as long-term backup data, and may be transmitted to both a NAND device and a DRAM device.

In any configuration, the multi-level signal and binary-symbol signal may be transmitted by the memory controller 705 concurrently. For example, at least a portion of the multi-level signal may be transmitted to the first memory die 710 at a same time as at least a portion of the binary-symbol signal may be transmitted to the second memory die 715. The signals may be transmitted such that a portion, or the entirety, of each signal is communicated in at a same time—for example, during a rising edge of the system clock of the memory controller 705.

Each of the multi-level and binary-level signals may be modulated using a modulation scheme. In some examples, the multi-level and binary-level signals may be modulated via an encoder 745. For example, the multi-level signal may be modulated using a pulse amplitude modulation (PAM) modulation scheme and the binary-symbol signal may be modulated using a non-return-to-zero (NRZ) scheme. In a PAM modulation scheme, the multi-level signaling may include s PAM4 signaling, PAM8 signaling, etc. In this modulation scheme, for example, data (e.g., control data or metadata, for example) may be encoded in the amplitude of the signal. The amplitude, or a single symbol, may represent one bit of data. In other examples, the amplitude, or a single symbol, may represent two or more bits of data.

The signal may be demodulated, for example, by detecting the amplitude level of the signal during a given period. In another example, the binary-level signal may be modulated using a two-level amplitude modulation scheme (e.g., NRZ) modulation scheme. In such examples, a logic "1" may be represented by a first voltage level (e.g., positive voltage) and a logic "0" may be represented by a second voltage level (e.g., a negative voltage). In other examples, a two-level amplitude modulation scheme may include a non-return-to-zero level (NRZ(L)), non-return-to-zero inverted (NRZ(I)), non-return-to-zero mark (NRZ(M)), non-return-to-zero space (NRZ(S)), or non-return-to-zero change (NRZ(C)) modulation scheme.

FIG. 8 illustrates an example process flow diagram 800 in accordance with various examples of the present disclosure. Process flow diagram 800 may illustrate one or more operations conducted by memory device 700 as described with reference to FIG. 7. Process flow diagram 800 may include operations conducted by a memory controller 805, a memory die 810, and a memory die 815. In some examples, memory controller 805, memory die 810, and memory die 815 may be examples of memory controller 705, memory die 710, and memory die 715, respectively, as described with reference to FIG. 1. In other examples, memory die 810 and memory die 815 may be referred to as first memory die 810 and second memory die 815, respectively.

At block 820, the memory controller 805 may identify first data to be communicated to the first memory die 810. The first memory die 810 may, for example, include one or more memory cells that may be referred to as a plurality of memory cells. In some examples, the first memory die 810 may include ferroelectric memory cells, dynamic random access memory cells, NAND memory cells, NOR memory cells, or a combination thereof. First data may include, for example, metadata or control data and may be provided to the memory controller 805 via a host computing device 120 as described with reference to FIG. 1.

In other examples, storage data may be provided to the memory controller 805 via the host computing device 120 as described with reference to FIG. 1. In some examples, the storage data may be associated with one or more memory cells of the first memory die 810 or the second memory die 815. Upon identifying the first data, the memory controller 805 may determine a modulation scheme for the data at block 825. As described above with reference to FIG. 7, the first data may be modulated using a multi-symbol modulation scheme (e.g., PAM) or binary-symbol modulation scheme (e.g., NRZ), which may correspond to a multi-level and a binary-symbol signal, respectively.

At block 830, the memory controller 805 may select a signal path for communicating the first data. The signal path may be, for example, one of first signal path 720, second signal path 725, third signal path 730, or fourth signal path 735 as described with reference to FIG. 7. Also described with reference to FIG. 7, the signal path may be a conductor in a through silicon via (TSV). Once a signal path has been selected, through transmission 235, the memory controller 805 may communicate the first signal modulated using the modulation scheme to the first memory die 810 using the decided-upon signal path. In some cases, the memory controller 805 may select the signal path. The memory controller 805 may identify one or more capabilities of the signal path (e.g., bandwidth) or the availability of the signal path to transmit the signal.

For instance, the memory controller 805 may identify types of signals that can be communicated using the signal path. If a signal path is configured to communicate the type of signal requesting transmission (e.g., the signal is a multi-symbol signal and the signal path is configured to communicate multi-symbol signals), the memory controller 805 may select the given signal path. In some cases, the availability of the signal path (e.g., bandwidth) may also be considered when selecting a signal path. In other examples, the signal path may be selected by the memory controller 805 based on the type of signal transmitted (e.g., a binary-symbol signal). In communicating the first signal, the memory controller 805 may communicate the first signal based on a timing of a system clock. In some examples, the system clock may be associated with (e.g., integrated) memory controller 805. In other examples, the system clock may be external to the memory controller 805. For example, the memory controller 805 may transmit the first signal during a rising edge of the system clock, a falling edge of the system clock, or both.

By way of example, the memory controller 805 may identify control data to be communicated to the first memory die 810. Upon identifying the control data, the memory controller 805 may select a PAM modulation scheme to encode the control data in a multi-symbol signal and may select the first signal path 720 (as described with reference to FIG. 7) to communicate the multi-symbol signal encoded with the control data. The selection of signal path 720 may be based at least in part of the determination of the PAM modulation scheme. In some examples, choosing a different signal path (e.g., third signal path 730) may be based at least in part on choosing a different modulation scheme (e.g., a NRZ modulation scheme). In either example, the memory controller 805 may communicate a first signal modulated using the PAM modulation scheme to the first memory die 810 using the first signal path (e.g., signal path 720).

In another example, the memory controller 805 may identify second data at block 840. Second data may include, for example, metadata or control data and may be provided to the memory controller 805 via a host (not illustrated). In other examples, the second data may include storage data that may be associated with first memory die 810 or second memory die 815. In some examples, the second data may be a same data type as the identified first data, and in other examples the second data may be a different data type (e.g., metadata) as the identified first data. Upon identifying the second data, the memory controller 805 may determine a modulation scheme for the data at block 845. As described above, the second data may be modulated using a multi-symbol modulation scheme (e.g., PAM4) or a binary-symbol modulation scheme (e.g., NRZ) modulation scheme.

At block 850, the memory controller 805 may select a signal path for communicating the second data. The signal path may be, for example, one of first signal path 720, second signal path 725, third signal path 730, or fourth signal path 735 as described with reference to FIG. 7. Also described above, the signal path may be a conductor in a TSV. In some examples, the signal path may be a same type of signal path as used to communicate the first signal, and in other examples the signal path may be a different type of signal path as used to communicate the first signal.

Once a signal path has been selected, at block 850, the memory controller 805 may communicate the second signal modulated using the modulation scheme to the first memory die 810 using the decided-upon signal path. This may occur through transmission 855. In communicating the second signal, the memory controller 805 may communicate the first signal based on a timing of a system clock. For example, the memory controller 805 may transmit the second signal during a rising edge of the system clock, a falling edge of the system clock, or both. In further examples, the memory controller 805 may transmit the first signal and the second signal simultaneously. For example, at least a portion of the first signal may be transmitted to the first memory die 810 at a same time as at least a portion of the second signal may be transmitted to the second memory die 815. The signals may be transmitted such that a portion, or the entirety, of each signal is communicated in at a same time—for example, during a rising edge of the system clock of the memory controller 805

By way of example, the memory controller 805 may identify second control data to be communicated to the first memory die 810. Upon identifying the second control data, the memory controller 805 may determine a NRZ modulation scheme for the second control data and may select, for example, second signal path 725 (as described with reference to FIG. 7) to communicate the control data. The selection of signal path 725 may be based at least in part of the determination of the NRZ modulation scheme. Thus the memory controller 805 may communicate a second signal modulated using the NRZ modulation scheme to the first memory die 810 using the second signal path (e.g., signal path 720).

In an additional example, through transmission 860, the memory controller 805 may communicate the first signal to the second memory die 815. The second memory die 815 may, for example, include one or more memory cells that may be referred to as a plurality of memory cells. In some examples, the plurality of memory cells of the second memory die 815 may include a different type of memory cell than the first memory die 810.

By way of the example, above, the first data may include control data and may be modulated using a multi-symbol modulation scheme. The first data may be communicated to the second memory die 815, for example, through a third signal path (e.g., signal path 730 as described with reference to FIG. 7). However, in other examples, the first data may include a different type of data and/or be modulated using a NRZ modulation scheme. In either instance, the modulation scheme may be based at least in part on a data type of the first data (e.g., control data). The first data may then be communicated to the second memory die 815, for example, through a different signal path (e.g., the fourth signal path 735 as described with reference to FIG. 7).

Additionally or alternatively, for example, through transmission 865, the memory controller 805 may communicate the second signal to the second memory die 815. By way of the example, above, the second data may include metadata and may be modulated using a NRZ modulation scheme. The second data may be communicated to the second memory die 815, for example, through a fourth signal path (e.g., signal path 735 as described with reference to FIG. 1). However, in other examples, the second data may include a different type of data and/or be modulated using a PAM modulation scheme. In either instance, the modulation scheme may be based at least in part on a data type of the first data or the second data (e.g., control data). The second data may then be communicated to the second memory die 815, for example, through a different signal path (e.g., the third signal path 730 as described with reference to FIG. 1).

FIGS. 9-13 illustrate a memory device configured to support both multi-symbol signaling and binary-symbol signaling and that may utilize various signaling modes to adjust a data transfer rate or reduce an output pin count (e.g., lower the number of output pins active in the signaling scheme). In some cases, the memory device may include a memory array coupled with a buffer, where the buffer is coupled to a multiplexer configured to output a group of bits comprising more than one bits, such as a bit pair. Additionally, the multiplexer may be coupled to a driver, where the driver maybe configured to generate a symbol representative of the group of bits. The symbol may be representative of an integer number of bits (e.g., a PAM4 symbol representative of two bits) or a non-integer number of bits (e.g., a PAM3 symbol representative of more than one but less than two bits). The symbol representative of the group of bits may be output on an output pin of the memory device. The features and/or functions described with reference to FIGS. 9-13 may be combined with the features and/or functions of other aspects of a memory device as described with reference to FIGS. 1-8 and FIGS. 14-22.

Figure 9:
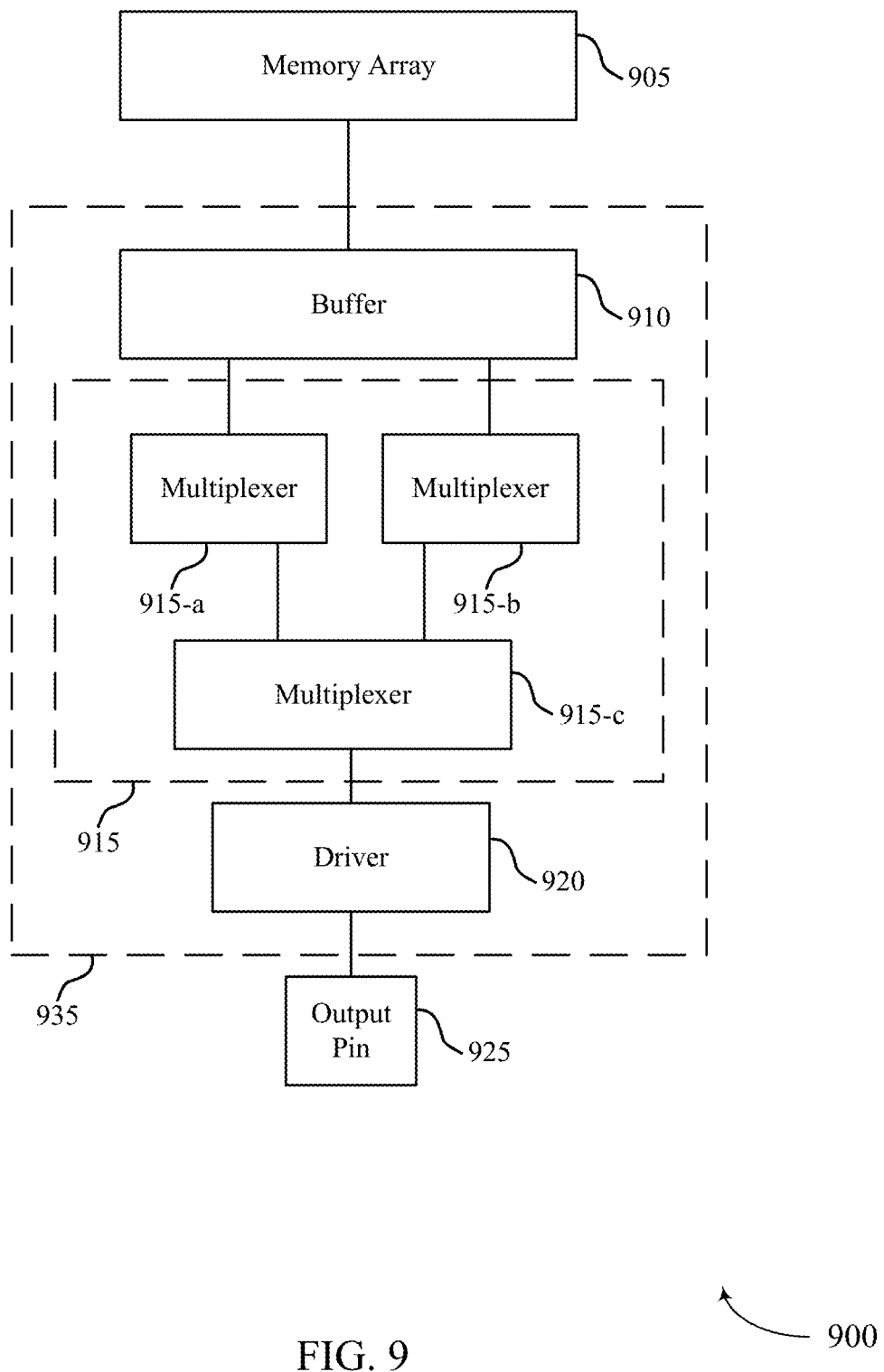
FIG. 9 illustrates an example of a circuit that supports multiplexing distinct signals on a single pin in accordance with examples of the present disclosure.

FIG. 9 illustrates an example circuit 900 in accordance with various examples of the present disclosure. Circuit 900 may include memory array 905, output circuit 935, and output pin 925. Output circuit 935 may include buffer 910, multiplexer 915, and driver 920.

Memory array 905 may store data and may comprise a plurality of memory cells, which may be volatile memory cells, non-volatile memory cells, or a combination thereof. The memory array 905 may include one or more memory dies (e.g., memory dies 105 described with reference to FIG. 1). In some examples, memory array 905 may be coupled with output circuit 935, and may directly or indirectly be coupled with buffer 910 within output circuit 935. For example, memory array 905 may be coupled with a data bus with which buffer 910 is also coupled. The data bus may be a serial or parallel data bus. Other components not shown in circuit 900 may also be coupled to the data bus, such as one or more memory controllers, memory sensing components, row or column decoders, clock signals, or other output circuits.

Data stored in memory array 905 may be sensed or read by one or more memory sensing components, and buffer 910 may store bits reflective of data stored in memory array 905 for some length of time before supplying such bits to multiplexer 915. Buffer 910 may include of a number of logically or physically distinct portions—e.g., one or more logically or physically distinct buffers may be included within buffer 910. For example, buffer 910 may include at least a first buffer and a second buffer. Buffers included in buffer 910 may be examples of first-in first-out (FIFO) buffers.

Buffer 910 may supply multiple bits to multiplexer 915 at once, e.g., via a parallel interface. For example, buffer 910 may in some examples supply eight bits to multiplexer 915 in parallel. Further, buffer 910 may supply bits to multiplexer 915 intermittently. For example, buffer 910 may supply a group of bits to multiplexer 915 and wait a number of clock cycles before supplying a subsequent group of bits to multiplexer 915, and the number of clock cycles between groups of bits may be based at least in part on a number clock cycles required by multiplexer 915 to process or at least partially process a preceding group of bits.

Multiplexer 915, which may in some cases also be referred to as a serializer, may receive groups of bits from buffer 910, such as a bits output by buffer 910 in parallel, and may output the received bits serially. Thus, multiplexer 915 may act as a parallel to serial converter—e.g., multiplexer 915 may receive parallel bits from buffer 910 and output corresponding serial bits.

In some cases, multiplexer 915 may include a number of logically or physically distinct portions—e.g., one or more logically of physically distinct multiplexers may be included within multiplexer 915. Portions of multiplexer 915 may be arranged in parallel with one another, in series with one another, or in some other cascaded fashion (e.g., as multiple stages of multiplexing). For example, as shown in circuit 900, multiplexer 915 may include first multiplexer 915-a, second multiplexer 915-b, and third multiplexer 915-c. Multiplexer 915-a may be an example of a first multiplexer that may be configured to process bits output by a first buffer of buffer 910.

Multiplexer 915-b may be an example of a second multiplexer that may be configured to process bits output by a second buffer of buffer 910. In some examples, first multiplexer 915-a and second multiplexer 915-b may both serialize a same number of bits. For example, first multiplexer 915-a and second multiplexer 915-b may both be four-to-one multiplexers (e.g., may both receive four bits via four parallel inputs and may output those four bits in series via a single serial output) and thus collectively comprise an eight-to-two multiplexer. Third multiplexer 915-*c* may be a two-to-one multiplexer that serializes the respective outputs of first multiplexer 915-*a* and second multiplexer 915-*b* such that first multiplexer 915-*a*, second multiplexer 915-*b*, and third multiplexer 915-*c* collectively act as an eight-to-one multiplexer. For example, multiplexer 915-*c* may receive one bit of information from multiplexer 915-*a* and one bit of information from multiplexer 915-*b*, each via a different parallel input, output those two bits in series via a single serial output. In some cases, buffer 910 may supply bits to multiplexer 915 then wait a predetermined number of clock cycles before supplying additional bits to multiplexer 915.

In some examples, multiplexer 915 may be coupled with driver 920. Driver 920 may also be coupled with output pin 925. Driver 920 may be configured to receive bits from multiplexer 915, generate a symbol representative of each bit received from multiplexer 915, and supply such symbols to output pin 925. For example, driver 920 may be a two-level signal driver and may generate a symbol for each bit output by multiplexer 915 and supply the symbols to output pin 925. In some cases, the two-level signal driver encodes the data using a non-return-to-zero (NRZ) modulation scheme, unipolar encoding modulation scheme, bipolar encoding modulation scheme, Manchester encoding modulation scheme, PAM2 modulation scheme, and/or others.

In some cases, memory array 905 may be coupled to a plurality of circuits 900. For example, memory array 905 may be coupled to eight circuits 900, and, collectively, those eight circuits 900 may be configured to output eight two-level signal symbols (collectively representing eight bits of information stored within memory array 905) at each rising edge of a clock signal, each falling edge of a clock signal, or each rising and falling edge of a clock signal. These may be examples of an ×8 (or byte mode) two-level signal mode of operation. As another example, memory array 905 may be coupled to sixteen circuits 900, and, collectively, those sixteen circuits 900 may be configured to output sixteen two-level signal symbols (collectively representing sixteen bits of information stored within memory array 905) at each rising edge of a clock signal, each falling edge of a clock signal, or each rising and falling edge of a clock signal. These may be examples of a ×16 two-level signal mode of operation. One of ordinary skill will appreciate that other numbers of circuits 900 may be utilized in a two-level signal mode of operation.

Figure 10:
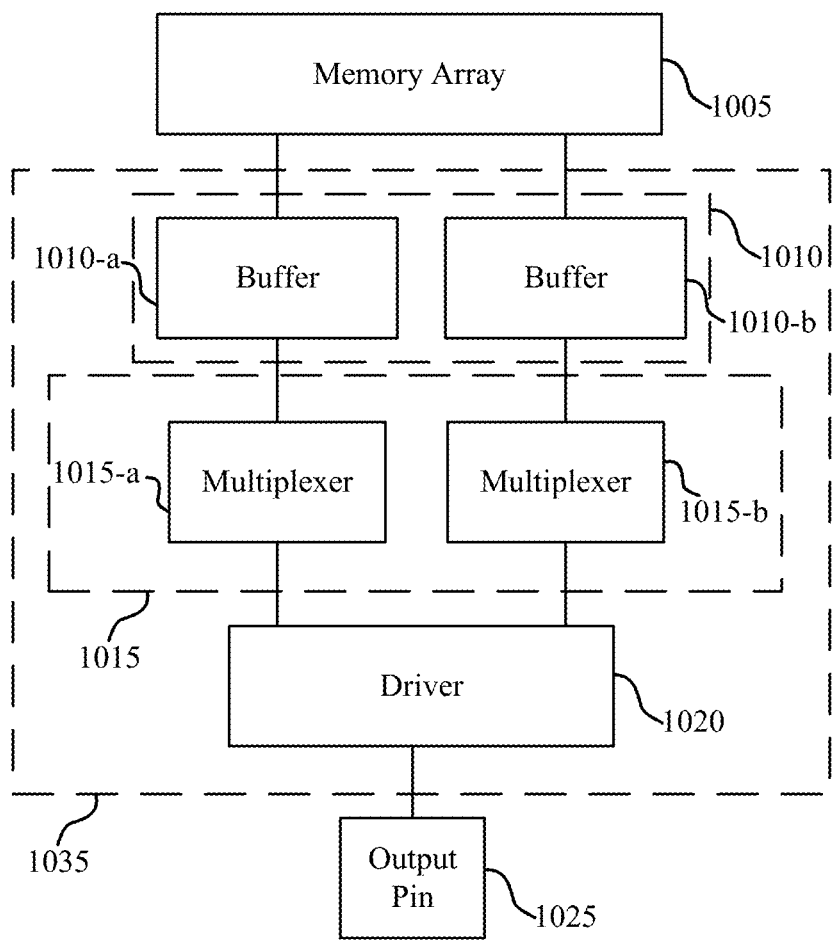
FIG. 10 illustrates an example of a circuit that supports multiplexing distinct signals on a single pin in accordance with examples of the present disclosure.

FIG. 10 illustrates an example circuit 1000 in accordance with various examples of the present disclosure. Circuit 1000 may include memory array 1005, output circuit 1035, and output pin 1025. Output circuit 1035 may include buffer 1010, multiplexer 1015, and driver 1020.

Memory array 1005 may store data and may comprise a plurality of memory cells, which may be volatile memory cells, non-volatile memory cells, or a combination thereof. In some examples, memory array 1005 may be coupled with output circuit 1035, and may directly or indirectly be coupled with buffer 1010 within output circuit 1035. For example, memory array 1005 may be coupled with a data bus with which buffer 1010 is also coupled. The data bus may be a serial or parallel data bus. Other components not shown in circuit 1000 may also be coupled to the data bus, such as one or more memory controllers, memory sensing components, row or column decoders, clock signals, or other output circuits.

Data stored in memory array 1005 may be sensed or read by one or more memory sensing components, and buffer 1010 may store bits reflective of data stored in memory array 1005 for some length of time before supplying such bits to multiplexer 1015. Buffer 1010 may include a number of logically or physically distinct portions—e.g., one or more logically or physically distinct buffers may be included within buffer 1010. For example, buffer 1010 may include at least first buffer 1010-*a* and second buffer 1010-*b*.

Buffer 1010-*a* and buffer 1010-*b* may be examples of FIFO buffers. First buffer 1010-*a* may process bits corresponding to data stored in a first portion of memory array 1005, and second buffer 1010-*b* may process bits corresponding to data stored in a second portion of memory array 1005. In some cases, the first portion of memory array 1005 may be closer to buffer 1010 than the second portion of memory array 1005. Buffer 1010 may supply multiple bits to multiplexer 1015 at once, e.g., via a parallel interface. In some cases, first buffer 1010-*a* and second buffer 1010-*b* may process bits corresponding to data stored in a same portion of memory array 1005, including data stored in a same memory cell within memory array 1005 (e.g., the memory cell may be a memory cell that supports the storage of a non-binary symbol, such as a quad-level NAND memory cell programmable to one of four logic states, and first buffer 1010-*a* may process a first bit and second buffer 1010-*b* may process a second bit, the first bit and the second bit collectively representative of the data stored by the memory cell).

For example, buffer 1010 may in some examples supply eight bits to multiplexer 1015 in parallel. Further, buffer 1010 may supply bits to multiplexer 1015 intermittently. For example, buffer 1010 may supply a group of bits to multiplexer 1015 and wait a number of clock cycles before supplying a subsequent group of bits to multiplexer 1015, and the number of clock cycles between groups of bits may be based at least in part on a number of clock cycles required by multiplexer 1015 to process or at least partially process a preceding group of bits.

Multiplexer 1015 may receive groups of bits from buffer 1010, such as a bits output by buffer 1010 in parallel, via some number of parallel inputs and may output the received bits via a different number of parallel outputs. In some cases, multiplexer 1015 may output bits via a lesser number of parallel outputs than the number of parallel inputs via which multiplexer 1015 received the bits from buffer 1010. For example, multiplexer 1015 may receive eight bits in parallel from buffer 1010 and output those bits via two parallel outputs—e.g., as bit pairs. The bit pair may be representative of data stored within memory array 1005. Thus, multiplexer 1015 may act as a partial parallel to serial converter or partial serializer.

In some cases, multiplexer 1015 may include a number of logically or physically distinct portions—e.g., one or more logically or physically distinct multiplexers may be included within multiplexer 1015. Portions of multiplexer 1015 may be arranged in parallel with one another, in series with one another, or in some other cascaded fashion (e.g., as multiple stages of multiplexing). For example, as shown in circuit 1000, multiplexer 1015 may include first multiplexer 1015-*a* and second multiplexer 1015-*b*.

First multiplexer 1015-*a* may be an example of a multiplexer that may be configured to process bits output by first buffer 1010-*a*. Second multiplexer 1015-*b* may be an example of a multiplexer that may be configured to process bits output by second buffer 1010-*b*. First multiplexer 1015-*a* may output to driver 1020 a first bit of a bit group (e.g., a bit pair), and second multiplexer 1015-*b* may output to driver 1020 a second bit of the bit group (e.g., a bit pair). First multiplexer 1015-*a* may process the first bit of the bit pair output from first buffer 1010-*a* while second multiplexer 1015-*b* may process the second bit of the bit pair output from second buffer 1010-*b*.

In some examples, the first bit of the bit pair may be representative of data stored within a first portion of memory array 1005. The second bit of the bit pair may be representative of data stored within a second portion of memory array 1005 that is different from the first portion of memory array 1005. In some cases, the first portion of memory array 1005 may be closer to buffer 1010 than the second portion of memory array 1005. Buffer 1010 may supply multiple bits to multiplexer 1015 at once, e.g., via a parallel interface.

In some cases, the first bit of the bit pair and the second bit of the bit pair may be representative of data stored in a same portion or memory array 1005, including data stored in a same memory cell within memory array 1005 (e.g., the memory cell may be a memory cell that supports the storage of a non-binary symbol, such as a quad-level NAND memory cell programmable to one of four logic states, and first buffer 1010-*a* may process a first bit and second buffer 1010-*b* may process a second bit, the first bit and the second bit collectively representative of the data stored by the memory cell).

In some examples, first multiplexer 1015-*a* and second multiplexer 1015-*b* may each be an example of a four-to-one multiplexer, and first multiplexer 1015-*a* and second multiplexer 1015-*b* may thus collectively comprise an eight-to-two multiplexer. One of ordinary skill will appreciate that multiplexer 1015 may be configured to output groups comprising more than two bits (e.g., via more than two parallel outputs).

In some examples, multiplexer 1015 may be coupled with driver 1020. Driver 1020 may also be coupled with output pin 1025. Driver 1020 may be configured to receive groups of bits (e.g., bit pairs) from multiplexer 1015, generate a symbol representative of each group of bits received from multiplexer 1015, and supply such symbols to output pin 1025. For example, driver 1020 may receive one bit of a bit pair from multiplexer 1015-*a* and another bit of the bit pair from multiplexer 1015-*b*, generate a symbol representative of the bit pair, and supply the symbol representative of the bit pair to output pin 1025.

In some cases, driver 1020 may be a pulse amplitude modulation (PAM) driver, and the symbol representative of the bit pair to may be a multi-symbol signal (e.g., PAM4) symbol. In other cases, driver 1020 may receive groups of bits from multiplexer 1015 comprising more than two bits (e.g., three bits, four bits, five bits, six bits, seven bits, eight bits), and driver 1020 may generate symbols each representative of more than two bits. For example, driver 1020 may receive groups of three bits from multiplexer 1015 and generate a multi-symbol signal symbol (e.g., PAM8 symbol) representing each bit group.

In some cases, memory array 1005 may be coupled to a plurality of circuits 1000. For example, memory array 1005 may be coupled to a number of circuits 1000 (in some cases eight circuits), and, collectively, that number of circuits 1000 may be configured to output a similar number of multi-symbol signal symbols at each rising edge of a clock signal, each falling edge of a clock signal, or each rising and falling edge of a clock signal. For example, each circuit 1000 may output a symbol of a multi-level modulation scheme, where the symbol represents two bits of data. If there are eight circuits 1000, collectively the eight symbols will represent sixteen bits of data stored with memory array 1005.

These may be examples of a ×8 multi-symbol signal mode of operation. As another example, memory array 1005 may be coupled to sixteen circuits 1000, and, collectively, those sixteen circuits may be configured to output sixteen multi-symbol signal symbols (e.g., sixteen PAM4 symbols collectively representing 32 bits of information stored within memory array 1005) at each rising edge of a clock signal, each falling edge of a clock signal, or each rising and falling edge of a clock signal. These may be examples of a ×16 multi-symbol signal mode of operation. One of ordinary skill will appreciate that other numbers of additional circuits 1000 may be utilized in a multi-symbol signal mode of operation.

In some examples, circuit 1000 may be operated at the same symbol rate (which may also be known as baud rate) as circuit 900 while providing double the output data rate of circuit 900. In some examples, circuit 1000 may be operated at half the symbol rate which may also be known as baud rate) as circuit 900 while providing the same per-pin output data rate (which may also be known as per-pin bandwidth) as circuit 900. Thus, circuit 1000 may beneficially provide the same per-pin data rate as circuit 900 while allowing a decrease in symbol rate (e.g., while allowing a decrease in a clock rate upon which the symbol rate may depend), which may improve the reliability, robustness, or power consumption of circuit 1000 and systems or circuits coupled therewith.

In some examples, circuit 1000 may be obtained by deactivating or bypassing the third multiplexer 915-*c* from circuit 900. Driver 1020 include both a multi-symbol signal driver and a binary-symbol signal driver and may be configured to generate a multi-symbol signal symbol for each group of bits received from multiplexer 1015 and a binary-symbol signal symbol for each bit received from multiplexer 1015.

Figure 11:
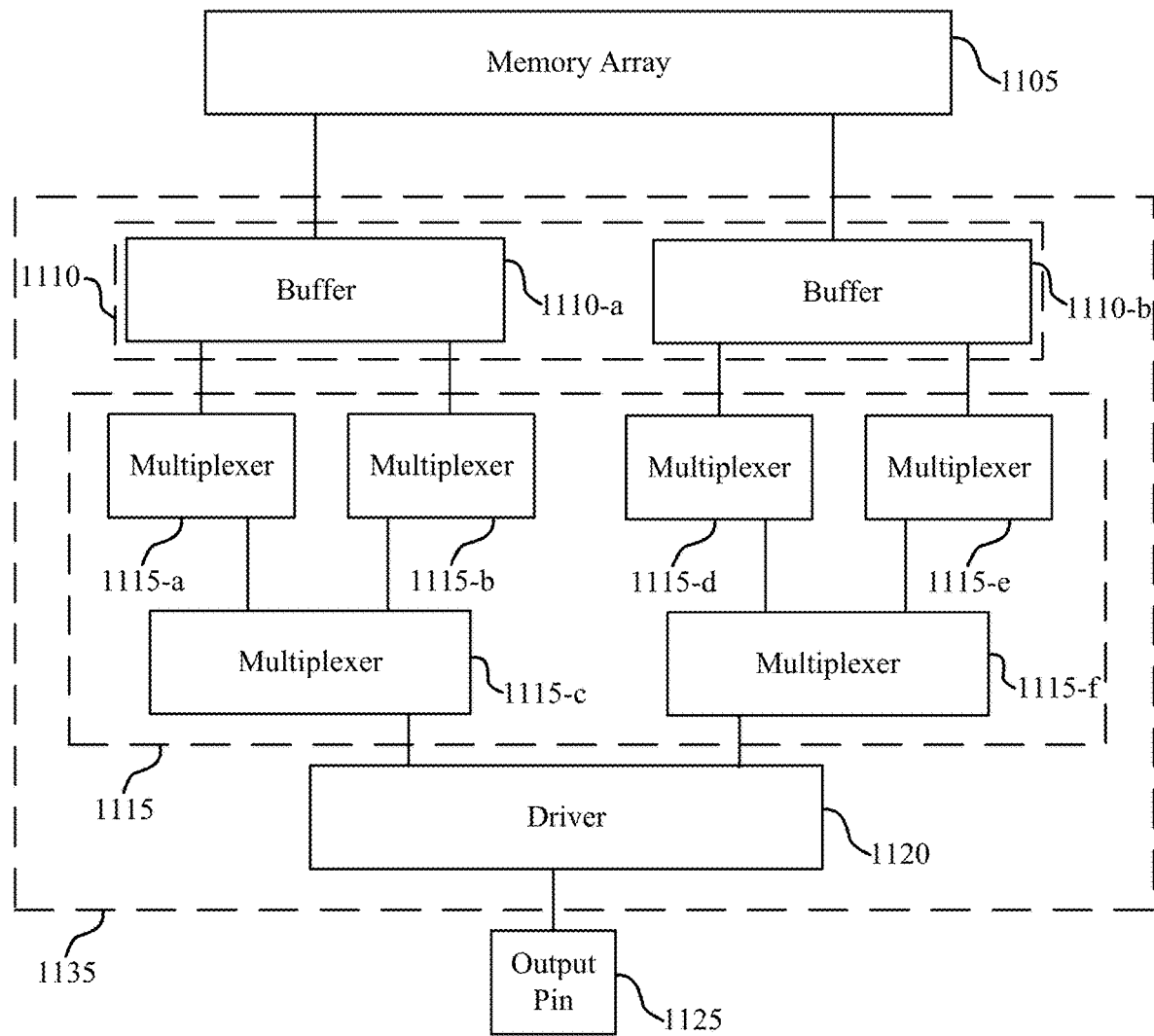
FIG. 11 illustrates an example of a circuit that supports multiplexing distinct signals on a single pin in accordance with examples of the present disclosure.

FIG. 11 illustrates example circuit 1100 in accordance with various examples of the present disclosure. Circuit 1100 may include memory array 1105, output circuit 1135, and output pin 1125. Output circuit 1135 may include buffer 1110, multiplexer 1115, and driver 1120. Circuit 1100 may illustrate one or more aspects of circuit 900 or circuit 1000.

Memory array 1105 may store data and may comprise a plurality of memory cells, which may be volatile memory cells, non-volatile memory cells, or a combination thereof. In some examples, memory array 1105 may be coupled with output circuit 1135, and may directly or indirectly be coupled with buffer 1110 within output circuit 1135. For example, memory array 1105 may be coupled with a data bus with which buffer 1110 is also coupled. The data bus may be a serial or parallel data bus. Other components not shown in circuit 1100 may also be coupled to the data bus, such as one or more memory controllers, memory sensing components, row or column decoders, clock signals, or other output circuits.

Data stored in memory array 1105 may be sensed or read by one or more memory sensing components, and buffer 1110 may store bits reflective of data stored in memory array 1105 for some length of time before supplying such bits to multiplexer 1115. Buffer 1110 may include a number of logically or physically portions—e.g., one or more logically or physically distinct buffers may be included within buffer 1110.

For example, buffer 1110 may include at least first buffer 1110-*a* and second buffer 1110-*b*. Buffer 1110-*a* and buffer 1110-*b* may examples of FIFO buffers. First buffer 1110-*a* may process bits corresponding to data stored in a first portion of memory array 1105, and second buffer 1110-*b* may process bits corresponding to data stored in a second portion of memory array 1105. In some cases, the first portion of memory array 1105 may be closer to buffer 1110 than the second portion of memory array 1105. In some cases, first buffer 1110-*a* and second buffer 1110-*b* may process bits corresponding to data stored in a same portion of memory array 1105, including data stored in a same memory cell within memory array 1105 (e.g., the memory cell may be a memory cell that supports the storage of a non-binary symbol, such as a quad-level NAND memory cell programmable to one of four logic states, and first buffer 1110-*a* may process a first bit and second buffer 1110-*b* may process a second bit, the first bit and the second bit collectively representative of the data stored by the memory cell).

Buffer 1110 may supply multiple bits to multiplexer 1115 at once, e.g., via a parallel interface. Further, buffer 1110 may supply bits to multiplexer 1115 intermittently. For example, buffer 1110 may supply a group of bits to multiplexer 1115 and wait a number of clock cycles before supplying a subsequent group of bits to multiplexer 1115, and the number of clock cycles between groups of bits may be based at least in part on a number of clock cycles required by multiplexer 1115 to process or at least partially process a preceding group of bits.

Multiplexer 1115 may receive groups of bits from buffer 1110, such as a bits output by buffer 1110 in parallel, via some number of parallel inputs and may output the received bits via a different number of parallel outputs. In some cases, multiplexer 1115 may output bits via a lesser number of parallel outputs than the number of parallel inputs via which multiplexer 1115 received the bits from buffer 1110. For example, multiplexer 1115 may receive sixteen bits in parallel from buffer 1110 and output those bits via two parallel outputs—e.g., as bit pairs. The bit pair may be representative of data stored within memory array 1105. Thus, multiplexer 1115 may act as a partial parallel to serial converter or partial serializer.

In some cases, multiplexer 1115 may include a number of logically or physically distinct portions—e.g., one or more logically or physically distinct multiplexers may be included within multiplexer 1115. Portions of multiplexer 1115 may be arranged in parallel with one another, in series with one another, or in some other cascaded fashion (e.g., as multiple stages of multiplexing). For example, as shown in circuit 1100, multiplexer 1115 may include first multiplexer 1115-*a*, second multiplexer 1115-*b*, third multiplexer 1115-*c*, fourth multiplexer 1115-*d*, fifth multiplexer 1115-*e*, and sixth multiplexer 1115-*f*.

Multiplexer 1115-*a* may be an example of a first multiplexer that may be configured to process bits output by first buffer 1110-*a* of buffer 1110. Multiplexer 1115-*b* may be an example of a second multiplexer that may be configured to process additional bits output by first buffer 1110-*a* of buffer 1110. In some examples, first multiplexer 1115-*a* and second multiplexer 1115-*b* may both serialize a same number of bits. For example, first multiplexer 1115-*a* and second multiplexer 1115-*b* may both be four-to-one multiplexers (e.g., may both receive four bits via four parallel inputs and may output those four bits in series via a single serial output) and thus collectively comprise an eight-to-two multiplexer. Third multiplexer 1115-*c* may be a two-to-one multiplexer such that first multiplexer 1115-*a*, second multiplexer 1115-*b*, and third multiplexer 1115-*c* collectively act as an eight-to-one multiplexer. For example, third multiplexer 1115-*c* may receive one bit of information from first multiplexer 1115-*a* and one bit of information from second multiplexer 1115-*b*, each via a different parallel input, output those two bits in series via a single serial output.

In some examples, multiplexer 1115 may additionally include fourth multiplexer 1115-*d*, fifth multiplexer 1115-*e*, and sixth multiplexer 1115-*f*. Multiplexer 1115-*d* may be an example of a first multiplexer that may be configured to process bits output by second buffer 1110-*b* of buffer 1110. Multiplexer 1115-*e* may be an example of a second multiplexer that may be configured to process bits output by second buffer 1110-*b* of buffer 1110. In some examples, fourth multiplexer 1115-*d* and fifth multiplexer 1115-*e* may both serialize a same number of bits.

For example, fourth multiplexer 1115-*d* and fifth multiplexer 1115-*e* may both be four-to-one multiplexers (e.g., may both receive four bits via four parallel inputs and may output those four bits in series via a single serial output) and thus collectively comprise an eight-to-two multiplexer. Sixth multiplexer 1115-*f* may be a two-to-one multiplexer such that fourth multiplexer 1115-*d*, fifth multiplexer 1115-*e*, and sixth multiplexer 1115-*f* collectively act as an eight-to-one multiplexer. For example, sixth multiplexer 1115-*f* may receive one bit of information from fourth multiplexer 1115-*d* and one bit of information from fifth multiplexer 1115-*e*, each via a different parallel input, output those two bits in series via a single serial output.

Thus, multiplexer 1115 may act as a sixteen-to-two multiplexer comprising two eight-to-one multiplexers arranged in parallel, with each eight-to-one multiplexer processing bits from a different portion of buffer 1110. One of ordinary skill in the art will appreciate that multiplexer 1115 may be configured to output groups comprising more than two bits (e.g., via more than two parallel outputs).

In some examples, multiplexer 1115 may be coupled with driver 1120. Driver 1120 may also be coupled with output pin 1125. Driver 1120 may be configured to receive groups of bits—e.g., bit pairs—from multiplexer 1115, generate a symbol representative of each group of bits received from multiplexer 1115, and supply such symbols to output pin 1125. For example, driver 1120 may receive one bit of a bit pair from third multiplexer 1115-*c* and another bit of the bit pair from sixth multiplexer 1115-*f*, generate a symbol representative of the bit pair, and supply the symbol representative of the bit pair to output pin 1125.

In some cases, driver 1120 may be a multi-symbol signal driver, and the symbol representative of the bit pair to may be a multi-symbol signal symbol. In other cases, driver 1120 may receive groups of bits from multiplexer 1115 comprising more than two bits, and driver 1120 may generate symbols each representative of more than two bits. For example, driver 1120 may receive groups of three bits from multiplexer 1115 and generate a multi-symbol signal symbol (e.g., PAM8 symbol) representing each bit group.

In some cases, memory array 1105 may be coupled to a plurality of circuits 1100. For example, memory array 1105 may be coupled to eight circuits 1100, and, collectively, those eight circuits may be configured to output eight multi-symbol signal symbols (e.g., eight PAM4 symbols collectively representing sixteen bits of information stored within memory array 1105) at each rising edge of a clock signal, each falling edge of a clock signal, or each rising and falling edge of a clock signal. These may be additional examples of an ×8 multi-symbol signal mode of operation.

As another example, memory array 1105 may be coupled to sixteen circuits 1100, and, collectively, those sixteen circuits may be configured to output sixteen multi-symbol signal symbols (e.g., sixteen PAM4 symbols collectively representing 32 bits of information stored within memory array 1105) at each rising edge of a clock signal, each falling edge of a clock signal, or each rising and falling edge of a clock signal. These may be additional examples of a ×16 multi-symbol signal mode of operation. One of ordinary skill will appreciate that other numbers of additional circuits 1100 may be utilized in a multi-level signal mode of operation.

In some examples, circuit 1100 may be operated at the same symbol rate as circuit 900 while providing double the per-pin output data rate of circuit 900. Thus, circuit 1100 may beneficially provide an increase in the per-pin data rate at which data stored in a memory array may be output without requiring an increase in symbol rate (e.g., without requiring an increase in a clock rate upon which the symbol rate may depend).

In some examples, circuit 900 may be obtained from circuit 1100 by deactivating or bypassing either eight-to-one multiplexer within multiplexer 1115 (e.g., deactivating or bypassing the first multiplexer 1115-*a*, second multiplexer 1115-*b*, and third multiplexer 1115-*c* or fourth multiplexer 1115-*d*, fifth multiplexer 1115-*e*, and sixth multiplexer 1115-*f*). Driver 1120 include both a multi-symbol signal driver and a binary-symbol signal driver and may be configured to generate a multi-symbol signal symbol for each group of bits received from multiplexer 915 and a binary-symbol signal symbol for each bit received from multiplexer 915.

In some examples, circuit 1000 may be obtained from circuit 1100 by deactivating or bypassing either eight-to-one multiplexer within multiplexer 1115 (e.g., deactivating or bypassing the first multiplexer 1115-*a*, second multiplexer 1115-*b*, and third multiplexer 1115-*c* or fourth multiplexer 1115-*d*, fifth multiplexer 1115-*e*, and sixth multiplexer 1115-*f*) and also deactivating the remaining two-to-one multiplexer (e.g., deactivating or bypassing either third multiplexer 1115-*c* or sixth multiplexer 1115-*f*).

Figure 12:
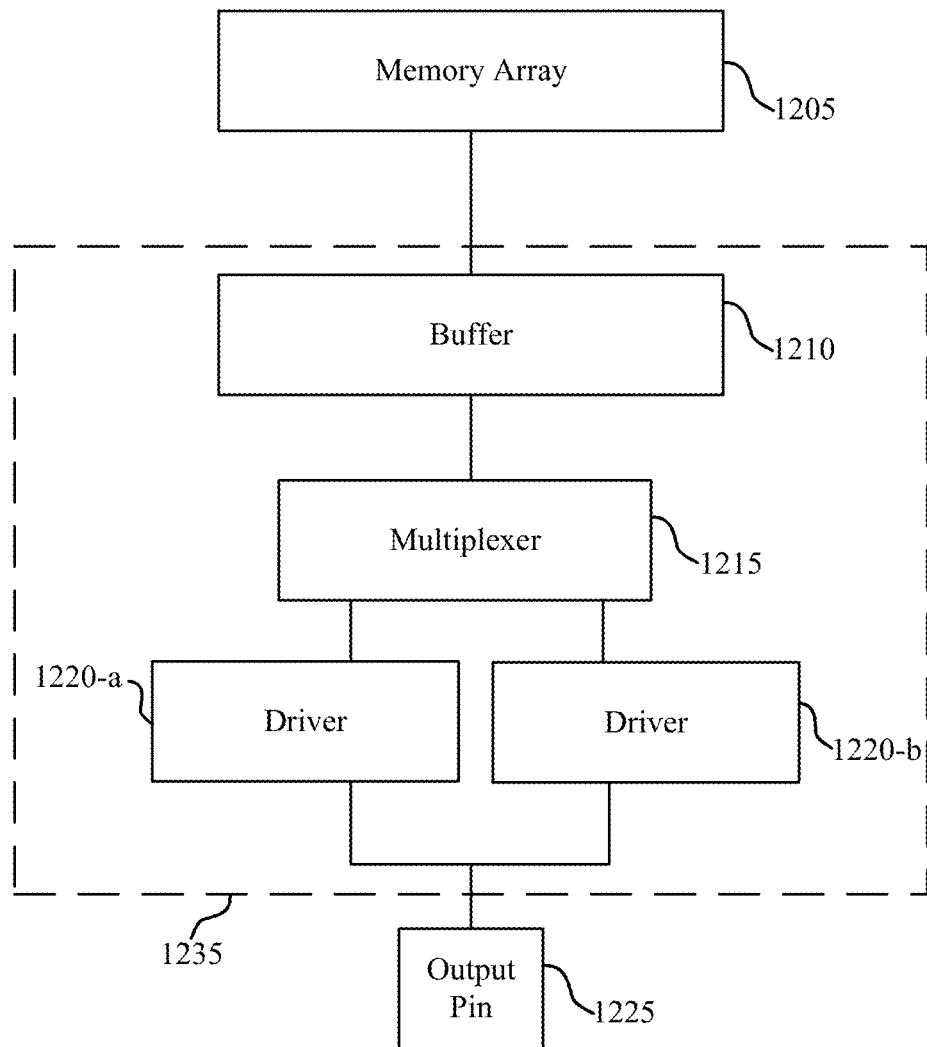
FIG. 12 illustrates an example of a circuit that supports multiplexing distinct signals on a single pin in accordance with examples of the present disclosure.

FIG. 12 illustrates an example circuit 1200 in accordance with various examples of the present disclosure. Circuit 1200 may include memory array 1205, output circuit 1235, and output pin 1225. Output circuit 1235 may include buffer 1210, multiplexer 1215, first driver 1220-*a*, and second driver 1220-*b*. Output circuit 1235 may incorporate aspects of output circuits 935, 1035, or 1135 described with reference to FIGS. 9, 10, and 11.

Memory array 1205 may store data and may comprise a plurality of memory cells, which may be volatile memory cells, non-volatile memory cells, or a combination thereof. In some examples, memory array 1205 may be coupled with output circuit 1235, and may directly or indirectly be coupled with buffer 1210 within output circuit 1235. For example, memory array 1205 may be coupled with a data bus with which buffer 1210 is also coupled. The data bus may be a serial or parallel data bus. Other components not shown in circuit 1200 may also be coupled to the data bus, such as one or more memory controllers, memory sensing components, row or column decoders, clock signals, or other output circuits.

Data stored in memory array 1205 may be sensed or read by one or more memory sensing components, and buffer 1210 may store bits reflective of data stored in memory array 1205 for some length of time before supplying bits to multiplexer 1215. Buffer 1210 may corporate aspects of buffers 910, 1010, or 1110 described with reference to FIGS. 9, 10, and 11.

Multiplexer 1215 may be an example of a multiplexer that may be configured to process bits output by buffer 1210. In some cases, multiplexer 1215 may incorporate aspects of multiplexers 915, 1015, or 1115 described with reference to FIGS. 9, 10, and 11. A memory controller may configure the multiplexer 1215 to output groups of bits (e.g., bit pairs) or single bits. In some cases, the bit pair may be representative of data stored within memory array 1205. Multiplexer 1215 may be coupled with first driver 1220-*a* and second driver 1220-*b*. In some cases, second driver 1220-*b* may be in parallel to first driver 1220-*a*. First driver 1220-*a* and second driver 1220-*b* may also be coupled with output pin 1225.

In some examples, first driver 1220-*a* may be configured to receive a bit pair from multiplexer 1215, generate a symbol representative of the bit pair received from multiplexer 1215, and supply such symbols to output pin 1225. For example, first driver 1220-*a* may be a multi-level signal driver and may generate a multi-level signal symbol for each bit pair output by multiplexer 1215 and supply those multi-level signal symbols to output pin 1225.

In some cases, second driver 1220-*b* may be configured to receive bits from multiplexer 1215, generate a symbol representative of each bit received from multiplexer 1215, and supply such symbols to output pin 1225. For example, second driver 1220-*b* may be a binary-symbol signal driver and may generate a binary-symbol signal symbol for each bit output by multiplexer 1215 and supply those binary-symbol signal symbols to output pin 1225.

In some cases, memory array 1205 may be coupled to a plurality of circuits 1200, and a memory controller may configure one or more of the plurality of circuits 1200 to implement a binary-symbol signal or multi-symbol signal (e.g., PAM4) mode of operation.

Figure 13:
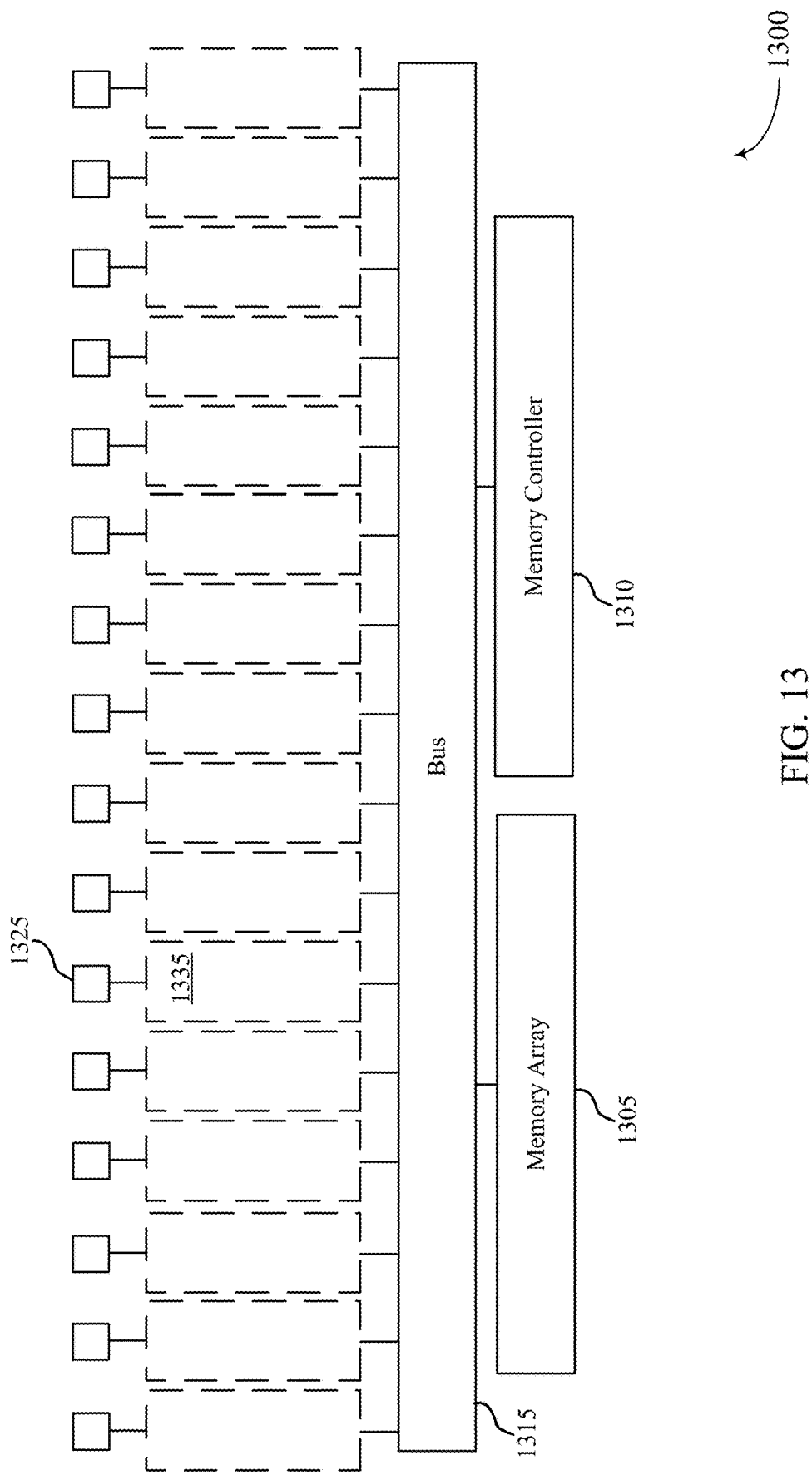
FIG. 13 illustrates an example of a circuit that supports multiplexing distinct signals on a single pin in accordance with examples of the present disclosure.

FIG. 13 illustrates an example circuit 1300 in accordance with various examples of the present disclosure. Circuit 1300 may include memory array 1305, memory controller 1310, data bus 1315, output circuit 1335, and output pin 1325. Memory array 1305 may be an example of memory array 905, 1005, 1105, and 1205 as described with reference to FIGS. 9-12. Output pin 1325 may be an example of output pin 925, 1025, 1125, and 1215 as described with reference to FIGS. 9-12. Output circuit 1335 may be an example of output circuit 935, 1035, 1135, and 1235 as described with reference to FIGS. 9-12. Circuit 1300 may include one or more aspects of circuit 900, 1000, 1100, and 1200.

Memory array 1305 may store data and may comprise a plurality of memory cells, which may be volatile memory cells, non-volatile memory cells, or a combination thereof. In some examples, memory array 1305 may be coupled with output circuit 1335. For example, memory array 1305 may be coupled with a data bus 1315 with which output circuit 1335 is also coupled. Data bus 1315 may be a serial data bus or a parallel data bus. Memory controller 1310 may also be coupled to data bus 1315. Other components not shown in circuit 1300 may also be coupled to data bus 1315, such as one or more memory sensing components, row or column decoders, clock signals, or other output circuits.

In some examples, data bus 1315 may be coupled to four, eight, sixteen, or thirty-two output circuits 1335, and, collectively, those output circuits 1335 may be configured by memory controller 1310 to each output binary-symbol signal symbols (collectively representing four, eight, sixteen, or thirty-two bits of information stored within memory array 1305). These modes of operation may be referred to respectively as ×4, ×8 (or byte mode), ×16, or ×32 binary-symbol signal modes of operation.

In some cases, data bus 1315 may be coupled to four, eight, sixteen, or thirty-two output circuits 1335, and, collectively, those circuits may be configured by memory controller 1310 to each output multi-symbol signal symbols (collectively representing eight, sixteen, thirty-two, or sixty-four bits of information stored within memory array 1305).

These modes of operation may be referred to respectively as ×4, ×8, ×16, or ×32 multi-symbol signal modes of operation.

In some examples, memory controller 1310 may detect a period of inactivity (which may be referred to as idle time) or a period of an output data rate below a threshold data rate for some duration of time greater than or equal to a threshold duration of time and then transmit a signal to switch the mode of operation. For example, memory controller 1310 may monitor a symbol rate (which may include identifying an associated clock rate) associated with one or more output pins, determine a data rate for the one or more output pins based on the symbol rate (e.g., based on how many bits each symbol represents, which may be known to memory controller 1310 based on a current signaling mode), compare the data rate to one or more threshold data rates, determine a length of time for which the data rate is above or below a threshold data rate, and adjust the signaling mode at one or more output pins between binary-symbol signals or orders of multi-symbol signals, or alternatively or additionally adjust the number of active output pins, in order to optimize output data rate, the number of active output pins, or power consumption based on observed conditions.

For example, circuit 1300 may switch from operating eight output circuits 1335 to operating sixteen output circuits 1335. That is, a signaling mode that outputs a multi-level signal symbol on some number of output pins 1325 may be disabled and a signaling mode that outputs a two-level signal symbol on the same, different, or additional output pins 1325 may be activated. In some examples, circuit 1300 may be able to operate eight output circuits 1335 or sixteen output circuits 1335 on the same die (i.e., the same piece of silicon). In some cases, circuit 1300 may act as a slave to an external master component, and the memory controller 1310 may adjust the signaling mode at one or more output pins between binary-symbol signals or orders of multi-symbol signals, or alternatively or additionally adjust the number of active output pins, in response to a command from the master component.

In some examples, memory controller 1310 may be configured to determine a first signaling mode for circuit 1300 and configure one or more output circuits 1335 to generate non-binary symbols that each represent two or more bits output by memory array 1305. For example, the first signaling mode may be an example of an ×8 multi-symbol signal mode of operation or a ×16 multi-symbol signal mode of operation. In some cases, memory controller 1310 may be configured to determine a second signaling mode for circuit 1300 and configure one or more output circuits 1335 to generate binary symbols that each represent less than two bits output by memory array 1305.

For example, the second signaling mode may be an example of an ×8 binary-symbol signal mode of operation or a ×16 binary-symbol signal mode of operation. In some cases, the first signaling mode and the second signaling mode may use a same symbol rate. In other examples, the first signaling mode and the second signaling mode may use a different symbol rate. For example, a multi-symbol signal (e.g., PAM4) mode of operation may utilize a symbol rate that is less than (e.g., half of) a symbol rate used for a binary-symbol signal mode of operation and provide the same per-pin data rate but with improved robustness, reliability, or power consumption characteristics or may utilize the same symbol rate and provide a greater (e.g., double) per-pin data rate.

In some cases, the second signaling mode may be configured to support full bandwidth in a memory device using one-half of the available I/O pins. By applying PAM4 signaling to one-half of the I/O pins of the memory device, the same bandwidth as using all of the I/O pins and NRZ signaling may be achieved. Such a configuration may increase the number of memory dies that can be connected with a channel by reducing the I/O pin count per die. In some examples, eight I/O pins may be connected and the other eight I/O pins may not be connected and therefore the mode-switching may be unavailable. The memory device may operate the connected eight I/O pins in either PAM4 or NRZ modes.

In some cases, each output circuit 1335 may include a multiplexer. For example, memory controller 1310 may configure the multiplexer of at least eight output circuits 1335 to output a first output type based during the first signaling mode. For example, the first output type may be a group of bits (e.g., a bit pair) and may correspond to a multi-symbol signal (e.g., PAM4) mode of operation. In other examples, memory controller 1310 may configure the multiplexer of at least sixteen output circuits 1335 to output a second output type during the second signaling mode.

For example, the second output type may be a bit and may correspond to a binary-symbol signal mode of operation. Memory controller 1310 may also detect a data rate associated with memory array 1305 for a duration of time and determine a mode of operation (e.g., determine whether to output binary-symbol signal symbols, multi-symbol signal symbols, or other types of symbols, determine a number of output pins 1325 via which to output symbols, or determine a symbol rate) based on the detected data rate.

For example, if the data rate is above a threshold data rate, then a first signaling mode using a higher order of symbol (e.g., a multi-symbol signal rather than a binary-symbol signal), a greater number of output pins 1325 (e.g., ×16 rather than ×8), a higher symbol rate, or a combination thereof may be determined, e.g., to support the higher data rate. As another example, if the data rate is below a threshold data rate, then a second signaling mode using a lesser order of symbol (e.g., a binary-symbol signal rather than a multi-symbol signal), a lesser number of output pins 1325 (e.g., ×8 rather than a ×16), a lower symbol rate, or a combination thereof may be determined, e.g., to support the lower data rate while conserving power or improving reliability or robustness of output signals.

FIGS. 14-19 illustrate a memory device, waveforms, and processes for dynamically selecting a modulation scheme based on one or more parameters associated with the memory device. For example, a memory device may dynamically switch between modulation schemes, and in some cases frequencies, so that an operating parameter such as bandwidth or power can be accommodated or satisfied. Since communicating at different modulation schemes and frequencies results in varying amounts of provided bandwidth and power consumption, the memory device may select a combination of modulation scheme and frequency that provides adequate bandwidth without consuming excess power. The features and/or functions described with reference to FIGS. 14-19 may be combined with the features and/or functions of other aspects of a memory device as described with reference to FIGS. 1-13 and FIGS. 20-22.

Although described with reference to a memory device, the techniques described herein can be implemented by any type of device (e.g., the techniques described herein can be implemented by a CPU or GPU that is communicating with a modem or other peripheral device). The techniques described herein can be used in wireless communications (e.g., communications involving signals sent over the air), wired communications (e.g., communications involving signals sent over a solid medium), or both. In some cases, the techniques described herein can be used in a wireline system over a substrate.

Figure 14:
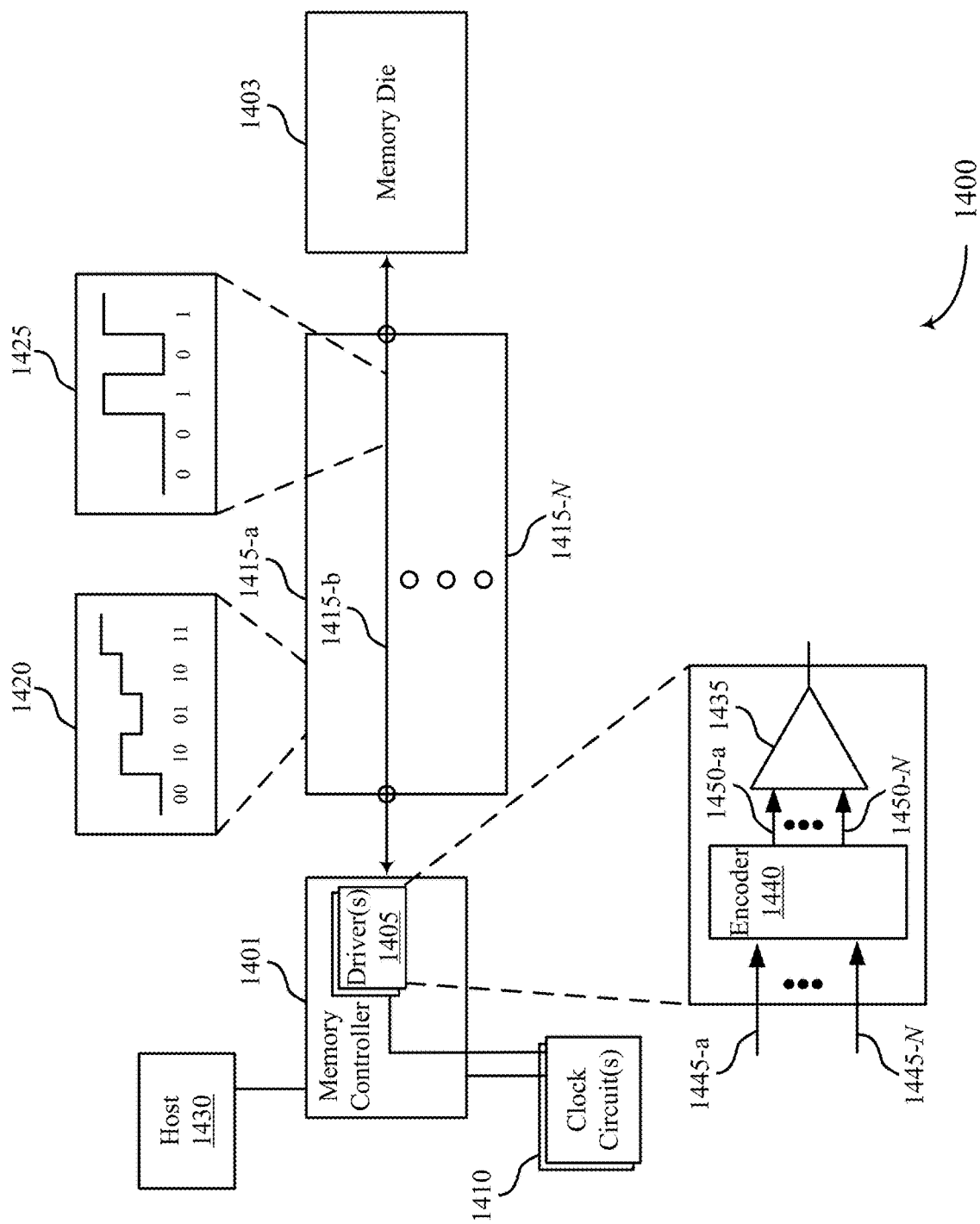
FIG. 14 illustrates an example of a circuit that supports multiplexing distinct signals on a single pin in accordance with examples of the present disclosure.

FIG. 14 illustrates an example of a circuit 1400 in accordance with various examples of the present disclosure. In some cases, the circuit 1400 may be an example of the circuit 300 described with reference to FIG. 3. As such, many features of the circuit 1400 are similar to the features of the circuit 300 and some descriptions of some features are not repeated in both figures.

The circuit 1400 may include one or more internal signal paths 1415-a through 1415-N that couple at least one memory die 1403 with a memory controller 1401. The internal signal paths 1415 may be configured to communicate multi-symbol signals 1420, or binary-symbol signals 1425, or both. The memory die 1403 may be an example of the memory dies 105, 305 described with reference to FIGS. 1 and 3. The memory controller 1401 may be an example of the memory controller 110, 310 described with reference to FIGS. 1 and 3. The signal paths 1415 may be examples of the signals paths 115, 315 described with reference to FIGS. 1 and 3. In some cases, the internal signal paths 1415 may be examples of data buses.

The memory controller 1401 may be coupled to (e.g., in electronic communication with) a host 1430, which may or may not be part of the circuit 1400. The host 1430 may be a system on a chip (SoC) or a processor (e.g., a central processing unit (CPU), a graphics processing unit (GPU). Although shown as separate components, in some cases the host 1430 and the memory controller 1401 may be the same component or may be a part of a common SoC. Although described with reference to a memory interface, the techniques described herein can be implemented for non-memory interfaces (e.g., between non-memory components within a device, or between two devices).

Memory controller 1401 may include one or more driver circuits ("drivers") 1405. The driver(s) 1405 may be in electronic communication with the signal paths 1415 (e.g. data buses) and may be configured to communicate (e.g., send or transmit) multi-level signals and/or binary level signals over the one or more signal paths 1415 (e.g. data buses). For example, the driver(s) 1405 may include circuitry that converts one or more bit streams into multi-level and/or binary-level signals. A bit stream may be a number of consecutive (e.g., serialized) bits that are representative of a set of data. In some cases, the driver(s) 1405 may include one or more drivers 1405 that have been segmented (e.g., assigned a respective different number of legs of the driver 1405 to each signal to be driven) to drive multiple (e.g., more than one) voltage levels on an internal signal path 1415.

A driver 1405 may include an encoder 1440 coupled to (e.g., in electronic communication with) a driving circuit 1435. The encoder 1440 may be configured to receive one or more bit streams 1445 and convert (e.g., encode) the bit streams 1445 into one or more control signals 1450. The driving circuit 1435 may be configured to receive the control signal(s) 1425 and drive a voltage over an internal signal path 1415 based on the control signal(s) 1425. The amplitude of the voltage may be representative of one or more bits. So a binary-level signal or multi-level signal may be output by the driving circuit 1435 by varying the amplitude of the voltage driven over an internal signal path 1415. Whether a signal is communicated as a binary level signal or a multi-level signal may be determined by the type of modulation scheme used to modulate the signal.

The type of modulation scheme used to communicate (e.g., the type of signal output by driver(s) 1405) may be controlled by the memory controller 1401 and may be based on an operating parameter associated with the memory controller 1401, the host 1430, the device of which circuit 1400 is a part, or an application on the device. Since different modulation schemes consume different amounts of power, and provide different bandwidths, the memory controller 1401 may dynamically switch between modulation schemes to tailor the consumed power and provided bandwidth to changing power constraints and bandwidth requirements (e.g., demands).

In addition to driver(s) 1405, memory controller 1401 may be in electronic communication with one or more clock circuit(s) 1410. A clock circuit 1410 may be configured to generate clock pulses that can be used as a reference for the timing of other components. For example, a clock circuit 1410 may be configured to generate a first clock signal at a first frequency and a second clock signal at a second frequency. The term frequency may refer to the inverse of the pulse duration used to represent a symbol in binary-level signaling or multi-level signaling. The first clock signal may represent a first clock rate and the second clock signal may represent a second clock rate. In some cases, the memory controller 1401 may control the output of the clock circuit(s) 1410 (e.g., the memory controller 1401 may control the frequency of the clock signals or the clock rate generated by the clock circuit(s).

The clock circuit(s) 1410 may be in electronic communication with the driver(s) 1405. For example, the driver(s) 1405, or some sampling component in electronic communication with the driver(s) 1405, may sample the clock pulses generated by the clock circuits(s) 1410. The sampled clock pulses may be used as a reference for sending multi-level and binary-level signals at frequencies determined by the memory controller 1401. For example, a driver 1405, or associated component, may reference the clock pulses output by a clock circuit 1410 to determine the frequency at which to send a binary-level or multi-level signal. Because communicating at different frequencies may consume different amounts of power and provide different bandwidths, a memory controller 1401 may dynamically select frequencies for communication to accommodate changing power constraints and bandwidth requirements. In some cases, a memory controller 1401 may dynamically select a combination of modulation scheme and frequency to accommodate changing power constraints and bandwidths requirements, or to accommodate some other operating parameter.

In one example, the memory controller 1401 may receive a first set of data in a first number of bit streams. For instance, the memory controller 1401 may receive (e.g., at encoder 1440) the first number of bit streams from a data array or user input interface in electronic communication with the memory controller 1401. According to the techniques described herein, the memory controller 1401 may generate a first signal having a first number of levels. The first signal may be a binary-level signal (e.g., a NRZ signal, such as signal 1425) or a multi-level signal (e.g., a PAM4 signal, such as signal 1420). In some cases, the first signal may be based on the first number of bit streams. For example, the first signal may represent the first set of data conveyed by the first number of bit streams. In some cases, the number of levels may be based on the first number of bit streams. For example, the first number of levels may be twice the number of bit streams. In some cases, the first number of bit streams may be different from the first number of levels.

After receiving the first set data, the memory controller 1401 may receive a second set of data in a second number of bit streams that is different from the first number of bit streams. For instance, the memory controller 1401 may receive the first number of bit streams from a data array or user input interface in electronic communication with the memory controller 1401. The first number of bit streams may be the same as, or different from, the second number of bit streams. In some cases, the first set of data is associated with a first application and the second set of data may be associated with a second application.

According to the techniques described herein, the memory controller 1401 may determine an operating parameter associated with device of which the memory controller 1401 is a part. For example, the memory controller 1401 may determine an operating parameter associated with the host 1430. An operating parameter may be a requirement, request, condition, metric, demand, or value. Determination of the operating parameter may be based on receiving the second set of data, or it may be independent of receiving the second set of data (e.g., determination of the operating parameter may occur prior to receiving the second set of data). The operating parameter may be a temperature parameter, a bandwidth parameter, a power parameter, a data rate parameter, or the like, or a combination thereof.

After determining the operating parameter, the memory controller may generate a second signal having a second number of levels different from the first number of levels. Generating the second signal may be based on the determined operating parameter and the second number of bit streams. For example, the second signal may be representative of the second set of data conveyed in the second bit stream and/or the second number of levels may be a function of the second number of bit streams (e.g., may be twice the number of bit streams). In some cases, the second number of bit streams is different from the second number of levels.

In some cases, the first signal is communicated over a channel (e.g., over an internal signal path 1415) at a first frequency (e.g., a first clock frequency, first pulse frequency, or first data rate frequency) and the second signal is communicated over the channel (or a different channel) at a second frequency (e.g., a second clock frequency, second pulse frequency, or second data rate frequency). So the modulation scheme and the frequency may be different for two separate signals. The frequencies may be based on the clock pulses output by clock circuit 1410. In other cases, the first signal is communicated over a channel (e.g., over an internal signal path 1415) at a first frequency and the second signal is communicated over the channel (or a different channel) at the first frequency (e.g., at the same frequency). So the modulation scheme may be different for two separate signals, but the frequency may be the same.

According to the techniques described herein, the memory controller 1401 may be configured to communicate a first signal to the memory die 1403. The first signal may be modulated using a first modulation scheme that has a first number of levels. The memory controller 1401 may also be configured to determine an operating parameter associated with the apparatus of which the memory controller 1401 and memory die 1403 are a part. Based on the determined operating parameter, the memory controller 1401 may select a second modulation scheme different from the first modulation scheme. After selecting the second modulation scheme, the memory controller 1401 may communicate a second signal to the memory die 1403. The second signal may be modulated using the second modulation scheme, which may have a second number of levels different from the first number of levels.

In some cases, the memory controller 1401 may be configured to communicate the first signal based on a first frequency of a first clock signal generated by the clock circuit 1410. In such cases, the memory controller 1401 may also be configured to communicate the second signal based on a second frequency of a second clock signal and based on the determined operating parameter. The second frequency is higher or lower than the first frequency.

In some cases, the operating parameter is a bandwidth parameter (e.g., a current bandwidth requirement) or a power parameter (e.g., a parameter indicative of the current power consumption or conservation requirement). When the operating parameter is a power parameter, the memory controller 1401 may determine the power parameter by detecting whether an external power source is connected to the device of which the memory controller 1401 is a part. If the first modulation scheme is NRZ and the second modulation scheme is PAM4, the second modulation scheme may be selected when an external power source connection is detected. Using PAM4 rather than NRZ may provide more bandwidth for communication. If the first modulation scheme is PAM4 and the second modulation scheme is NRZ, the second modulation scheme may be selected when no external power source connection is detected. Using NRZ rather than PAM4 may decrease power consumption (e.g., increase power conservation).

In some cases, determining the power parameter includes estimating a duration of time until an internal power source reaches a threshold value. Selection of the second modulation scheme may be based on the estimation. For instance, if the estimation indicates that the internal power supply will be exhausted within a threshold (e.g., short) period of time, the memory controller 1401 may switch from PAM4 to NRZ to conserve power. If the estimation indicates that the internal power supply will not be exhausted within a threshold period of time, the memory controller 1401 may switch from NRZ to PAM4 to provide more bandwidth for data communication.

In some examples, the operating parameter is the launch of an application on the device that includes the memory controller 1401. Some applications may define relatively low data rates for the transfer of its application data with a memory array, while other applications may define relatively high data rates. For example, a camera application may require high data rates, especially when it is in burst mode (e.g., a mode that captures multiple photos within a short period of time). A camera application may also require a relatively high data rate when, for example, it is in video mode, playback mode, 4k multi-shot mode, etc. Other applications with high data rates may include media consuming applications, virtual reality applications, augmented reality applications, artificial intelligence applications, machine learning applications, and the like.

The operating parameter may be associated with the launch of an application. For example, the newly launched application may require a data rate greater than a threshold data rate. In such an example, the operating parameter may indicate the entry of an application into a certain mode that requires a data rate higher than a threshold data rate. When the data rate requested or required by an application is greater than the threshold rate, the memory controller 1401 may select a multi-symbol modulation scheme (e.g., PAM4, PAM8, PAM16, etc.) as the second modulation scheme. When the data rate requested or required by an application is less than the threshold rate, the memory controller 1401 may select a two-level modulation scheme (e.g., NRZ) as the second modulation scheme.

In some cases, the memory controller 1401 may be configured to select a first number of memory cells in the memory die 1403 to receive a first signal modulated using a first modulation scheme to represent a first set of data. Said another way, the memory controller may be configured to modify the size of a page in the memory die 1403 based on modulation scheme being used to encode data.

In such cases, the memory controller 1401 may also be configured to select a second number of memory cells in the memory die 1403 for receiving a second signal modulated using a second modulation scheme to represent a second set of data. The second number of memory cells accessed using the second signal may be different from the first number of memory cells access using the first signal. For example, if the first signal is modulated using NRZ (e.g., the first signal is a binary-level signal) and the second signal is modulated using PAM4 (e.g., the second signal is a multi-level signal), then the memory controller 1401 may select a small number of cells (e.g., a small page size) for receiving the first signal and may select a larger number of cells (e.g., a larger page size) for receiving the second signal. In some cases, the first set of memory cells may be selected to be over-written with new data (e.g., a third set of data) modulated using the second modulation scheme. In such cases, the new data may be modulated at a different data rate than the first data rate (e.g., the second data rate and/or a third data rate may be different from the first data rate and/or the second data rate).

In some examples, the operating parameter is a temperature parameter (e.g., a temperature value of a component part of the same device as memory controller 1401). Because high temperatures can damage components or cause impair performance, the memory controller 1401 may select modulation schemes for communication that prevent or mitigate such temperatures.

For instance, the memory controller 1401 may determine the temperature parameter by detecting a temperature associated with the memory controller 1401, or a component of the same device that includes the memory controller 1401). If the memory controller 1401 detects that the temperature associated with the component (e.g., the memory controller 1401) satisfies a temperature threshold (e.g., a high temperature threshold), the memory controller 1401 may select NRZ as the second modulation scheme to reduce the temperature. If the memory controller 1401 detects that the temperature associated with the component (e.g., the memory controller 1401) does not satisfy a temperature threshold (e.g., the temperature is below the high temperature threshold), the memory controller 1401 may select PAM4 as the second modulation scheme to provide more bandwidth without the risking negative effects caused by high heat.

In some cases, the operating parameter is a measure or a value that represents the ability or capability of an external device to receive data. For example, the operating parameter may indicate that the peripheral device is limited to certain bandwidth, data rate, modulation scheme, or frequency. In such cases, the memory controller 1401 may select the second modulation scheme based on the limitations of the peripheral device. In some examples, the operating parameter is a communication metric or requirement requested by the external device. For example, the operating parameter may be a requested data rate, bandwidth, frequency, modulation scheme, voltage level, etc.

Thus, the device (e.g., a memory controller associated with a memory device) may select the second modulation scheme and/or frequency based on the external device's request for one or more communication metrics or requirements (e.g., the second modulation scheme and/or frequency may be selected to comply with or satisfy the requested communication metric or requirement). Additionally or alternatively, the operating parameter may be based on a characteristic of the data represented by the second signal. Although described with reference to a single operating parameter, a memory controller 1401 may select a combination of modulation scheme and frequency based on multiple operating factors. The operating parameter(s) used as the basis for the selection may be selected based on detection of a change in operation or condition of the device, or based on a request from another device.

According to the techniques described herein, the memory controller 1401 may be configured to communicate a first signal over the signal paths 1415 (e.g., a data bus) using a first driver 1405. The first signal may have a signal strength that corresponds to one level of a first number of levels representing a first set of data. After determining an operating parameter as described herein, the memory controller 1401 may communicate a second signal over the signal path 1415-*a* based on the determined operating parameter. The second signal may be a signal strength that corresponds to one level of a second number of levels representing a second set of data, and the second number of levels may be different from the first number of levels. In some cases, the second signal is communicated over the signal path 1415-*a* using a second driver 1405 that is in electronic communication with the memory controller 1401.

In some cases, the first signal is sent over a first data bus and the second signal is sent over a second data bus. The first signal may be communicated at a first clock rate generated by the clock circuit 1410 and the second signal may be communicated at a second clock rate generated by the clock circuit 1410. Or the signals may be sent a different clock rates that are derived from the clock rates generated by the clock circuit 1410.

Figure 15:
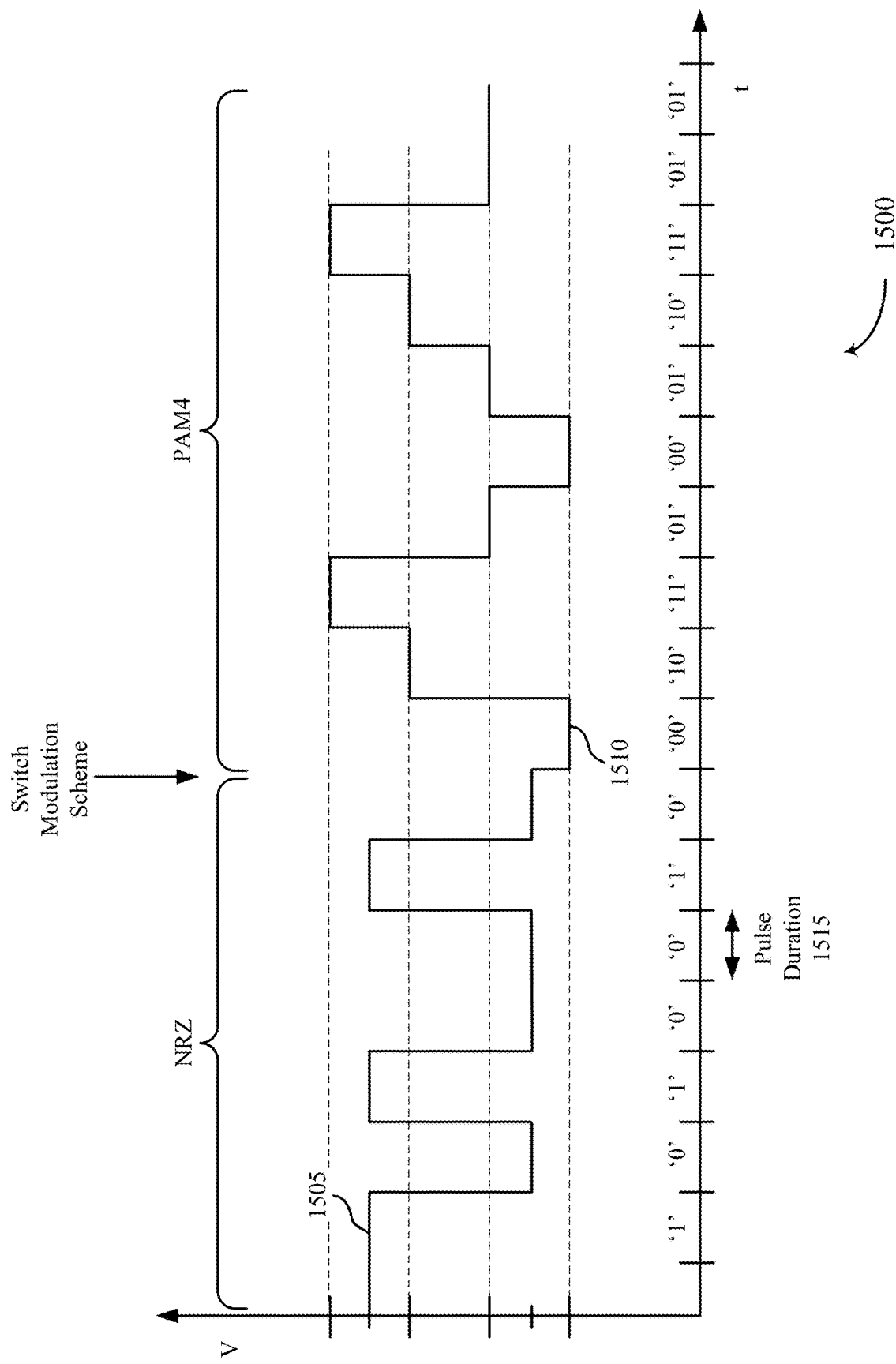
FIG. 15 illustrates an example of a diagram of a waveform that supports multiplexing distinct signals on a single pin in accordance with examples of the present disclosure.

FIG. 15 illustrates an exemplary diagram of a waveform 1500 employed in accordance with various examples of the present disclosure. The amplitude of the waveform 1500, depicted as voltage, is shown varying in time. Waveform 1500 may be communicated between two different devices or between two components internal to a device. In an example of intra-device communication (e.g., communication within a single device), waveform 1500 may be generated and communicated (e.g., transmitted or sent) by a memory controller 1401 as described with reference to FIG. 14. For instance, waveform 1500 may be sent from the memory controller 1401 to a memory die 1403 within the device.

According to the techniques described herein, waveform 1500 may include a first signal 1505 and a second signal 1510. Although shown as a continuous waveform, waveform 1500 may be a discontinuous waveform (e.g., there may be a break between the first signal 1505 and the second signal 1510 during which no data is communicated). The first signal 1505 may be modulated using a first modulation scheme having a first number of levels and the second signal 1510 may be modulated using a first modulation scheme having a second number of signals. For example, the first signal 1505 may be modulated using NRZ and the second signal may be modulated using PAM4. Thus, a device may switch from communicating using a NRZ modulation scheme to communicating using a PAM4 modulation scheme (e.g., the device may switch modulation schemes). The switch may be based on an operating parameter determined for the device, or for a component of the device (e.g., a host, a memory controller, an SoC, a processor, etc.).

The first signal 1505 may be communicated at a first frequency, which may be based on a clock frequency generated and sampled by the device. The first frequency may be related to the pulse duration 1515 (sometimes referred to as a symbol duration) of a pulse of the first signal 1505. A single symbol may be communicated during a single pulse duration 1515. One or more bits of data may be represented in each pulse duration 1515. For example, when NRZ is used to modulate the first signal 1505, the amplitude of the signal 1505 during a pulse duration 1515 may represent less than two bits of data (e.g., a logic '0' or a logic '1'). So, starting with the trailing pulse (i.e., reading left to right), the first signal 1505 may represent the data sequence: 1010010.

The second signal 1510 may also be communicated at the first frequency. Thus, modulation schemes may be switched without switching frequencies. However, the second signal 1510 may represent a different number of bits per pulse duration 1515 than the first signal 1505. For example, when PAM4 is used to modulate the second signal 1510, the amplitude of the signal 1510 during a pulse duration 1515 may represent a two bits of data. So, starting with the trailing pulse (i.e., reading left to right), the second signal 1510 may represent the data sequence: 00101101000110110101.

In some cases, a change in the operating parameter may be detected. Based on the change, the device may select the first modulation scheme for communicating a third signal (e.g., a signal that follows the second signal 1510). So the device may communicate the third signal modulated using the first modulation scheme (e.g., NRZ) based on selecting the first modulation scheme. In some cases, prior to sending the second signal 1510, the first signal 1505 may be sent at different frequency than the first frequency (e.g., the first signal 1505 may be sent at the first frequency for a period of time, then sent at another frequency for a subsequent period of time).

Because different modulations schemes provide varying bandwidths and consume different amounts of power, a device may switch modulation schemes to optimize performance, efficiency, and power conservation. For example, if using NRZ at first frequency consumes less power than using PAM4 at the same frequency, then the device may generally use NRZ to conserve power, and may switch to PAM4 to accommodate bandwidth demands higher than a certain threshold. The device may switch back to NRZ once the bandwidth demands fall below the threshold level. Although described with reference to NRZ and PAM4 the techniques described herein are applicable to any combination of pulse-amplitude-modulation, including PAM2 (e.g., NRZ), PAM4, PAM8, PAM16, etc. The techniques described herein are also applicable to switching from PAM4 to NRZ. Additionally, although described with reference to two modulation schemes, any number of modulation schemes may be switched between.

In some cases, a device may switch frequency based on an operating parameter. In other cases, the device may select a modulation and a frequency based on the operating parameter. In such cases, two variables about an encoded signal (modulation scheme and clock frequency) may be varied based on the operating parameter. For example, the device may determine that switching from NRZ to PAM4, but using the same frequency, provides excess bandwidth and/or consumes more power than the device can afford. In such cases, the device m switch clock frequencies of the encoded signal.

In some cases, the device may switch both the modulation and scheme and the clock frequency of the encoded signal. For example, the device may switch from using NRZ at a first frequency to using PAM4 at a second frequency lower than the first frequency. In another example, the device may determine that switching from NRZ to PAM4, but using the same frequency, does not provide enough bandwidth to support the bandwidth requirement. In such a scenario, the device may switch from using NRZ at a first frequency to using PAM4 at a second frequency higher than the first frequency. Thus, a device may accommodate varying operating constraints by customizing the modulation scheme and frequency used by the device to communicate.

Figure 16:
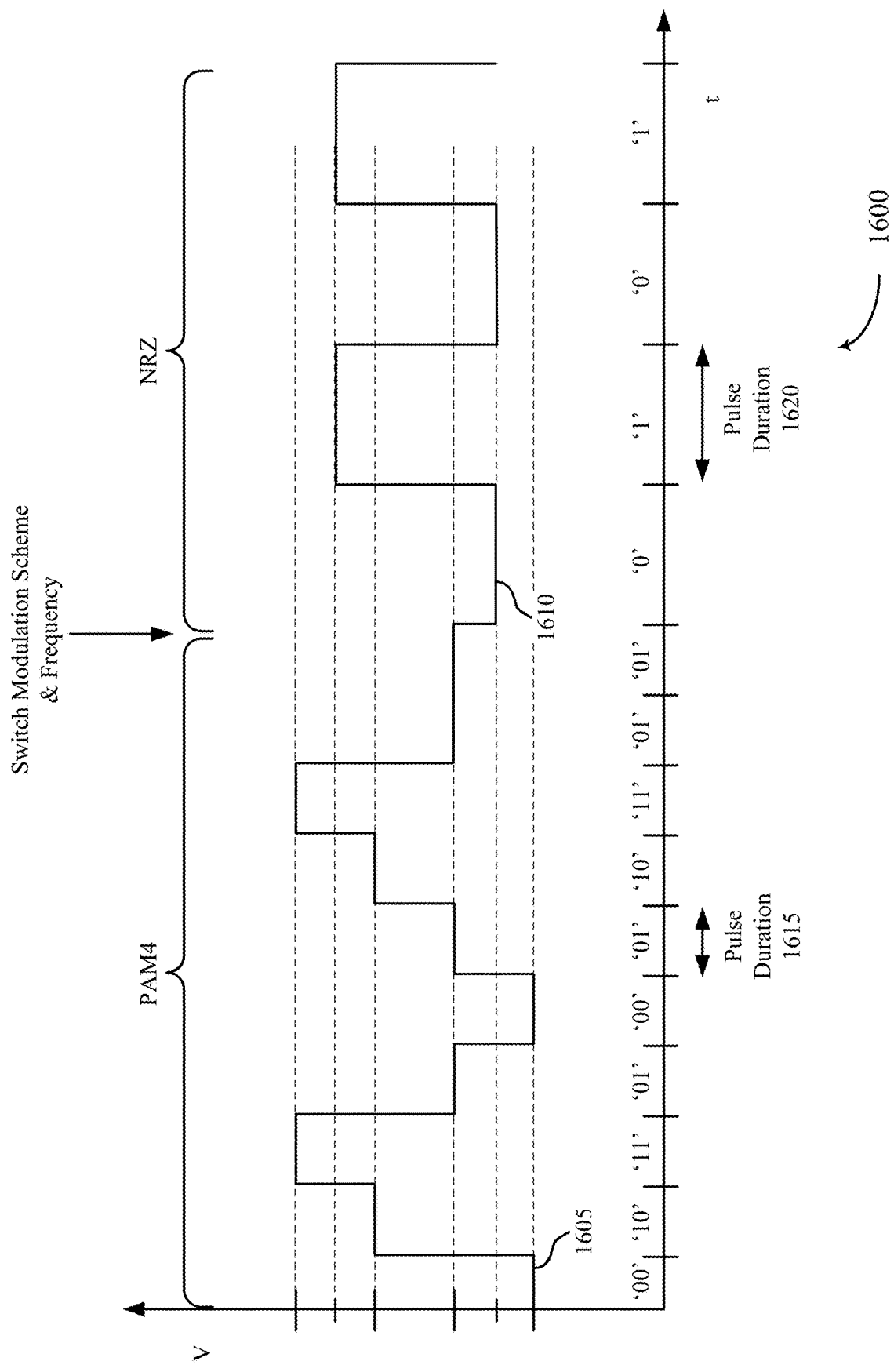
FIG. 16 illustrates an example of a diagram of a waveform that supports multiplexing distinct signals on a single pin in accordance with examples of the present disclosure.

FIG. 16 illustrates an exemplary diagram of a waveform 1600 employed in accordance with various examples of the present disclosure. Waveform 1600 may be communicated between two different devices or between the internal components of a device. In an example of intra-device communication (e.g., communication within a single device), waveform 1600 may be generated and communicated (e.g., transmitted or sent) by a memory controller 1401 as described with reference to FIG. 14. For instance, waveform 1600 may be sent from the memory controller 1401 to a memory die 1403 within the device.

Waveform 1600 may include a first signal 1605 and a second signal 1610. The first signal 1605 may be modulated using PAM4 (e.g., using a first modulation scheme having a first number of levels) and the second signal 1610 may be modulated using NRZ (e.g., a second modulation scheme having a second number of levels). Thus, the data represented by the first signal 1605 may be communicated using a first number of signal levels (e.g., four) and the data represented by the second signal 1610 may be communicated using a second number of signal levels (e.g., two). A device may switch between the two modulation schemes based on determining, detecting, or identifying an operating parameter associated with the device (e.g., the launch of an application that requires or demands data rates greater than a threshold data rate, or the launch of an application that consumes data or provides data at a rate greater than a threshold rate). The first signal 1605 may follow a previous signal that was modulated using a different modulation scheme than the first signal 1605 (e.g., NRZ).

The first signal 1605 may be communicated at a first frequency that serves as a basis for the pulse duration 1615 (e.g., the pulse duration 1615 may be inversely proportional to the first frequency) and the second signal 1610 may be communicated at a second frequency that serves as a basis for the pulse duration 1620 (e.g., the pulse duration 1620 may be inversely proportional to the second frequency). Thus, a device may switch between modulation schemes and frequencies at the same time. Although the first frequency is shown as greater than the second frequency, the converse is also permitted (e.g., the second frequency may be greater than the first frequency). The device may determine or select the second frequency based on an operating parameter associated with the device (e.g., based on the detection that the device's battery power or charge is below or above a pre-determined threshold), or a component of the device (e.g., based on a temperature of the component), or an application of the device (e.g., based on the data rate requirement of the application).

Figure 17:
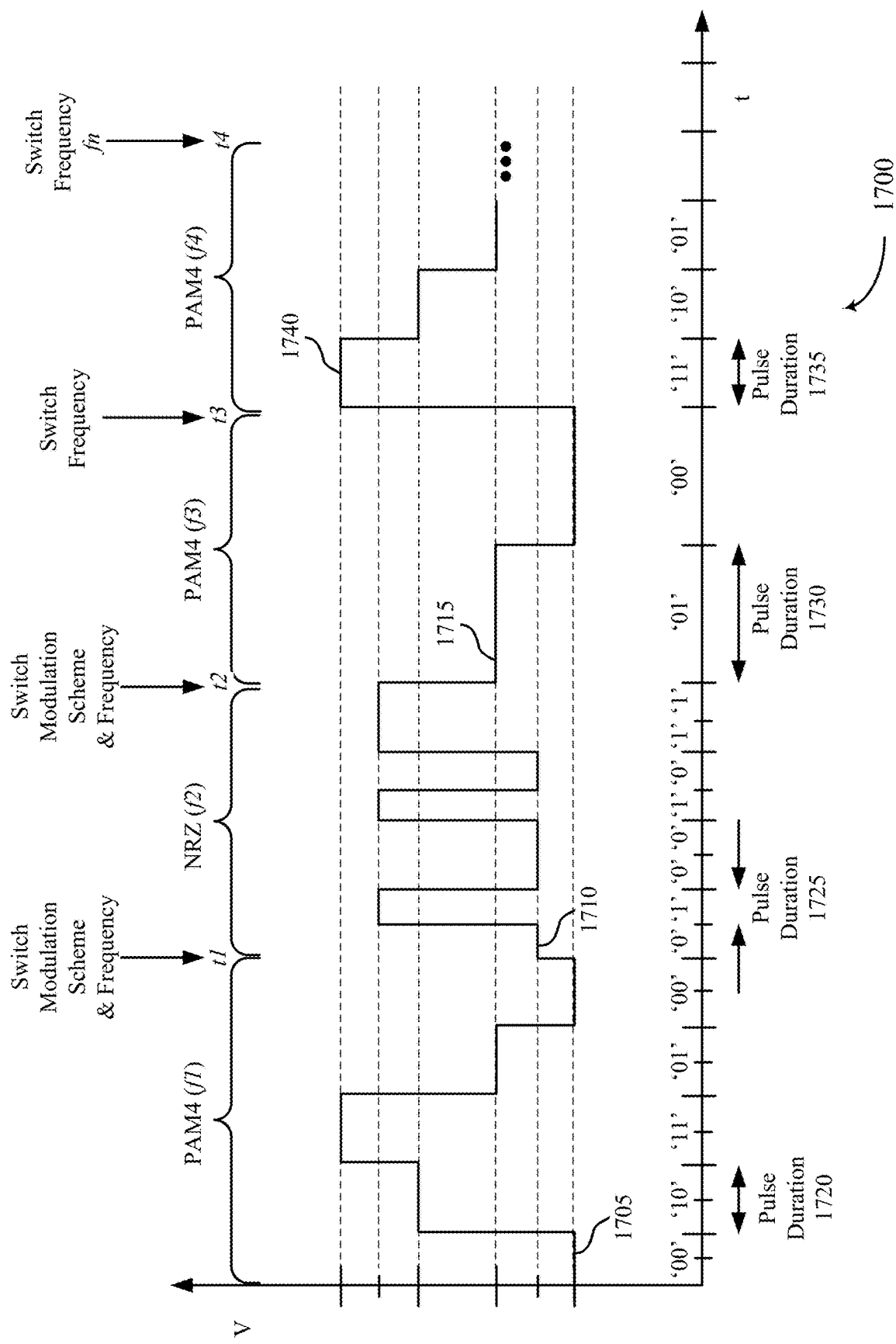
FIG. 17 illustrates an example of a diagram of a waveform that supports multiplexing distinct signals on a single pin in accordance with examples of the present disclosure.

FIG. 17 illustrates an exemplary diagram of a waveform 1700 employed in accordance with various examples of the present disclosure. Waveform 1700 may be communicated between two different devices or between the internal components of a device. In an example of intra-device communication (e.g., communication within a single device), waveform 1700 may be generated and communicated (e.g., transmitted or sent) by a memory controller 1401 as described with reference to FIG. 14. For instance, waveform 1700 may be sent from the memory controller 1401 to a memory die 1403 within the device. Waveform 1700 may be an example of a waveform that is communicated when a device switches between multiple (e.g., different) modulation schemes and multiple frequencies (e.g., in response to changes in one or more operating parameters).

Waveform 1700 may include a number of signals modulated according to different modulation schemes at different frequencies. For example, waveform 1700 may include signal 1710, which is modulated according to a two-level modulation scheme (e.g., NRZ), and signals 1705, 1715, and 1720, which are modulated according to a multi-level modulation scheme (e.g., PAM4). Signal 1705 may be transmitted at a first frequency f1 that is a based on the pulse duration 1720. At time t1, the modulation scheme and frequency of the waveform 1700 may be modified. For example, the modulation scheme may be changed from PAM4 to NRZ and the frequency may be changed from f1 to f2. The modification may be based on one or more operating parameters associated with the device or a component of the device. Thus, after t1 signal 1710 may be communicated using an NRZ modulation scheme at frequency f2. The frequency f2 may be based on the pulse duration 1725 (e.g., the frequency f2 may be inversely proportional to the pulse duration 1725). Although shown with f2>f1, the second frequency f2 may be less than f1.

At time t2 the modulation scheme and frequency of waveform 1700 may be modified again. For example, the modulation scheme may be switched from NRZ to PAM4, and the frequency may be switched from f2 to f3. The modification may be based on one or more operating parameters associated with the device or a component of the device. So signal 1715 may be communicated using a PAM4 modulation scheme at frequency f3. The frequency f3 may be based on the pulse duration 1730, which may be longer than the pulse duration 1725.

At time t3, the frequency at which waveform 1700 is communicated may be modified while the modulation scheme is maintained. For example, the modulation scheme may remain PAM4 and the frequency may be changed from f3 to f4. Prior to time t3, the device may determine that there has been a change in the operating parameter. The device may select frequency f4 based on the change in the operating parameter. Thus, signal 1740 may be communicated using PAM4 at frequency f4. The frequency f4 may be based on the pulse duration 1735. At time t4, the frequency may be changed again, from f4 to fn. In some cases, the modulation scheme is also changed. Frequency fn may be the same as, or different than, frequencies f1, f2, f3, f4.

Thus, different modulations schemes and frequencies may be used to generate and communicate different signals. The number of frequencies available for use, or used, may be a discrete number of frequencies (e.g., n frequencies) and may be pre-determined or dynamically determined. The frequencies may be based on a clock rate or clock frequency generated by a clock circuit 1410 such as described with respect to FIG. 14. For example, the pulse durations may be determined by sampling the clock pulses generated by the clock circuit 1410.

Selecting particular combinations of modulation scheme and frequency may allow a device to achieve a desired bandwidth (e.g., data rate) and/or power consumption level. For example, the device may determine the bandwidth provided and power consumed by a particular combination of modulation scheme and frequency and compare those values to desired bandwidth and power consumption values (e.g., bandwidth threshold and power consumption threshold). The desired bandwidth may be based on an application that has data to communicate and the power consumption may be based on a power status of the device (e.g., the remaining battery level of the device or whether the device is connected to an external power course). If the comparisons result in differences that are within a threshold, the device may select that modulation scheme and frequency for communication. If the comparisons result in differences that are outside a threshold, the device may select a different combination of modulation scheme and frequency for comparison.

In some cases, the process by which the device selects a modulation scheme and frequency for communication may involve the use of a look-up structure. For instance, the look-up structure may include a number of entries (e.g., pre-configured modulation data) that indicate the provided bandwidth and consumed power associated with different combinations of modulation scheme and frequency. Thus, the device may compare the desired bandwidth and/or power with the pre-configured modulation data to determine which combination of modulation scheme and frequency to use for communication. Although described with reference to bandwidth and power, the techniques described herein for selecting modulation scheme and frequency may be based on bandwidth or power, or on one or more other parameters.

Figure 18:
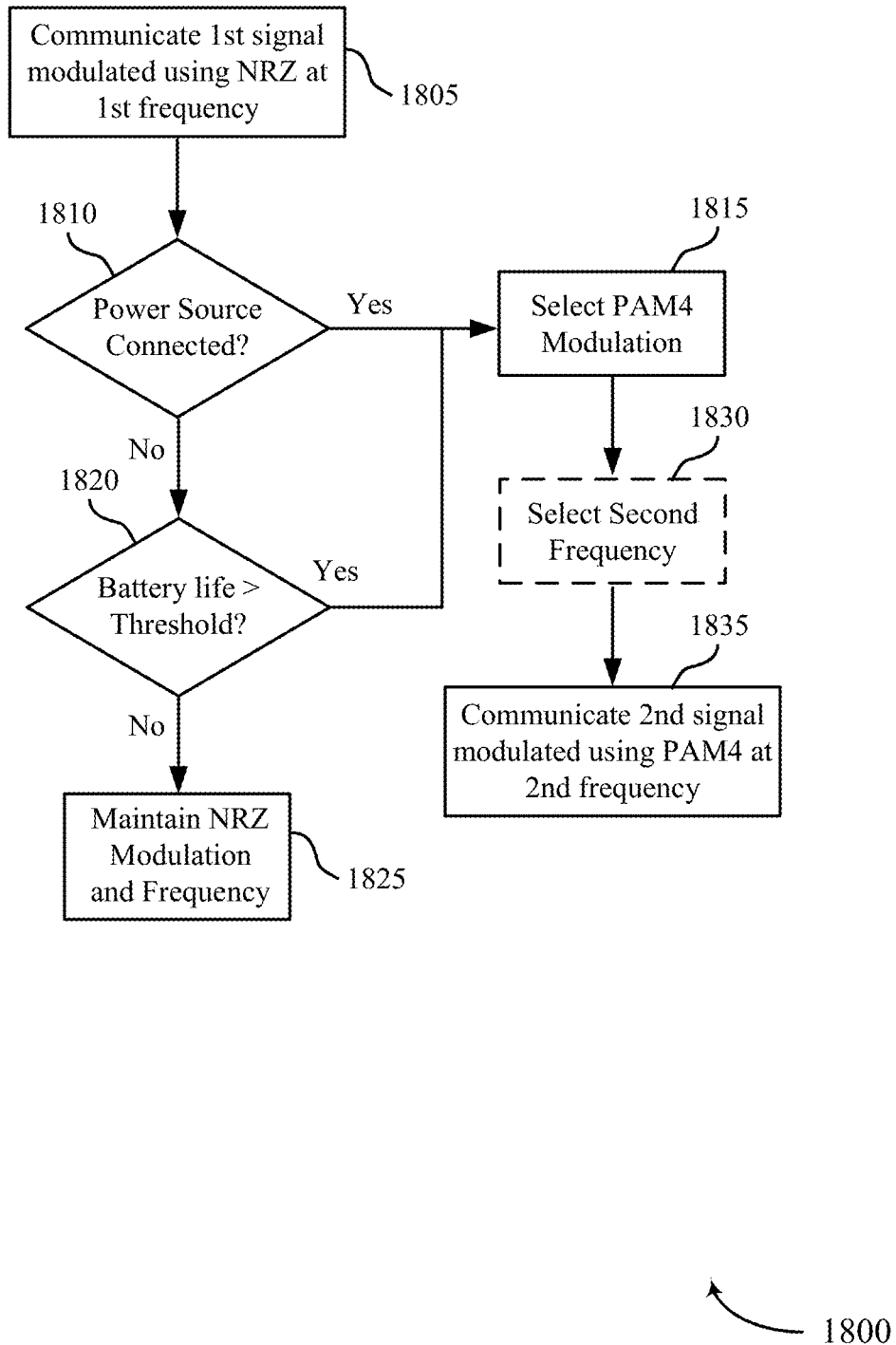
FIG. 18 illustrates an example of a process flow diagram that supports multiplexing distinct signals on a single pin in accordance with examples of the present disclosure.

FIG. 18 illustrates an exemplary diagram of a process flow 1800 that supports a variable modulation scheme in accordance with various examples of the present disclosure. The features of process flow 1800 may be implemented or performed by a device (e.g., a memory controller associated with a memory device) or a component of a device such as a memory controller 110, SoC, processor, GPU, etc. Although described with reference to NRZ and PAM4, the aspects and features of process flow 1800 can be implemented using other combinations of modulation schemes including binary-level modulation schemes and multi-level modulation schemes (e.g., QAM, PSK, etc.).

At 1805, the device may communicate a first signal modulated using a first modulation scheme (e.g., NRZ) at a first frequency. The first signal may represent a first set of data and the first modulation scheme may have a first number of levels (e.g., the first modulation scheme may consist of two levels when the first modulation scheme is NRZ). The first signal may be communicated between components of the device (e.g., between a memory controller and a memory array) or between the device and another device. In some examples, the first and second signals may be communicated over a same channel at different times (e.g., via time-multiplexing), or over the same channel at overlapping times, or over different channels at the same time (e.g., concurrently, simultaneously), or over different channels at different times (e.g., non-concurrently) or overlapping times. At 1810, the device may determine an operating parameter associated with the device or a component of the device (e.g., a host, SoC, processor, memory die, memory controller, etc.).

For example, the device may determine a power parameter associated with the device. The device may determine the power parameter by determining whether the device is connected to an external power supply (e.g., by determining whether the device is able to draw power from an external power source, such as an outlet, battery, battery charger, and the like). If the device is detected to be connected to an external power source, the device may, at 1815, select a second modulation scheme (e.g., PAM4) different from the first modulation scheme based at least in part on the detection. The second modulation scheme may be used to modulate a second signal (which is representative of a second set of data) and may have a second number of levels (e.g., four levels) different from the first number of levels.

If the device is not connected to an external power source, the device may, at 1820, determine whether the battery life of the device (e.g., the charge of the battery) is greater than a threshold battery life (e.g., a threshold charge). For example, the device may estimate a duration of time until an internal power source (e.g., the battery) reaches a threshold value. If the device determines that the estimated duration of time is less than the threshold duration of time, the device may, at 1825, maintain communicating using NRZ at the first frequency. If the device determines that the estimated duration of time is greater than a threshold duration of time (e.g., the device has more than x hours until the internal power source has y % remaining battery), the device may, at 1815, select PAM4 for communication of a second signal. Thus, the device may select the second modulation scheme based on the estimation of the duration of time until the internal power source reaches the threshold value.

In some cases, the device may, at 1830, select a second frequency for communicating the second signal that is modulate using PAM4. The second frequency may be based on the determination(s) made at 1810 and/or 1815. At 1835, the device may communicate the second signal modulated using PAM4 at the selected second frequency. Alternatively, the device may communicate the second signal modulated using PAM4 at the first frequency. The second signal may be communicated between components of the device or between the device and another device. In some cases, the first signal and the second signal are communicated by a memory controller. In other cases, the first signal and second signal may be communicated with a memory controller (e.g., sent or passed to the memory controller from another component).

Figure 19:
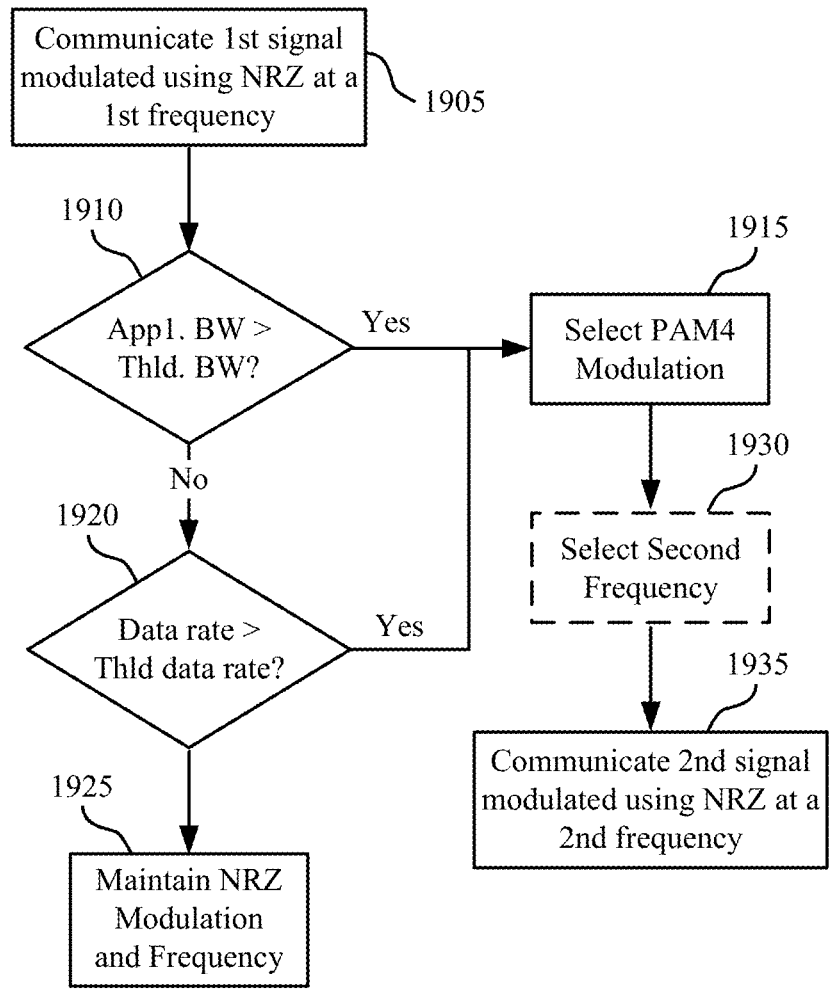
FIG. 19 illustrates an example of a process flow diagram that supports multiplexing distinct signals on a single pin in accordance with examples of the present disclosure.

FIG. 19 illustrates an exemplary diagram of a process flow 1900 that supports a variable modulation scheme in accordance with various examples of the present disclosure. The features of process flow 1900 may be implemented or performed by a device (e.g., a memory controller associated with a memory device) or a component of a device such as a memory controller 110, SoC, processor, GPU, etc. The communications in process flow 1900 may occur between components of a device or between two different devices. Although described with reference to NRZ and PAM4, the aspects and features of process flow 1900 can be implemented using any combination of modulation schemes (e.g., QAM, PSK, etc.).

At 1905, the device may communicate a first signal that is modulated according to a first modulation scheme (e.g., NRZ) at a first frequency. At 1910, the device may determine an operating parameter associated with the device or a component of the device. For example, the device may determine a bandwidth parameter. The bandwidth parameter may be associated with a particular application (e.g., an application associated with a second signal, such as an application sending or receiving the second signal) and may be indicative of the bandwidth demanded, requested, or required by that application. So at 1910, the device may determine whether the bandwidth of the application is greater than a threshold bandwidth.

In some cases, the device may additionally or alternatively determine whether the bandwidth parameter associated with the first application is greater than a bandwidth parameter associated with a second application (e.g., a different application). The first application may be an application that has launched, or is ready to send data, and the second application may be an application that has closed, or is not ready to send data. In some cases, the second application is associated with the first set of data represented by the first signal and the first application is associated with a second set of data represented by a second signal.

If the bandwidth parameter associated with the application is greater than the threshold bandwidth, or greater than the bandwidth parameter associated with a second application, the device may, at 1915, select a second modulation scheme (e.g., PAM4) different from the first modulation scheme. Thus, the selection based at least in part on the determined bandwidth parameter. The second modulation scheme may have a second number of levels (e.g., four) different from the first number of levels. If the bandwidth parameter associated with a first application is less than a bandwidth parameter associated with a second application, or less than the bandwidth parameter associated with a second application, the device may, at 1920, determine whether a launched application has a data rate (e.g., a target data rate or a requited data rate) greater than a threshold data rate. The term bandwidth may refer to the overall amount of data that can be communicated by a device or component while the term data rate may refer to the speed at which data is transferred between two device or components.

If the data rate is not greater than the threshold rate, the device may, at 1925, determine to continue to use first modulation scheme (e.g., NRZ) at the first frequency. If the data rate is greater than the threshold rate, the device may, at 1915, select PAM4 for the modulating the second signal. Optionally, the device may, at 1930, select a second frequency for communicating the second signal. The second frequency may be different from the first frequency and may be selected based on the determined operating parameter (e.g., the bandwidth parameter or the data rate parameter). At 1935, the device may communicate the second signal that is modulated using the second modulation scheme (e.g., PAM4) at the second frequency. In some cases, the second signal may be communicated at the first frequency (e.g., if 1930 is not performed).

It should be noted that the methods described above describe possible implementations, and that the operations and the steps may be rearranged or otherwise modified and that other implementations are possible. Furthermore, examples from two or more of the methods may be combined.

Figure 20:
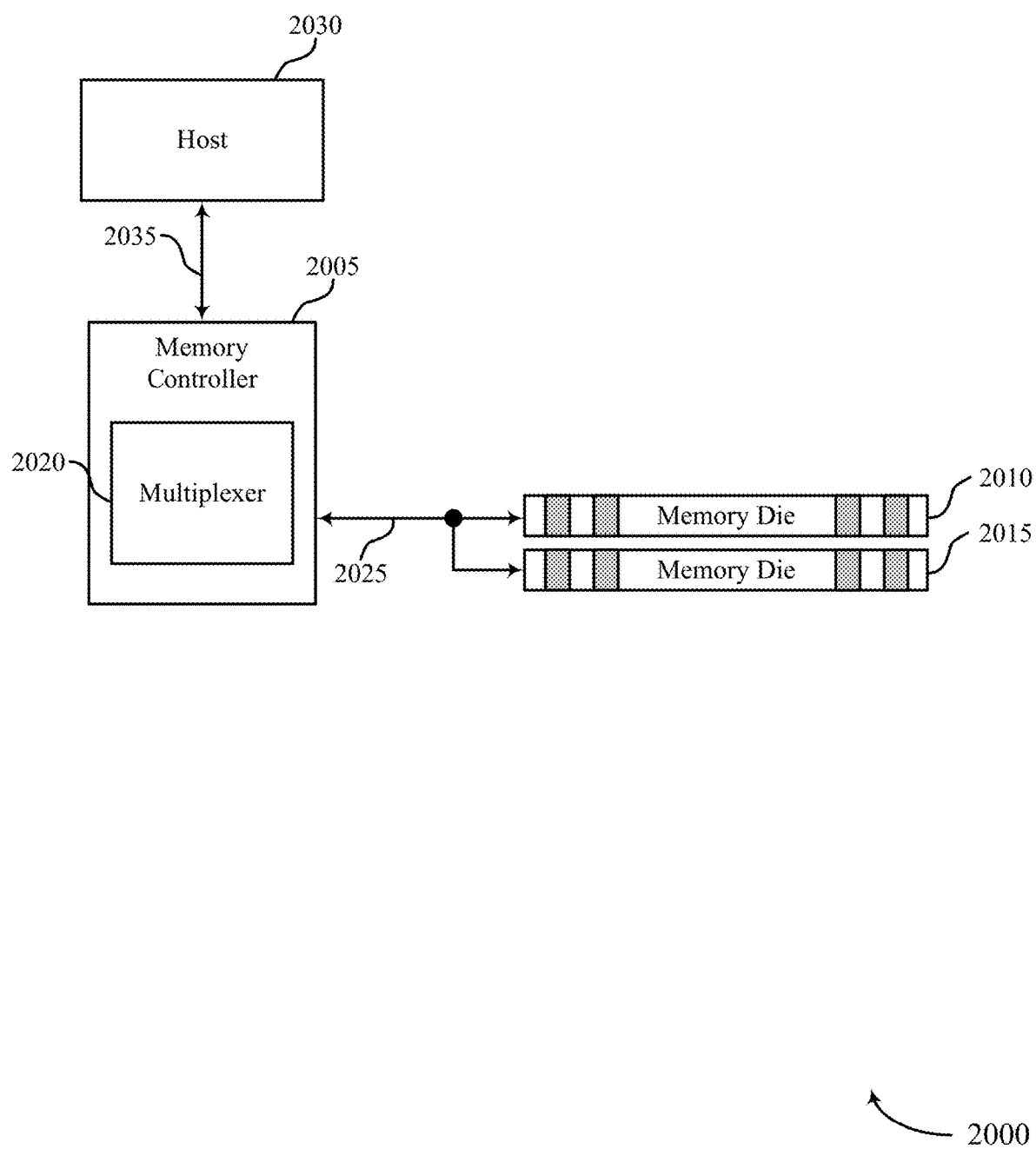
FIG. 20 illustrates an example of a memory device that supports multiplexing distinct signals on a single pin in accordance with examples of the present disclosure.
Figure 21:
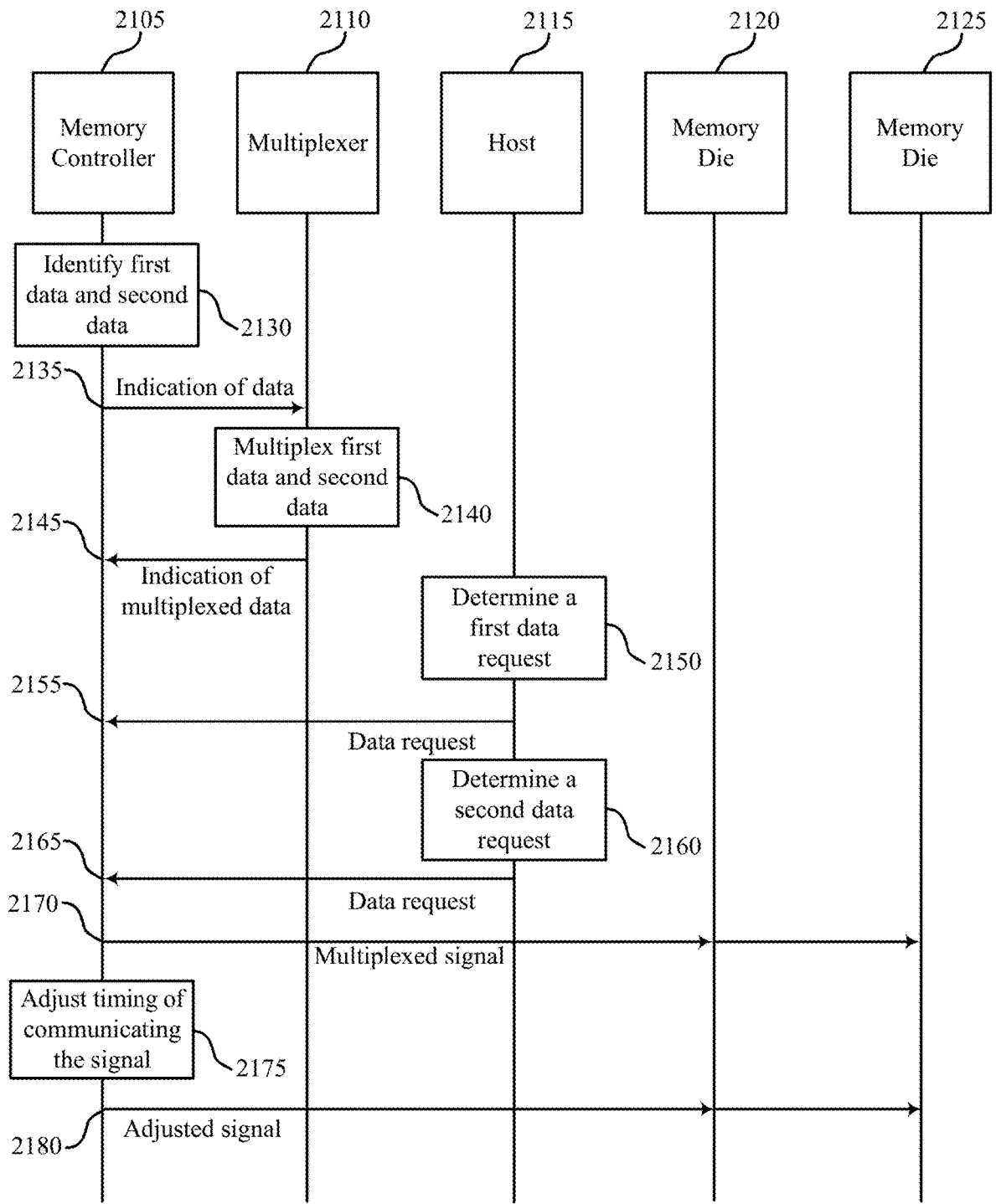
FIG. 21 illustrates an example of a process flow diagram that supports multiplexing distinct signals on a single pin in accordance with examples of the present disclosure.
Figure 22:
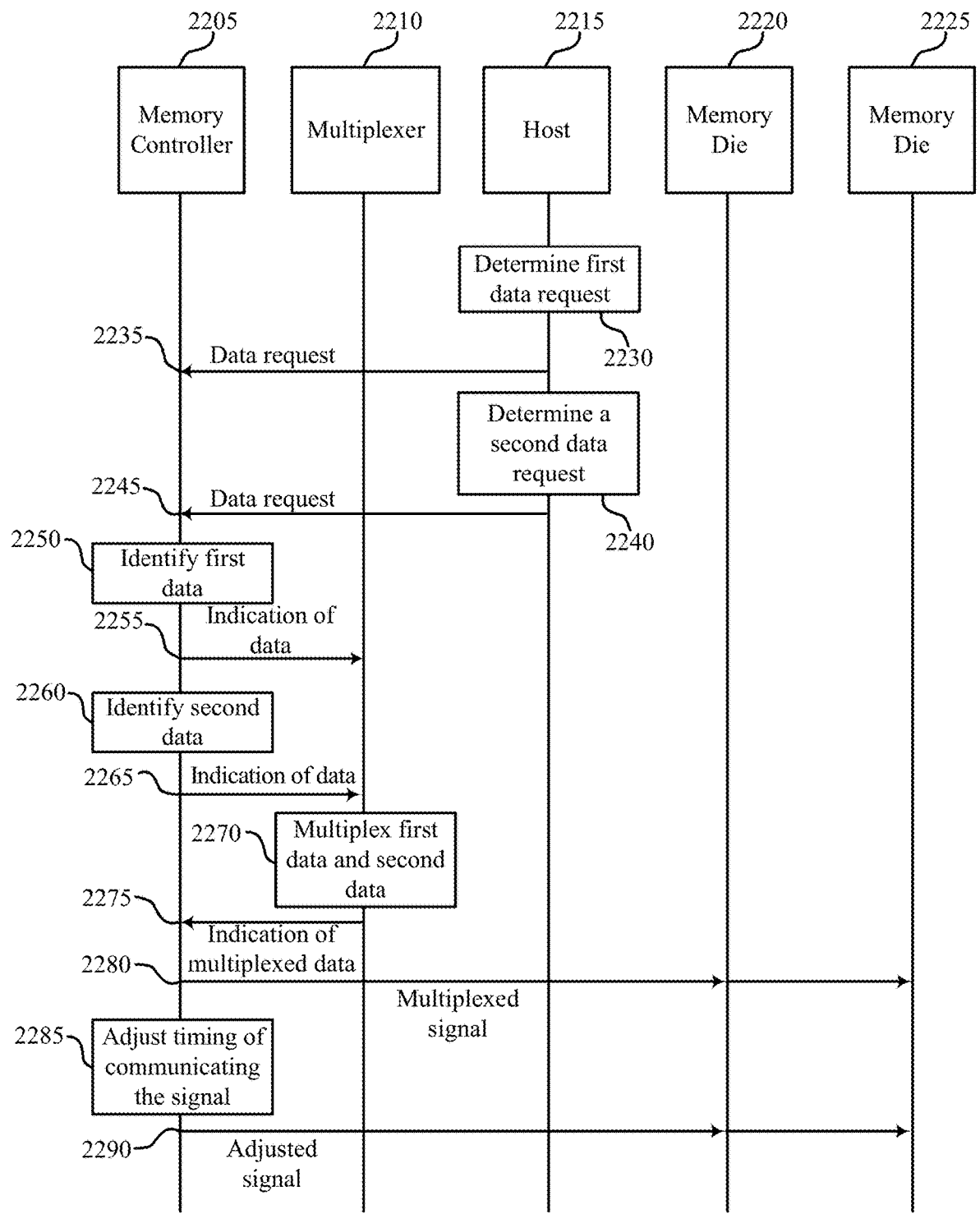
FIG. 22 illustrates an example of a process flow diagram that supports multiplexing distinct signals on a single pin in accordance with examples of the present disclosure.

FIGS. 20-22 illustrate a memory device configured to multiplex data. In some multi-level modulation schemes, a symbol may represent data from different sources or different types of data. For example, control data, storage data, metadata, or a combination thereof may be transmitted in a single symbol containing multiple symbols. To multiplex the signal, first data and second data may be multiplexed together into a data structure. A multi-symbol signal may be encoded with a particular symbol based on the multiplexed data structure, the modulation scheme having at least three levels. In some cases, multiple memory dies may receive the multi-symbol signal and may use only a portion of one or more of the symbols. For example, a first memory die may use the most-significant bit a symbol of the multi-symbol signal and a second memory die may use the least-significant bit of the same symbol of the multi-symbol signal. The features and/or functions described with reference to FIGS.

20-22 may be combined with the features and/or functions of other aspects of a memory device as described with reference to FIGS. 1-19.

FIG. 20 illustrates an example memory device 2000 in accordance with various examples of the present disclosure. Memory device 2000 may be an example of system 100 as described with reference to FIG. 1. Memory device 2000 may include memory controller 2005, memory die 2010, memory die 2015, a multiplexer 2020, a bus 2025, and a host 2030. In some examples, memory die 2010 may be referred to as a first memory die 2010 and memory die 2015 may be referred to as a second memory die 2015. In some examples, the first memory die 2010 and the second memory die 2015 may be coupled with the bus 2025.

In some examples, the multiplexer 2020 may be coupled with the bus 2025 and may be configured to multiplex first data and second data. The multiplexer 2020 may be configured to multiplex the first data and the second data into a signal that is modulated using a binary-symbol modulation scheme or multi-symbol modulation scheme. In some examples, the memory controller 2005 may multiplex the first data and the second data. In other examples, the modulation scheme of the signal may include at least one of three levels. Each of the first memory die 2010 and the second memory die 2015 may be configured to use at least a portion of the signal.

For example, the first memory die 2010 may be configured to use at least the first data of the signal and the second memory die 2015 may be configured to use at least the second data of the signal. Each of the first or the second data may include, for example, metadata, control data, or storage data. In some examples, metadata may include information regarding various aspects of memory device 2000—for example, information regarding power usage of memory device 2000. Additionally or alternatively, for example, the metadata may include information about storage data, control data, or both. In other examples, control data may include information regarding one or more operations of memory device 2000—for example, information regarding a read operation to or a write operation from one of first memory die 2010 or second memory die 2015. In further examples, storage data may include information regarding a logic state of one or more memory cells of either first memory die 2010 or second memory die 2015—for example, a logic "0" or a logic "1."

In some examples, the memory controller 2005 may receive a signal associated with each of the first memory die 2010 and the second memory die 2015. In some examples, the signal may be received from a host 2030. The host 2030 may be in communication with the memory controller 2005 through communication channel 2035. In response to receiving the signal, for example, the memory controller 2005 may determine whether the signal is associated with the first memory die 2010 or the second memory die 2015.

This determination, in some examples, may be based at least in part on a respective signal level of the received signal. In some cases, this determination may be based on a type of the modulation scheme (e.g., binary-level or multi-level) used to encode the data in the signal. In other examples, the memory controller 2005 may be operable to receive a first request associated with an operation to be performed on the first memory die 2010. This request may be, for example, a request to read data from or write data to the first memory die 2010. In either instance, the memory controller 2005 may be configured to transmit the signal to the first memory die 2010 and the second memory die 2015 based at least in part on the first request.

In other examples, the memory controller 2005 may transmit the first data and the second data, for example, to the first memory die 2010 and the second memory die 2015 based on a respective data request. For example, the first memory die 2010 and the second memory die 2015 may transmit a first data request and a second data request, respectively, to the memory controller 2005. In some examples, the first data request and the second data request may be transmitted by a host 2030. The first data request may indicate, to the memory controller 2005, to transmit data to the first memory die 2010—for example, to transmit the first data of the signal.

Additionally or alternatively, the second data request may indicate, to the memory controller 2005, to transmit data to the second memory die 2015—for example, to transmit the second data of the signal. In some examples, the first data request and the second data request may be associated with a read operation or a write operation. For example, the first data request may be associated with a read command for the first memory die 2010. Thus, a read operation of one or more memory cells in first memory die 2010 may occur in response to the first data request. In other examples, the second data request may be associated with a write command for the second memory die 2015. For example, a write operation to one or more memory cells in second memory die 2015 may occur in response to the second data request. In either example, the memory controller 2005 may transmit each of the first data of the signal, the second data of the signal, or both, in response to the first and second data requests.

In some examples, the multiplexer 2020 may be configured to multiplex the first data and the second data into a symbol of a multi-level signal. Stated alternatively, the multiplexer 2020 may be configured to generate a single modulation symbol that includes data from two different sources. For example, a PAM4 modulation symbol may represent two bits of data. A most-significant bit of the modulation symbol may be based on the first data and a least-significant bit of the modulation symbol may be based on the second data.

Additionally or alternatively, for example, the most-significant bit of the modulation symbol may be based on the second data and a least-significant bit of the modulation symbol may be based on the first data. The number of data sources that may be multiplexed into a single symbol may be based on the number of bits represented by that symbol. For example, a multi-level modulation scheme that includes eight levels may be configured to multiplex data from three sources because the symbol may represent three bits of data.

Additionally or alternatively, for example, each of first memory die 2010 and second memory die 2015 may include a variety of packaging and/or cell configurations. For example, each of the first memory die 2010 and the second memory die 2015 may be different memory dies in a single package (e.g., different stacked memory dies, a package-on-package stack). In some examples, the second memory die 2015 may comprise a different type of memory or storage device than the first memory die 2010. In other examples, the first memory die 2010 may include at least one of FeRAM, a DRAM, a NAND device, a NOR device, or a phase-change memory device. In other examples, the second memory die 2015 may include at least one of FeRAM, a DRAM, a NAND device, a NOR device, or a phase-change memory device. Thus, in some examples, each of the first memory die 2010 and the second memory die 2015 may contain a same cell or device type, and in other examples each of the first memory die 2010 and the second memory die 2015 may contain a different cell or device type. In other words, although depicted as stacked dice, memory die 2010 and memory die 2015 may be physically distinct memory devices. For example, memory die 2010 may be an internal memory array (or storage) for a device and memory die 2015 may be a removable storage card. In such cases, either or both memory die 2010 and 2015 may be Flash storage devices.

In further examples, the memory device 2000 may include a third memory die (not illustrated). The third memory die may be coupled with the bus 2025 and may be configured to receive multiplexed data. In some examples, the third memory die may be configured to decode the signal and discard the first data or the second data. In other examples, the third memory die may be a different memory die than the first memory die 2010 and the second memory die 2015. Additionally or alternatively, for example, the third memory die may be configured to use at least a portion of the signal of the first data and/or the second data of the signal.

In some examples, the memory controller 2005 may transmit the first data and the second data, for example, to the first memory die 2010 and the third memory die based on a respective data request. For example, the first memory die 2010 and the third memory die may transmit a first data request and a second data request, respectively, to the memory controller 2005. In some examples, the first data request and the second data request may be transmitted by the host 2030, as described above. The first data request may indicate, to the memory controller 2005, to transmit data to the first memory die 2010—for example, to transmit the first data of the signal.

Additionally or alternatively, for example, the second data request may indicate, to the memory controller 2005, to transmit data to the third memory die—for example, to transmit the second data of the signal. Thus the memory controller 2005 may transmit each of the first data of the signal, the second data of the signal, or both, in response to the first and second data requests.

Additionally or alternatively, for example, the third memory die may include a variety of packaging and/or cell configurations. For example, each of the first memory die 2010, the second memory die 2015, and the third memory die may be different memory dies in a single package (e.g., different stacked memory dies, a package-on-package stack). In other examples, the third memory die may include at least one of FeRAM, a DRAM, a NAND device, a NOR device, or a phase-change memory device. The third memory die may include a same cell or device type as or a different cell or device type from the first memory die 2010 and the second memory die 2015. Thus, each of the first memory die 2010, the second memory die 2015, and the third memory die may contain a same cell or device type, each may contain a different cell or device type, or a combination thereof.

In other examples, each of the first memory die 2010, the second memory die 2015, and the third memory die may be coupled with the bus 2025. In some examples, the memory controller 2005 may also be coupled with the bus 2025. The memory controller 2005 may be operable to identify first data, second data, and third data, which may include metadata, control data, or storage data.

The memory controller 2005 may operate to multiplex the first data, the second data, and the third data in a signal using a first modulation scheme having at least five levels (e.g., PAM8). In other examples, the memory controller 2005 may operate to transmit the signal to the first memory die 2010, the second memory die 2015, and the third memory die. In some examples, the first memory die 2010, the second memory die 2015, and the third memory die may each comprise at least one of FeRAM, a DRAM, a NAND device, a NOR device, or a phase-change memory device.

FIG. 21 illustrates an example process flow diagram 2100 in accordance with various examples of the present disclosure. Process flow diagram 2100 may illustrate one or more operations conducted by memory device 2000 as described with reference to FIG. 20. Process flow diagram 2100 may include operations conducted by a memory controller 2105, a multiplexer 2110, a host 2115, a memory die 2120, and a memory die 2125. In some examples, memory controller 2105, multiplexer 2110, memory die 2120, and memory die 2125 may be examples of a memory controller 2005, a multiplexer 2020, a memory die 2010, and a memory die 2015, respectively, as described with reference to FIG. 20.

At block 2130, the memory controller 2105 may identify first data and second data. In some examples, the first data or the second data may include metadata, control data, or storage data as described above with reference to FIG. 20. In some examples, each of the first data and the second data may be configured to include metadata, control data, or storage data. This may be to the exclusion of other types of data. Upon identifying the first data and the second data, through transmission 2135, the memory controller 2105 may transmit an indication of the first data and the second data to the multiplexer 2110. In other examples, the memory controller 2105 may transmit the first data and the second data to the multiplexer 2110. In either instance, at block 2140, the multiplexer 2110 may multiplex the first data and the second data. For example, the multiplexer 2110 may multiplex the first data and the second data such that it is represented by a single symbol of a multi-level modulation scheme that includes at least three unique symbols to represent data. Stated alternatively, the multiplexer 2110 may multiplex the first data and the second data in signal that contains a signal strength corresponding to one of at least three levels.

Upon multiplexing the first data and the second data, the multiplexer 2110 may transmit an indication of the multiplexed data to the memory controller 2105 through transmission 2145. In other examples, the multiplexer 2110 may transmit the multiplexed data to the memory controller 2105. In other examples, the multiplexer 2110 may communicate the data to an encoder that modulates a signal based on multiplexed data. In an additional example, the memory controller 2105 may transmit an indication to the multiplexer 2110 to transmit the multiplexed data to at least one of the first memory die 2120 or the second memory die 2125 (not illustrated).

Additionally or alternatively, for example, the memory controller 2105 may receive a signal from the memory die 2120, the memory die 2125, or both, indicating one or more characteristics of the respective die. For example, based one or more characteristics of the signal (e.g., a signal strength), the memory controller 2105 may first determine that the signal was communicated by the first memory die 2120 or the second memory die 2125. Because the first memory die 2120 may include a FeRAM cell, a DRAM cell, a NAND device, a NOR device, or a phase-change memory device—as discussed above with reference to FIG. 1—the memory controller 2105 may determine a cell or device type based in part on the signal transmitted from the first memory die 2120.

Additionally, because the second memory die 2125 may include a different memory cell or memory device than the first memory die 2120, the memory controller 2105 may determine a cell type or device type based in part on the signal transmitted from the second memory die 2125.

In any of the aforementioned examples, a host may determine a first data request corresponding to the first memory die 2120 or a second memory die 2125 at block 2150. The data request may indicate to the memory controller 2105, for example, to transmit the multi-symbol signal that represents the multiplexed data to at least one of the first memory die 2120 and/or the second memory die 2125.

After determining a first data request at block 2150, for example, the host 2115 may transmit the data request—or an indication of the data request—to the memory controller 2105. This may occur through transmission 2155. Additionally or alternatively, for example, at block 2160 the host 2115 may determine a second data request corresponding to the first memory die 2120 or the second memory die 2125. As stated above with respect to the first data request, the second data request may indicate to the memory controller 2105 to transmit the multiplexed data to at least one of the first memory die 2120 or the second memory die 2125. Upon determining a second data request at block 2160, the host 2115 may transmit the data request—or an indication of the data request—to the memory controller 2105. This may occur through transmission 2165.

At transmission 2170, the memory controller 2105 may transmit the first data and the second data to the first memory die 2120 and the second memory die 2125. In some examples, the memory controller 2105 may transmit the first data and the second data to the first memory die 2120 and the second memory die 2125 through a bus coupled with each of the first and second memory die. In some examples, the second memory die 2125 may be or may include an external or removable memory device.

For example, when inserted or activated, the memory controller 2105 may receive an indication of a presence of the second memory die 2125 that includes a removable storage device (not illustrated). In some examples, the removable storage device may be a universal flash storage (UFS) device. In such an example, the transmission of the signal to the first memory die 2120 and the second memory die 2125 may be based in part on the indication transmitted to the memory controller 2105.

In some examples, the memory die 2120 and the memory die 2125 may receive the signal modulated using a first modulation scheme and may identify one or more bits represented by the symbol (e.g., one of three unique symbols). For example, one bit may be assigned to memory die 2120 and one bit may be assigned to memory die 2125. Thus, memory die 2120 may discard the bit assigned to memory die 2125 and memory die 2125 may discard the bit assigned to memory die 2120. In other examples, each of the memory die 2120 and the memory die 2125 may divide the data based on a type of data (e.g., control data). For example, memory die 2125 may decode the signal received and, based on the type of data, may discard the bit. Additionally or alternatively, for example, memory die 2120 may decode the signal received and may facilitate a transfer of the specific data to the memory die 2125.

In some examples, a memory die (e.g., memory die 2120 or memory die 2125) may decode a symbol modulated using a multi-symbol modulation scheme and may determine a type of each bit represented by the decoded symbol. The memory die may execute one or more operations based on the type(s) of data included in the symbol.

In other examples, the first data and the second data may be transmitted as a multiplexed signal having a signal strength corresponding to one of at least three levels. As discussed above with reference to FIG. 1, the signal may be modulated using, for example, a pulse amplitude modulation (PAM) scheme. Upon transmitting the signal, at block 2175, the memory controller 2105 may be operable to initiate an adjustment a timing of the transmission of the signal to the first memory die 2120 and the second memory die 2125. In transmitting the signal, the memory controller 2105 may communicate the signal based on a timing of a system clock. In some examples, the system clock may be associated with (e.g., integrated) memory controller 2105. In other examples, the system clock may be external to the memory controller 2105. For example, the memory controller 2105 may transmit the signal during a rising edge of the system clock, a falling edge of the system clock, or both. The memory controller 2105 may then, through transmission 2180, transmit the adjusted signal to each of the first memory die 2120 and the second memory die 2125.

By way of example, at block 2130, the memory controller 2105 may identify first and second data that each include control data. Subsequently, for example, the memory controller 2105 may transmit an indication of the first and second control data to the multiplexer 2110 through transmission 2135. At block 2140, the multiplexer 2110 may multiplex the first data and the second data into a symbol of a multi-level signal that contains at least three levels and subsequently transmit an indication of the multiplexed data to the memory controller 2105. At block 2150, host 2115 may determine a first data request, which may correspond to a data request from the first memory die 2120.

Additionally, at block 2160, the host 2115 may determine a second data request, which may correspond to a data request from the second memory die 2125. Each of the data requests may be transmitted from the host 2115 to the memory controller 2105 at transmissions 2155 and 2165, respectively. Upon receiving the data requests, the memory controller 2105 may, through transmission 2170, concurrently transmit the multiplexed signal to each of the first memory die 2120 and the second memory die 2125. Based on the transmission, at block 2175, the memory controller 2105 adjust the communication of the multiplexed signal, based on the clock cycle of the memory controller 2105, and may concurrently transmit the adjusted signal, through transmission 2180, to each of the first memory die 2120 and the second memory die 2125.

FIG. 22 illustrates a process flow diagram 2200 in accordance with various examples of the present disclosure. Process flow diagram 2200 may illustrate one or more operations conducted by memory device 2000 as described with reference to FIG. 20. Process flow diagram 2200 may include operations conducted by a memory controller 2205, a multiplexer 2210, a host 2215, a memory die 2220, and a memory die 2225. In some examples, memory controller 2205, multiplexer 2210, host 2215, memory die 2220, and memory die 2225 may be examples of memory controller 2105, multiplexer 2110, host 2115, memory die 2120, and memory die 2125, respectively, as described with reference to FIG. 21.

At block 2230, the host 2215 may determine a first data request corresponding to the first memory die 2220 or the second memory die 2225. The first data request may indicate to the memory controller 2205, for example, to transfer data to one of the first or second memory die. After determining a first data request at block 2230, for example, the host 2215 may transmit the data request—or an indication of the data request—to the memory controller 2205. This may occur through transmission 2235.

Additionally or alternatively, for example, at block 2240 the host 2215 may determine a second data request corresponding to the first memory die 2220 or the second memory die 2225. As stated above with respect to the determination of the first data request, the determination of the second data request may indicate to the memory controller 2205 to transfer data to one of the first or second memory die. In some examples, the determination of the first data request at block 2230 may correspond to the first memory die 2220 and the determination of the second data request at block 2240 may correspond to the second memory die 2225. After determining the second data request at block 2240, for example, the host 2215 may transmit the second data request—or an indication of the second data request—to the memory controller 2205 through transmission 2245.

After transmitting each of the first data request and the second data request—or an indication thereof—to the memory controller 2205, the memory controller 2205 may identify first data at block 2250. The memory controller 2205 may, for example, identify first data in response to the determined first or second data requests at blocks 2230 and 2240, respectively. In some examples, the identification of first data includes identifying control data. Upon identifying the first data at block 2250, the multiplexer 2210 may receive an indication of the first data from the memory controller 2205. In other examples, the multiplexer 2210 may receive an indication of the first data from the memory controller 2205.

In either instance, the reception (or indication thereof) of the identified data may occur through transmission 2255. After receiving the identifying first data through transmission 2255, the memory controller 2205 may identify second data at block 2260. The memory controller 2205 may, for example, identify first data in response to the determined first or second data requests at blocks 2230 and 2240, respectively, or in response to the identification of first data at block 2250. In some examples, after identifying the second data at block 2260, the multiplexer 2210 may receive the identified second data—or an indication of the identified second data—from the memory controller 2205 through transmission 2265.

Upon receiving the identified first data and second data—or an indication thereof—the multiplexer 2210 may multiplex the identified first data and the identified second data at block 2270 such that it is represented by a single symbol of a multi-level modulation scheme that includes at least three unique symbols to represent data. For example, the multiplexer 2210 may multiplex the identified first data. Stated alternatively, the multiplexer 2210 may multiplex the identified first data and the identified second data in signal that contains a signal strength corresponding to one of at least three levels.

After multiplexing the identified first data and the identified second data, for example, the multiplexer 2210 may transmit an indication of the multiplexed data to the memory controller 2205 through transmission 2275. In other examples, the multiplexer 2210 may transmit the multiplexed data to the memory controller 2205. In an additional example, the memory controller 2205 may transmit an indication to the multiplexer 2210 to transmit the multiplexed data to at least one of the first memory die 2220 or the second memory die 2225 (not illustrated).

Additionally or alternatively, for example, the first memory die 2220, second memory die 2225, or both, may transmit a signal to the memory controller 2205, indicating one or more characteristics of the respective die. For example, based one or more characteristics of the signal (e.g., a signal strength), the signal may indicate that it originated at one of the first memory die 2220 or the second memory die 2225. Because the first memory die 2220 may include a FeRAM cell, a DRAM cell, a NAND device, a NOR device, or a phase-change memory device—as discussed above with reference to FIG. 1—the signal may indicate a cell or device type of first memory die 2220. Additionally, because the second memory die 2225 may include a different memory cell or memory device than the first memory die 2220, the signal may indicate a cell type or device type of the second memory die 2225. In some examples, the multiplexer 2210 may multiplex the first and second data, at block 2270, based upon the cell type or device type of the first memory die 2220 and the second memory die 2225.

Through transmission 2280, the first memory die 2220 and the second memory die 2225 may receive the multiplexed first data and the second data from the memory controller 2205. In some examples, the multiplexed first data and second data may be received through a bus coupled with each of the first and second memory die (not illustrated). In some examples, the second memory die 2225 may be or may include an external or removable memory device. For example, when inserted or activated, the second memory die 2225 may transmit an indication to the memory controller 2205, indicating the insertion or activation of the device. In such an example, the transmission of the signal to the first memory die 2220 and the second memory die 2225 may be based in part on the indication transmitted to the memory controller 2205.

In other examples, the first data and the second data may be received at the first memory die 2220 and the second memory die 2225 as a multiplexed signal having a signal strength corresponding to one of at least three levels. As discussed above with reference to FIG. 1, the signal may be modulated using, for example, a PAM modulation scheme. Upon receiving the signal, at block 2285, the memory controller 2205 may adjust a timing of the transmission of the signal. The signal received at the first memory die 2220 and the second memory die 2225 may be based on a timing of a system clock. In some examples, the system clock may be associated with (e.g., integrated) memory controller 2205. In other examples, the system clock may be external to the memory controller 2205. For example, the memory controller 2205 may transmit the signal during a rising edge of the system clock, a falling edge of the system clock, or both. The first memory die 2220 and second memory die 2225 may then, through transmission 2290, receive an adjusted signal based on the system clock of the memory controller 2205.

In some examples, the memory die 2220 and the memory die 2225 may receive the signal modulated using a first modulation scheme and may identify one or more bits represented by the symbol (e.g., one of three unique symbols). For example, one bit may be assigned to memory die 2220 and one bit may be assigned to memory die 2225. Thus, memory die 2220 may discard the bit assigned to memory die 2225 and memory die 2225 may discard the bit assigned to memory die 2220. In other examples, each of the memory die 2220 and the memory die 2225 may divide the data based on a type of data (e.g., control data). For example, memory die 2225 may decode the signal received and, based on the type of data, may discard the bit. Additionally or alternatively, for example, memory die 2220 may decode the signal received and may facilitate a transfer of the specific data to the memory die 2225.

By way of example, at block 2230, the host 2215 may determine a first data request, which may correspond to a data request from the first memory die 2220. Additionally, at block 2240, the host 2215 may determine a second data request, which may correspond to a data request from the second memory die 2225. Each of the data requests may be transmitted by the host 2215 to the memory controller 2205 at transmissions 2235 and 2245, respectively. Upon transmitting the memory requests to the memory controller 2205, the memory controller 2205 may identify first and second data that each include control data.

This indication may occur at blocks 2250 and 2260, respectively. After identifying each of the first data and the second data, the identified data may be received by the multiplexer 2210 at transmissions 2255 and 2265, respectively. At block 2240, the multiplexer 2210 may multiplex the first data and the second data into a symbol of a multi-level signal that contains at least three levels and subsequently transmit an indication of the multiplexed data to the memory controller 2205. Based on this transmission, each of the first memory die 2220 and the second memory die 2225 may receive the multiplexed signal from the memory controller through transmission 2280. The multiplexed signal may be transmitted to each of the first memory die 2220 and the second memory die 2225 concurrently. Upon receiving the multiplexed signal, the memory controller 2205 may adjust the communication of the multiplexed signal, based on the clock cycle of the memory controller 2205. Subsequently, the adjusted signal may be received by each of the first memory die 2220 and the second memory die 2225.

Figure 23:
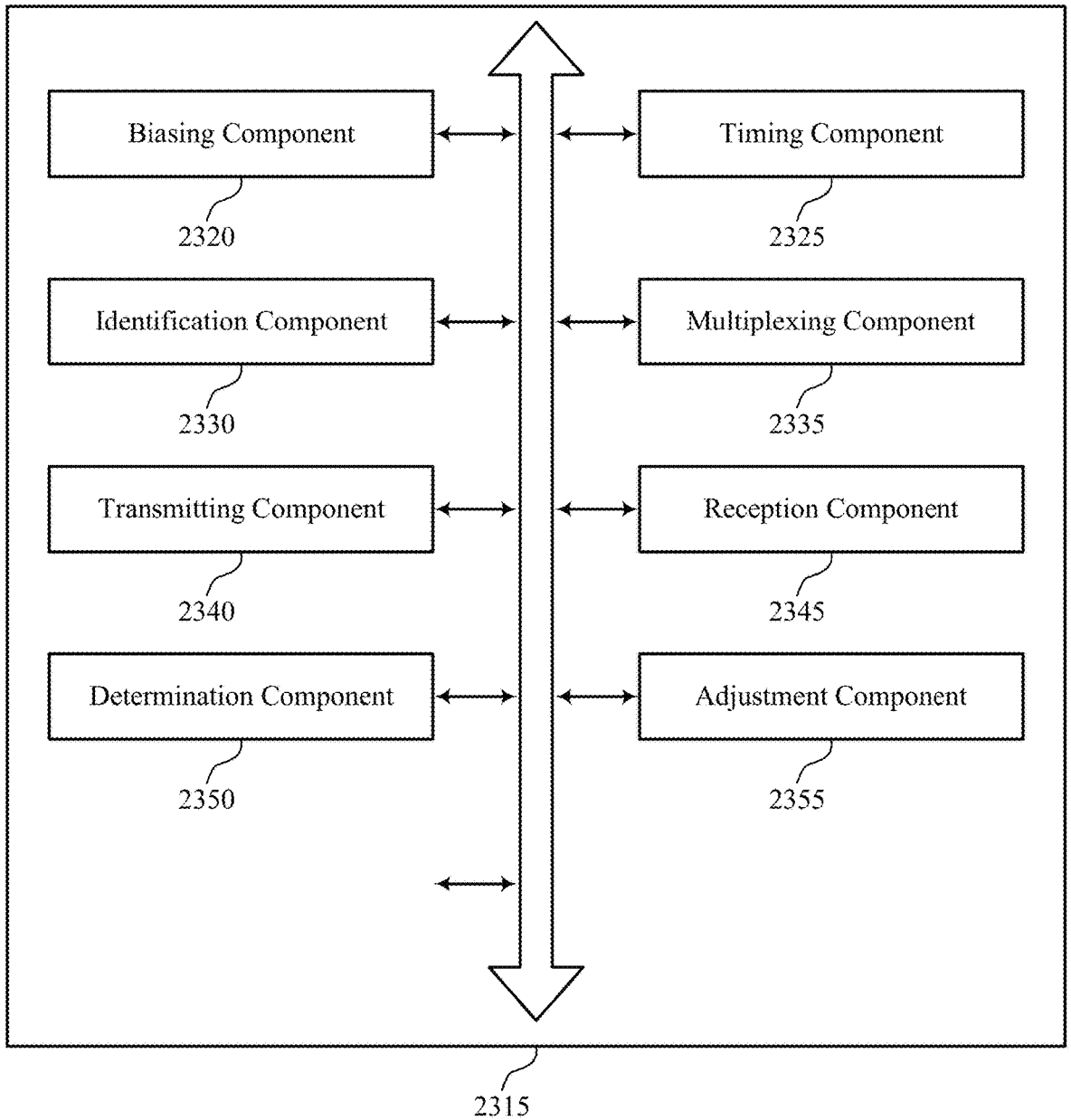
FIG. 23 illustrates an example block diagram of a device that supports multiplexing distinct signals on a single pin in accordance with examples of the present disclosure.

FIG. 23 illustrates a block diagram 2300 of a memory controller 2315 in accordance with various examples of the present disclosure. The memory controller 2315 may be an example of aspects of a memory controller 110 described with reference to FIG. 1. The memory controller 2315 may include biasing component 2320, timing component 2325, identification component 2330, multiplexing component 2335, transmitting component 2340, reception component 2345, determination component 2350, and adjustment component 2355. Each of these components may communicate, directly or indirectly, with one another (e.g., via one or more buses).

In some examples, identification component 2330 may identify first data and second data. Multiplexing component 2335 may multiplex the first data and the second data in a signal. In some examples, the signal may be modulated using a first modulation scheme having at least three levels based on identifying the first data and the second data.

Transmitting component 2340 may transmit the signal to a first memory die coupled with a bus and a second memory die coupled with the bus in the signal. In some cases, the signal may include a pulse amplitude modulation (PAM) signal.

In some examples, reception component 2345 may receive, from a host device or from another component of a common SoC, a first data request associated with the first memory die. In other examples, reception component 2345 may receive, from the host, a second data request associated with the second memory die. In some examples, the signal may be transmitted based on the first data request and the second data request. Additionally or alternatively, for example, reception component 2345 may receive a signal from each of the first memory die and the second memory die. In other examples, reception component 2345 may receive an indication of a presence of the second memory die that includes a removable storage device. In some examples, the transmission of the signal to the first memory die and to the second memory die may be based on the indication. The removable storage device may be, for example, a universal flash storage (UFS) device.

Determination component 2350 may determine whether one of the received signals was transmitted by the first memory die or the second memory die based on a respective signal level of the signal from each of the first memory die and the second memory die. Adjustment component 2355 may adjust a timing of transmitting the signal to the first memory die and the second memory die based on a timing of a system clock of a memory controller coupled with the bus.

Some examples of the method and apparatus described above may further include processes, features, means, or instructions for receiving, from a host, a first data request associated with the first memory die. Some examples of the method and apparatus described above may further include processes, features, means, or instructions for receiving, from the host, a second data request associated with the second memory die, wherein transmitting the signal may be based at least in part on the first data request and the second data request.

In other examples, the method and apparatus described above may further include processes, features, means, or instructions for receiving a signal from each of the first memory die and the second memory die. Some examples of the method and apparatus described above may further include processes, features, means, or instructions for determining whether one of the received signals was transmitted by the first memory die or the second memory die based at least in part on a respective signal level of the signal from each of the first memory die and the second memory die. In some examples of the method and apparatus described above, the signal comprises a pulse amplitude modulation (PAM) signal.

Some examples of the method and apparatus described above may further include processes, features, means, or instructions for adjusting a timing of transmitting the signal to the first memory die and the second memory die based at least in part on a timing of a system clock of a memory controller coupled with the bus. Some examples of the method and apparatus described above may further include processes, features, means, or instructions for receiving an indication of a presence of the second memory die that comprises a removable storage device, wherein the transmitting of the signal to the first memory die and to the second memory die may be based at least in part on the indication.

Figure 24:
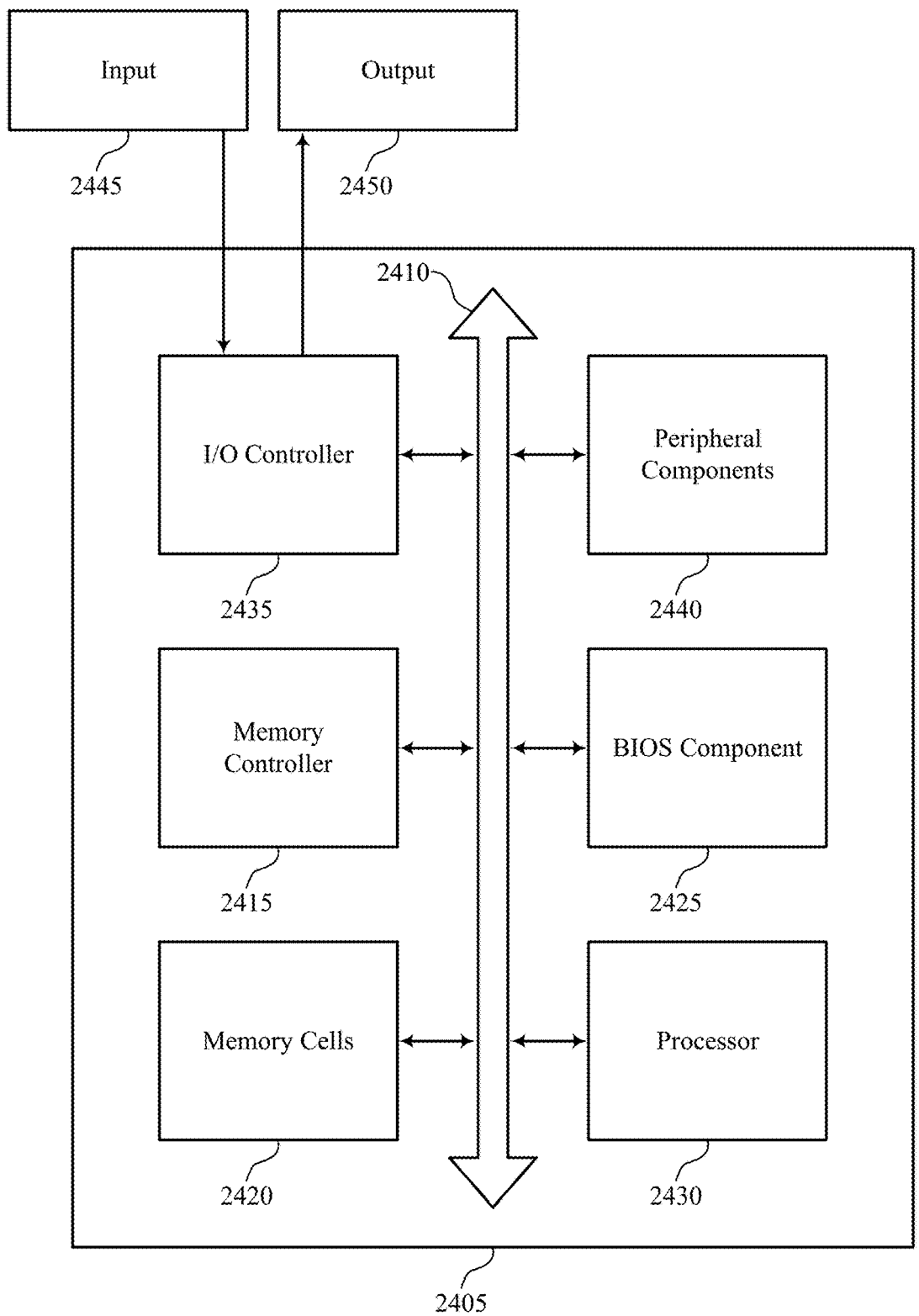
FIG. 24 illustrates an example block diagram of a device that supports multiplexing distinct signals on a single pin in accordance with examples of the present disclosure.

FIG. 24 illustrates a block diagram 2400 of a device 2405 in accordance with examples of the present disclosure. Device 2405 may be an example of or include the components of memory device 2000 as described above, e.g., with reference to FIG. 20. Device 2405 may include components for bi-directional voice and data communications including components for transmitting and receiving communications, including memory controller 2415, memory cells 2420, basic input/output system (BIOS) component 2425, processor 2430, I/O controller 2435, and peripheral components 2440. These components may be in electronic communication via one or more buses (e.g., bus 2410).

Memory controller 2415 may operate one or more memory cells as described herein. In some cases, memory controller 2415 may include a row decoder, column decoder, or both, as described herein (not shown). Memory cells 2420 may store information (i.e., in the form of a logical state) as described herein.

BIOS component 2425 be a software component that includes BIOS operated as firmware, which may initialize and run various hardware components. BIOS component 2425 may also manage data flow between a processor and various other components, e.g., peripheral components, input/output control component, etc. BIOS component 2425 may include a program or software stored in read only memory (ROM), flash memory, or any other non-volatile memory.

Processor 2430 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 2430 may be configured to operate a memory array using a memory controller. In other cases, a memory controller may be integrated into processor 2430. Processor 2430 may be configured to execute computer-readable instructions stored in a memory to perform various functions as described in various examples herein.

I/O controller 2435 may manage input and output signals for device 2405. I/O controller 2435 may also manage peripherals not integrated into device 2405. In some cases, I/O controller 2435 may represent a physical connection or port to an external peripheral. In some cases, I/O controller 2435 may utilize an operating system such as iOS®, ANDROID®, MS-DOS®, MS-WINDOWS®, OS/2®, UNIX®, LINUX®, or another known operating system. In other cases, I/O controller 2435 may represent or interact with a modem, a keyboard, a mouse, a touchscreen, or a similar device. In some cases, I/O controller 2435 may be implemented as part of a processor. In some cases, a user may interact with device 2405 via I/O controller 2435 or via hardware components controlled by I/O controller 2435.

Peripheral components 2440 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 2445 may represent a device or signal external to device 2405 that provides input to device 2405 or its components. This may include a user interface or an interface with or between other devices. In some cases, input 2445 may be managed by I/O controller 2435, and may interact with device 2405 via a peripheral component 2440. In some cases, a binary-symbol signal from a host device such as a processor 2430 or device 2405 itself may be received using the input 2445.

Output 2450 may also represent a device or signal external to device 2405 configured to receive output from device 2405 or any of its components. Examples of output 2450 may include a display, audio speakers, a printing device, another processor or printed circuit board, etc. In some cases, output 2450 may be a peripheral element that interfaces with device 2405 via peripheral component(s) 2440. In some cases, output 2450 may be managed by I/O controller 2435

The components of device 2405 may include circuitry designed to carry out their functions. This may include various circuit elements, for example, conductive lines, transistors, capacitors, inductors, resistors, amplifiers, or other active or inactive elements, configured to carry out the functions described herein. Device 2405 may be a computer, a server, a laptop computer, a notebook computer, a tablet computer, a mobile phone, a wearable electronic device, a personal electronic device, or the like. Or device 2405 may be a portion or aspect of such a device. Device 2405 may support communication among various components via bus 2410 using one or several standardized protocols. For example, various components of device 2405 may communicate using Gen-Z, CCIX, OpenCAPI, or the like.

Figure 25:
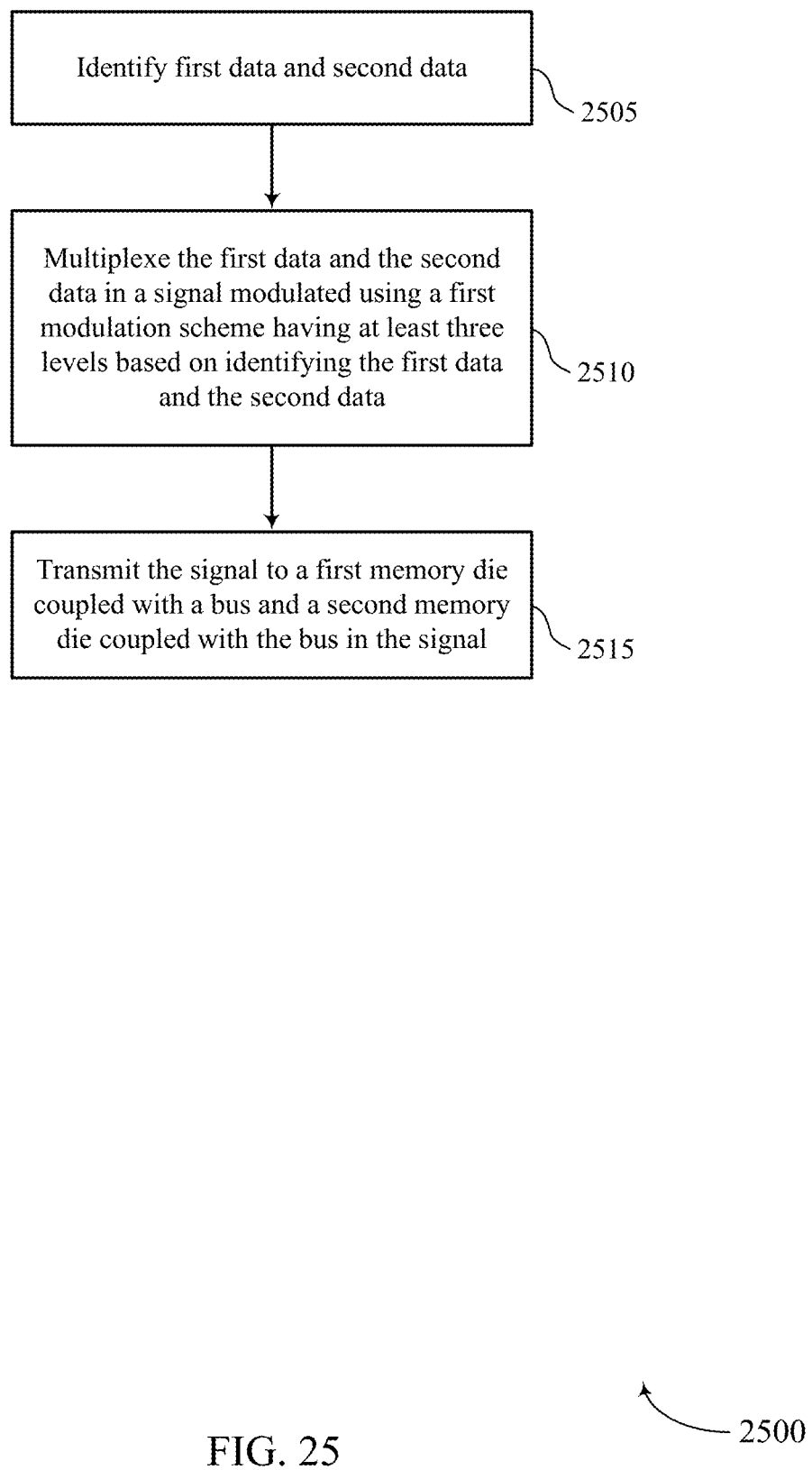
FIG. 25 illustrates an example flowchart of a method that supports multiplexing distinct signals on a single pin in accordance with examples of the present disclosure.

FIG. 25 illustrates an example flowchart illustrating a method 2500 in accordance with examples of the present disclosure. The operations of method 2500 may be implemented by a memory device 2000 or its components as described herein. For example, the operations of method 2500 may be performed by a memory controller as described with reference to FIGS. 23 and 24. In some examples, a memory device 2000 may execute a set of codes to control the functional elements of the device to perform the functions described below. Additionally or alternatively, the memory device 2000 may perform aspects of the functions described below using special-purpose hardware.

At 2505 the memory device 2000 may identify first data and second data. The operations of 2505 may be performed according to the methods described herein. In certain examples, aspects of the operations of 2505 may be performed by an identification component as described with reference to FIGS. 23 and 24.

At 2510 the memory device 2000 may multiplex the first data and the second data in a signal modulated using a first modulation scheme having at least three levels based at least in part on identifying the first data and the second data. The operations of 2510 may be performed according to the methods described herein. In certain examples, aspects of the operations of 2510 may be performed by a multiplexing component as described with reference to FIGS. 23 and 24.

At 2515 the memory device 2000 may transmit the signal to a first memory die coupled with a bus and a second memory die coupled with the bus in the signal. The operations of 2515 may be performed according to the methods described herein. In certain examples, aspects of the operations of 2515 may be performed by a transmitting component as described with reference to FIGS. 23 and 24.

In some cases, the method may include identifying first data and second data. In some cases, the method may also include transmitting the signal to a first memory die coupled with a bus and a second memory die coupled with the bus in the signal. In other cases, the method may include receiving, from a host, a first data request associated with the first memory die. Additionally or alternatively, for example, the method may include receiving, from the host, a second data request associated with the second memory die, wherein transmitting the signal is based at least in part on the first data request and the second data request.

In some cases, the method may include receiving a signal from each of the first memory die and the second memory die. In other cases, the method may include multiplexing the first data and the second data in a signal modulated using a first modulation scheme having at least three levels based at least in part on identifying the first data and the second data. In some cases, the signal comprises a pulse amplitude modulation (PAM) signal. Additionally or alternatively, for example, the method may include adjusting a timing of transmitting the signal to the first memory die and the second memory die based at least in part on a timing of a system clock of a memory controller coupled with the bus.

In some cases, the method may include receiving an indication of a presence of the second memory die that comprises a removable storage device, wherein the transmitting of the signal to the first memory die and to the second memory die is based at least in part on the indication. In some cases, the removable storage device comprises a universal flash storage (UFS) device. In other cases, the method may also include determining whether one of the received signals was transmitted by the first memory die or the second memory die based at least in part on a respective signal level of the signal from each of the first memory die and the second memory die.

Figure 26:
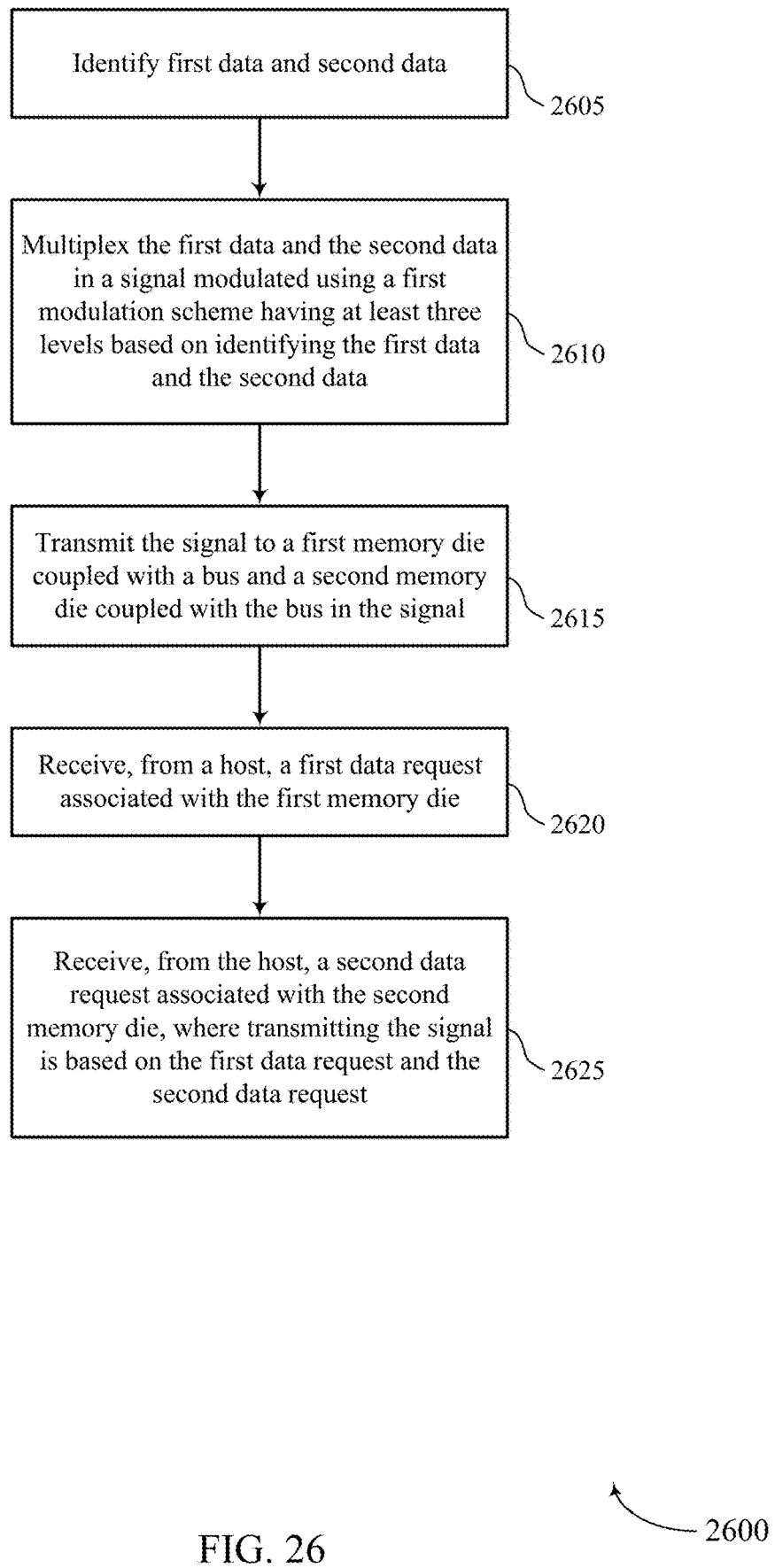
FIG. 26 illustrates an example flowchart of a method that supports multiplexing distinct signals on a single pin in accordance with examples of the present disclosure.

FIG. 26 shows a flowchart illustrating a method 2600 of various examples of the present disclosure. The operations of method 2600 may be implemented by a memory device 2000 or its components as described herein. For example, the operations of method 2600 may be performed by a memory controller as described with reference to FIGS. 23 and 24. In some examples, a memory device 2000 may execute a set of codes to control the functional elements of the device to perform the functions described below. Additionally or alternatively, the memory device 2000 may perform aspects of the functions described below using special-purpose hardware.

At 2605 the memory device 2000 may identify first data and second data. The operations of 2605 may be performed according to the methods described herein. In certain examples, aspects of the operations of 2605 may be performed by an identification component as described with reference to FIGS. 23 and 24.

At 2610 the memory device 2000 may multiplex the first data and the second data in a signal modulated using a first modulation scheme having at least three levels based at least in part on identifying the first data and the second data. The operations of 2610 may be performed according to the methods described herein. In certain examples, aspects of the operations of 2610 may be performed by a multiplexing component as described with reference to FIGS. 23 and 24.

At 2615 the memory device 2000 may transmit the signal to a first memory die coupled with a bus and a second memory die coupled with the bus in the signal. The operations of 2615 may be performed according to the methods described herein. In certain examples, aspects of the operations of 2615 may be performed by a transmitting component as described with reference to FIGS. 23 and 24.

At 2620 the memory device 2000 may receive, from a host, a first data request associated with the first memory die. The operations of 2620 may be performed according to the methods described herein. In certain examples, aspects of the operations of 2620 may be performed by a reception component as described with reference to FIGS. 23 and 24.

At 2625 the memory device 2000 may receive, from the host, a second data request associated with the second memory die, wherein transmitting the signal is based at least in part on the first data request and the second data request. The operations of 2625 may be performed according to the methods described herein. In certain examples, aspects of the operations of 2625 may be performed by a reception component as described with reference to FIGS. 23 and 24.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory device, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a first memory die coupled with a bus;
   a second memory die coupled with the bus;
   a multiplexer coupled with the bus and configured to multiplex first data associated with the first memory die and second data associated with the second memory die into a signal, a single symbol of the signal comprising at least a portion of the first data and at least a portion of the second data; and
   a memory controller coupled with the bus and configured to:
     receive a data request for the first data and the second data, and
     transmit the first data to the first memory die and the second data to the second memory die through the bus based at least in part on receiving the data request, wherein the first data or the second data comprises control data that includes information for operating the first memory die or the second memory die.

2. The apparatus of claim 1, wherein the first memory die and the second memory die are different memory dies in a single package.

3. The apparatus of claim 1, wherein the first memory die and the second memory die each comprise at least one of ferroelectric random access memory (FeRAM), a dynamic random access memory (DRAM), a NAND device, a NOR device, or a phase-change memory device.

4. The apparatus of claim 1, wherein the data request for the first data is received from the first memory die.

5. The apparatus of claim 1, wherein the data request for the second data is received from the second memory die.

6. The apparatus of claim 1, wherein a least-significant bit of the single symbol represents the portion of the first data and a most-significant bit of the single symbol represents the portion of the second data.

7. The apparatus of claim 1, wherein the memory controller is configured to:
   receive a second signal associated with each of the first memory die and the second memory die; and determine whether the second signal is associated with the first memory die or the second memory die based at least in part on a type of modulation scheme used to encode the second signal.

8. The apparatus of claim 1, wherein the first memory die is further configured to:
decode the single symbol of the signal comprising at least the portion of the first data and least the portion of the second data based at least in part on a type of data of the first data.

9. The apparatus of claim 1, wherein the first memory die is further configured to:
determine a type of data for the single symbol of the signal comprising at least the portion of the first data.

10. The apparatus of claim 1, wherein the first memory die is associated with a first data request and the second memory die is associated with a second data request, and wherein the memory controller is configured to transmit the signal to the first memory die and the second memory die based at least in part on the first data request and the second data request.

11. The apparatus of claim 10, wherein at least one of the first data request or the second data request is associated with a read command or a write command.

12. A method, comprising:
receiving a request for first data to be transmitted to a first memory die and second data to be transmitted to a second memory die;
multiplexing the first data and the second data into a signal based at least in part on receiving the request for the first data and the second data to be transmitted to the first memory die and the second memory die, a single symbol of the signal comprising at least a portion of the first data associated with the first memory die and at least a portion of the second data associated with the second memory die; and
transmitting the signal to the first memory die and the second memory die over a bus coupled with the first memory die and the second memory die based at least in part on multiplexing the first data and the second data, wherein the first data or the second data comprises control data that includes information for operating the first memory die or the second memory die.

13. The method of claim 12, wherein receiving the request comprises:
receiving, from the first memory die, a first request associated with the first memory die; and
receiving, from the second memory die, a second request associated with the second memory die, wherein transmitting the signal is based at least in part on the first request and the second request.

14. The method of claim 12, further comprising:
receiving a first signal from the first memory die and a second signal from the second memory die; and
determining whether the first signal and the second signal was transmitted by the first memory die or the second memory die based at least in part on a type of modulation scheme used to encode the first signal and the second signal.

15. The method of claim 12, wherein the signal comprises a pulse amplitude modulation (PAM) signal.

16. The method of claim 12, further comprising:
adjusting a timing of transmitting the signal to the first memory die and the second memory die based at least in part on a timing of a system clock.

17. The method of claim 12, further comprising:
discarding, at the first memory die, the portion of the second data in the single symbol based at least in part on the portion of the second data being associated with the second memory die.

18. The method of claim 12, discarding, at the second memory die, the portion of the first data in the single symbol based at least in part on the portion of the first data being associated with the first memory die.

19. The method of claim 12, at least one of the first data or the second data comprises metadata or control data.

20. An apparatus, comprising:
a first memory die coupled with a bus;
a second memory die coupled with the bus, wherein the second memory die comprises a different type of memory device than the first memory die; and
a memory controller coupled with the bus and operable to:
receive a request for first data to be transmitted to the first memory die and second data to be transmitted to the second memory die;
multiplex the first data and the second data into a signal based at least in part on receiving the request, a single symbol of the signal comprising at least a portion of the first data associated with the first memory die and at least a portion of the second data associated with the second memory die; and
transmit the signal to the first memory die and the second memory die based at least in part on multiplexing the first data and the second data, wherein the first data or the second data comprises control data that includes information for operating the first memory die or the second memory die.

* * * * *